United States Patent
Marinov et al.

(10) Patent No.: US 10,748,802 B2
(45) Date of Patent: Aug. 18, 2020

(54) PLACING ULTRA-SMALL OR ULTRA-THIN DISCRETE COMPONENTS

(71) Applicant: Uniqarta, Inc., Cambridge, MA (US)

(72) Inventors: Val Marinov, Fargo, ND (US); Yuriy Atanasov, Sofia (BG)

(73) Assignee: Uniqarta, Inc., Cambridge, MA (US)

(*) Notice: Subject to any disclaimer, the term of this patent is extended or adjusted under 35 U.S.C. 154(b) by 0 days.

(21) Appl. No.: 16/069,801

(22) PCT Filed: Jan. 12, 2017

(86) PCT No.: PCT/US2017/013216
§ 371 (c)(1),
(2) Date: Jul. 12, 2018

(87) PCT Pub. No.: WO2017/123780
PCT Pub. Date: Jul. 20, 2017

(65) Prior Publication Data
US 2019/0057891 A1    Feb. 21, 2019

Related U.S. Application Data

(60) Provisional application No. 62/279,143, filed on Jan. 15, 2016.

(51) Int. Cl.
*H01L 21/683* (2006.01)
*B32B 37/26* (2006.01)
(Continued)

(52) U.S. Cl.
CPC ........ *H01L 21/6835* (2013.01); *B32B 37/025* (2013.01); *B32B 37/26* (2013.01);
(Continued)

(58) Field of Classification Search
CPC .................................................. H01L 21/6835
(Continued)

(56) References Cited

U.S. PATENT DOCUMENTS 10,468,373 B2 * 11/2019 Colosimo, Jr. ...... B23K 1/0016
2008/0003780 A1    1/2008 Sun et al.
(Continued)

FOREIGN PATENT DOCUMENTS

CN        103597589        2/2014
CN        104380437        2/2015
(Continued)

OTHER PUBLICATIONS

Japanese First Office Action in Japanese Patent Application No. 2018-536735, dated Sep. 24, 2019, 8 pages with English Translation.
(Continued)

*Primary Examiner* — Jami Valentine Miller
(74) *Attorney, Agent, or Firm* — Fish & Richardson P.C.

(57) ABSTRACT

A method includes dicing a wafer to form discrete components; transferring the discrete components onto a transparent carrier, including adhering the discrete component to a carrier release layer on the transparent carrier; and releasing one of the discrete components from the transparent carrier, the one of the discrete components being deposited onto a device substrate after the releasing.

15 Claims, 29 Drawing Sheets

(51) Int. Cl.
*H01L 21/67* (2006.01)
*B32B 38/00* (2006.01)
*H01L 23/00* (2006.01)
*B32B 37/00* (2006.01)
*H01L 21/304* (2006.01)
*H01L 21/3065* (2006.01)
*H01L 21/48* (2006.01)
*H01L 21/78* (2006.01)
*B32B 38/18* (2006.01)

(52) U.S. Cl.
CPC ........ *B32B 38/0004* (2013.01); *H01L 21/304* (2013.01); *H01L 21/3065* (2013.01); *H01L 21/4853* (2013.01); *H01L 21/67092* (2013.01); *H01L 21/67132* (2013.01); *H01L 21/67144* (2013.01); *H01L 21/78* (2013.01); *H01L 24/75* (2013.01); *H01L 24/83* (2013.01); *B32B 2038/1891* (2013.01); *B32B 2307/412* (2013.01); *B32B 2309/105* (2013.01); *B32B 2310/0831* (2013.01); *H01L 24/29* (2013.01); *H01L 24/32* (2013.01); *H01L 2221/68322* (2013.01); *H01L 2221/68327* (2013.01); *H01L 2221/68354* (2013.01); *H01L 2221/68368* (2013.01); *H01L 2221/68381* (2013.01); *H01L 2224/294* (2013.01); *H01L 2224/2929* (2013.01); *H01L 2224/29301* (2013.01); *H01L 2224/29339* (2013.01); *H01L 2224/32225* (2013.01); *H01L 2224/75252* (2013.01); *H01L 2224/75261* (2013.01); *H01L 2224/75745* (2013.01); *H01L 2224/83005* (2013.01); *H01L 2224/83192* (2013.01); *H01L 2224/83203* (2013.01); *H01L 2224/83851* (2013.01); *H01L 2224/83855* (2013.01); *H01L 2224/83862* (2013.01); *H01L 2224/83874* (2013.01); *H01L 2924/14* (2013.01)

(58) Field of Classification Search
USPC .......................................................... 438/125
See application file for complete search history.

(56) References Cited

U.S. PATENT DOCUMENTS

2010/0072490 A1* 3/2010 Kerr ........................ H01L 24/81
257/88
2011/0064948 A1   3/2011 Plaut et al.
2014/0004685 A1   1/2014 Chowdhury et al.
2014/0238592 A1*  8/2014 Marinov ................. H01L 24/83
156/272.8
2015/0228849 A1   8/2015 Zou et al.

FOREIGN PATENT DOCUMENTS

| | | |
|---|---|---|
| CN | 105379039 | 3/2016 |
| JP | 2014515883 | 7/2014 |
| KR | 20030029054 | 4/2003 |
| KR | 100691034 | 3/2007 |

OTHER PUBLICATIONS

Extended European Search Report in European Application No. 17738950.9, dated Aug. 13, 2019, 12 pages.
Marinov et al., "Laser-assisted ultrathin bare die packaging: a route to a new class of microelectronic devices", Laser-based Micro- and Nanopackaging and Assembly VII, 8608:1-19.
Marinov et al., "Laser-assisted ultrathin die packaging: Insights from a process study", Microelectronic Engineering, 2013, 101:23-30.
Miller et al., "Noncontact Selective Laser-Assisted Placement of Thinned Semi-conductor Dice", Transactions on Components, Packaging and Manufacturing Technology, Jun. 2012, 2(6):971-978.
PCT International Preliminary Report on Patentability in International Application No. PCT/US17/013216, dated Jul. 26, 2018, 7 pages.
PCT International Search Report and Written Opinion in International Application No. PCT/US17/13216, dated May 16, 2017, 13 pages.
Sarwar et al., "Reliability of Embedded Ultrathin Chips Subjected to Cyclic Stresses", Journal of Microelectronics and Electronic Packaging, 2012, 9:104-111.
Uniqarta.com, [online], "Ultra-thin, Flexible Chip Assembly," [retrieved on Jan. 13, 2016] retrieved from: URL< http://uniqarta.com/technology.html>, 2 pages.
Chinese Office Action in Chinese Application No. 201780017238, dated Dec. 19, 2019, with English translation, 18 pages.
Korean Notice of Reason for Refusal in KR Application No. 20187023450, dated Mar. 31, 2020, 40 pages with English Translation.

* cited by examiner

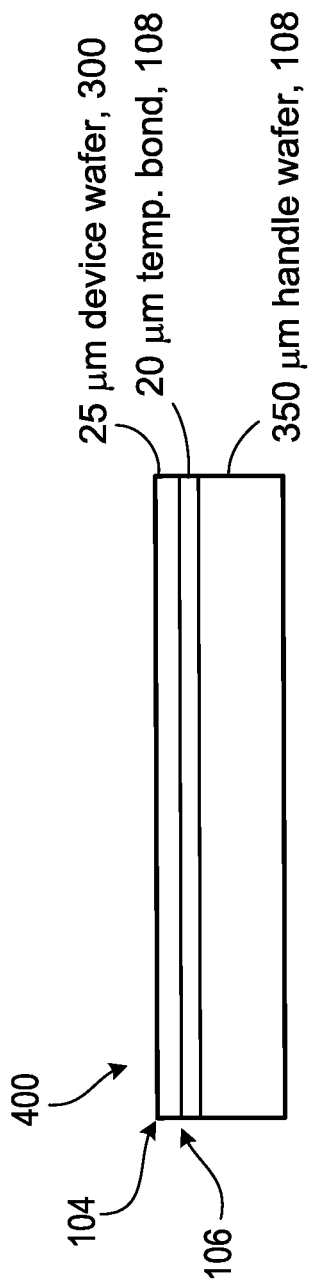
FIG. 7
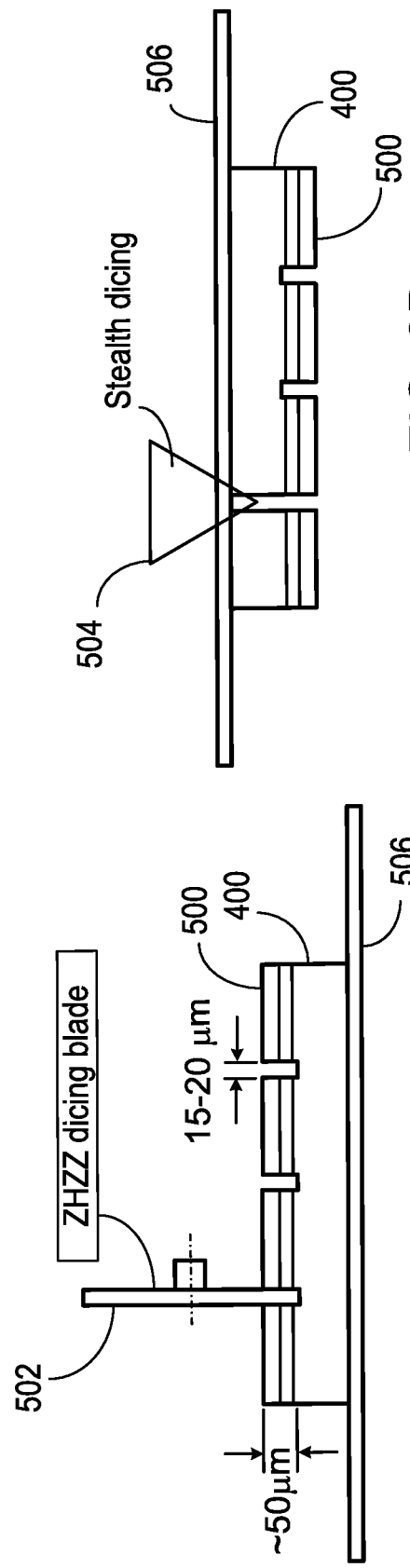
FIG. 8A
FIG. 8B

PLACING ULTRA-SMALL OR ULTRA-THIN DISCRETE COMPONENTS

CROSS-REFERENCE TO RELATED APPLICATIONS

This application is a U.S. National Phase Application of International Patent Application No. PCT/US2017/013216, filed on Jan. 12, 2017, which claims the benefit of U.S. Patent Application Ser. No. 62/279,143, filed on Jan. 15, 2016, the contents of all are incorporated herein by reference in their entirety.

BACKGROUND

This description relates generally to placing ultra-small or ultra-thin discrete components.

Known assembly processes automate transferring items from one place to another using robotic pick-and-place systems, fluidic self-assembly systems, light-assisted assembly systems, or other systems.

SUMMARY

Methods for setting up ultra-small or ultra-thin discrete components for easy pick and place in integrated circuit packaging are contemplated as disclosed in U.S. Application No. 62/033,595, filed on Aug. 5, 2014, and in PCT Application No. PCT/US2015/043550, filed on Aug. 4, 2015, the contents of both of which are incorporated here by reference in their entirety.

In an aspect, a method includes dicing a wafer to form discrete components; transferring the discrete components onto a transparent carrier, including adhering the discrete component to a carrier release layer on the transparent carrier; and releasing one of the discrete components from the transparent carrier, the one of the discrete components being deposited onto a device substrate after the releasing.

Embodiments can include one or more of the following features.

The method includes thinning the wafer to a thickness of less than 50 µm. Dicing the wafer comprises dicing the thinned wafer to form the discrete components.

Dicing the wafer comprises adhering the wafer to a dicing carrier. Transferring the discrete components onto the transparent comprises transferring the discrete components from the dicing carrier to the transparent carrier. The dicing carrier comprises a dicing tape.

Releasing the one of the discrete components from the transparent carrier comprises applying a stimulus to the carrier release layer on the transparent carrier. The stimulus comprises ultraviolet (UV) light.

The transparent carrier is at least partially transparent to UV light.

The carrier release layer comprises a dynamic releasing layer (DRL).

Depositing the one of the discrete components onto the device substrate comprises depositing the one of the discrete components onto an attachment element disposed on a surface of the device substrate. The attachment element comprises a thermally curable material. The attachment element comprises a UV-curable material. The attachment element comprises a conductive material. The method includes applying a stimulus to cure the attachment element. Applying a stimulus to cure the attachment element causes the discrete component to be electrically connected to the device substrate.

The method includes bonding the discrete component to the device substrate.

The method includes attaching the wafer to a handle substrate to form a wafer handle assembly. Attaching the wafer to the handle substrate comprises attaching the wafer to a handle release layer formed on a surface of the handle substrate. The handle release layer comprises a thermally sensitive material. The handle release layer comprises an ultraviolet (UV) sensitive material. Dicing the wafer into discrete components comprises dicing the wafer handle assembly into handle assemblies, each handle assembly comprising a discrete component attached to a corresponding portion of the handle substrate. Transferring the discrete components onto the transparent carrier comprises transferring the handle assemblies onto the transparent carrier. Depositing the one of the discrete components onto the device substrate comprises depositing one of the handle assemblies onto the transparent carrier. The method includes releasing the corresponding portion of the handle substrate from the discrete component deposited onto the device substrate. The method includes concurrently releasing the corresponding portion of the handle substrate from the discrete component deposited onto the device substrate and bonding the discrete component to the device substrate. The method includes applying a stimulus that causes (i) the discrete component to bond to the device substrate and (ii) the handle substrate to be released from the discrete component. The method includes applying a first stimulus that causes the discrete component to bond to the device substrate and a second stimulus that causes the handle substrate to be released from the discrete component. The method includes thinning the wafer to a thickness of less than 50 µm. The method includes attaching the thinned wafer to the handle substrate to form the wafer handle assembly.

Each discrete component is ultra-thin, ultra-small, or both ultra-thin and ultra-small. Each discrete component has a thickness less than or equal to 50 µm. Each discrete component has a maximum length less than or equal to 300 µm/side.

In an aspect, a method includes releasing a handle assembly from a transparent carrier, the handle assembly being deposited onto a device substrate after the releasing, the handle assembly comprising a discrete component releasably attached to a handle substrate, the discrete component being ultra-thin, ultra-small, or both ultra-thin and ultra-small.

Embodiments can include one or more of the following features.

The handle substrate has a thickness of at least 50 µm.

The method includes attaching the handle assembly to the transparent carrier. Attaching the handle assembly to the transparent carrier comprises transferring the handle assembly from a dicing carrier to the transparent carrier.

The method includes attaching a wafer to a handle substrate to form a wafer handle assembly, discrete components being formed on the wafer. Attaching the wafer to the handle substrate comprises attaching the wafer to a handle release layer formed on the surface of the handle substrate. The handle release layer comprises a thermally sensitive material. The handle release layer comprises a UV sensitive material. The method includes dicing the wafer handle assembly to form handle assemblies. The method includes attaching the handle assemblies to the transparent carrier. The method includes thinning the wafer to a thickness of less than 50 µm. The method includes attaching the thinned wafer to the handle substrate to form the wafer handle substrate. The method includes attaching the wafer handle assembly to the transparent carrier. The method includes dicing the wafer handle assembly attached to the transparent carrier into handle assemblies. The method includes partially dicing the wafer handle assembly; including dicing through less than all of the thickness of the wafer handle assembly. Attaching the wafer handle assembly to the transparent carrier comprises attaching the partially diced wafer handle assembly to the transparent carrier. The method includes dicing the partially diced wafer handle assembly attached to the transparent carrier into handle assemblies. The method includes thinning the wafer to a thickness of less than 50 µm. The method includes attaching the thinned wafer to the handle substrate to form the wafer handle assembly. The method includes thinning the attached wafer to a thickness of less than 50 µm.

The transparent carrier is at least partially transparent to ultraviolet light. The transparent carrier comprises glass.

Releasing the handle assembly from the transparent carrier comprises applying a stimulus to a dynamic release layer disposed between the carrier substrate and the handle assembly. The stimulus comprises ultraviolet light. Application of the stimulus to the dynamic release layer causes the dynamic release layer to mechanically release the handle assembly from the transparent carrier.

Depositing the handle assembly onto the device substrate comprises depositing the handle assembly onto an attachment element disposed on the device substrate. The attachment element comprises a thermally curable material. The attachment element comprises a UV-curable material. The attachment element comprises a conductive material. The method includes applying a stimulus to cure the attachment element.

The method includes bonding the discrete component to the device substrate. The method includes releasing the handle substrate from the discrete component after depositing the handle assembly onto the device substrate. Releasing the handle substrate from the discrete component comprises applying a stimulus to release a handle release layer disposed between the handle substrate and the discrete component. The method includes concurrently bonding the wafer handle assembly to the device substrate and releasing the handle substrate from the discrete component. The method includes applying a stimulus that causes (i) the discrete component to bond to the device substrate and (ii) the handle substrate to be released from the discrete component. The method includes applying a first stimulus that causes the discrete component to bond to the device substrate and a second stimulus that causes the handle substrate to be released from the discrete component In an aspect, an apparatus includes a handle assembly attached to a transparent carrier, the handle assembly comprising a discrete component releasably attached to a handle substrate, the discrete component being ultra-thin, ultra-small, or both ultra-thin and ultra-small.

Embodiments can include one or more of the following features.

The apparatus includes multiple handle assemblies attached to the transparent carrier.

The handle substrate has a thickness of at least 50 µm.

The transparent carrier is at least partially transparent to ultraviolet light.

The transparent carrier comprises glass.

The transparent carrier comprises a dynamic release layer disposed on a surface of the transparent carrier, the dynamic release layer being disposed between the transparent carrier and the handle assembly. The dynamic release layer is disposed between the transparent carrier and the handle assembly. The dynamic release layer responds mechanically to an applied stimulus. The applied stimulus comprises ultraviolet light.

The handle substrate includes a handle release layer formed on a surface of the handle substrate, the handle release layer being disposed between the handle substrate and the discrete component. The handle release layer comprises a thermally sensitive material. The handle release layer comprises a UV-sensitive material.

The discrete component comprises an integrated circuit formed on a semiconductor substrate.

In an aspect, an apparatus includes a wafer handle assembly attached to a transparent carrier, the wafer handle assembly comprising a wafer releasably attached to a handle substrate, discrete components being formed on the wafer, the wafer handle assembly being configured such that (i) the discrete components formed on the wafer are ultra-small or (ii) the wafer is ultra-thin or (iii) both (i) and (ii).

Embodiments can include one or more of the following features.

The handle substrate has a thickness of at least 50 µm.

The transparent carrier is at least partially transparent to ultraviolet light.

The transparent carrier comprises glass.

The transparent carrier comprises a dynamic release layer disposed on a surface of the transparent carrier, the dynamic release layer being disposed between the transparent carrier and the wafer handle assembly. The dynamic release layer is disposed between the transparent carrier and the wafer handle assembly. The dynamic release layer responds mechanically to an applied stimulus. The applied stimulus comprises ultraviolet light.

The handle substrate includes a handle release layer formed on a surface of the handle substrate, the handle release layer being disposed between the handle substrate and the discrete component. The handle release layer comprises a thermally sensitive material. The handle release layer comprises a UV-sensitive material.

The wafer comprises a semiconductor wafer.

In an aspect, a method includes embedding an assembly that includes a discrete component in a flowable material, the assembly that includes the discrete component being attached to a first handle substrate; and thinning the embedded discrete component to a thickness of less than 50 µm.

Embodiments can include one or more of the following features.

The assembly that includes a discrete component comprises a handle assembly.

Embedding the assembly in the flowable material comprises disposing a layer of flowable material onto a surface of the first handle substrate.

Embedding the assembly in the flowable material comprises disposing a second handle substrate onto a surface of the first handle substrate, the assembly being disposed on the surface of the first handle substrate, a layer of the flowable material being disposed on a surface of the second handle substrate. Disposing the second handle substrate onto the surface of the first handle substrate comprises contacting the layer of the flowable material disposed on the surface of the second handle substrate to the surface of the first handle substrate. Embedding the assembly in the flowable material comprises causing the layer of the flowable material to flow. Causing the layer of the flowable material to flow comprises exposing the layer of the flowable material to ultraviolet (UV) light. Causing the layer of the flowable material to flow comprises exposing the layer of the flowable material to a thermal stimulus. The second handle substrate is at least partially transparent to UV light. The second handle substrate comprises glass. The method includes removing the second handle substrate.

The flowable material comprises a photoresist.

The method includes removing the flowable material after thinning the embedded discrete component. The first handle substrate comprises a transparent carrier. The method includes transferring the thinned discrete component from the transparent carrier to a device substrate.

The method includes transferring the thinned discrete component to a third handle substrate. Transferring the thinned discrete component to the third handle substrate comprises attaching the thinned discrete component to a handle release layer disposed on a surface of the third handle substrate. Transferring the thinned discrete component to the third handle substrate comprises releasing a handle release layer disposed between the discrete component and the first handle substrate. Releasing the handle release layer comprises applying a stimulus to the release layer. The stimulus comprises UV light. The stimulus comprises a thermal stimulus. The method includes dicing the third handle substrate to form a handle assembly including a thinned discrete component attached to a corresponding portion of the third handle substrate. Dicing the third handle substrate comprises dicing the third handle substrate and a handle release layer disposed on a surface of the third handle substrate, and in which the formed handle assembly includes the thinned discrete component attached to the handle release layer disposed on the corresponding portion of the third handle substrate. The method includes transferring the handle assembly to a device substrate. The method includes transferring the handle assembly to the device substrate using a pick-and-place approach. The method includes transferring the handle assembly to a transparent carrier. Transferring the handle assembly to the transparent carrier comprises adhering the handle assembly to a carrier release layer disposed on the transparent carrier. The method includes transferring the handle assembly from the transparent carrier to a device substrate.

The method includes attaching the discrete component to the first handle substrate.

The method includes attaching the discrete component to a handle release layer disposed on a surface of the first handle substrate. The method includes attaching the discrete component to the first handle substrate using a pick-and-place approach. The method includes attaching discrete components to the first handle substrate. At least one of the discrete components is different from each of the other of the discrete components.

In an aspect, a method includes exposing a first substrate to a first stimulus, an adhesion between the first substrate and discrete components adhered to the first substrate being reduced responsive to the first stimulus; transferring the discrete components from the first substrate to a second substrate; exposing the second substrate to a second stimulus, an adhesion between the first substrate and the discrete components being reduced responsive to the second stimulus.

Embodiments can include one or more of the following features.

The method includes attaching a wafer to the first substrate, the discrete components being formed on the wafer. The method includes dicing the wafer attached to the first substrate to form the discrete components. Attaching a wafer to the first substrate comprises attaching a wafer handle assembly to the first substrate, the wafer handle assembly comprising the wafer attached to a handle substrate. The method includes dicing the wafer handle assembly attached to the first substrate to form handle assemblies, each handle assembly comprising a discrete component and a corresponding portion of the handle substrate.

The first substrate comprises a dicing tape.

Exposing the first substrate to a first stimulus comprises exposing the first substrate to ultraviolet light. Exposing the first substrate to a first stimulus comprises exposing the first substrate to heat. Exposing the second substrate to a second stimulus comprises exposing the second substrate to ultraviolet light. Exposing the second substrate to a second stimulus comprises exposing the second substrate to heat.

The method includes transferring the discrete components from the second substrate to a transparent carrier.

The second substrate comprises a tape disposed on a vacuum chuck. The method includes applying a vacuum to the vacuum chuck, the applied vacuum securing the tape to the vacuum chuck.

In an aspect, a method includes dicing a wafer attached to a release layer disposed on a transparent carrier to form discrete components; and exposing the release layer to a stimulus, an adhesion between the release layer and the discrete components being reduced responsive to the stimulus.

Embodiments can include one or more of the following features.

Exposing the release layer to a stimulus comprises exposing the release layer to heat. Exposing the release layer to a stimulus comprises exposing the release layer to ultraviolet light.

The adhesion between the release layer and the discrete components after exposure to the stimulus is sufficient to cause the discrete components to adhere to the release layer.

The release layer comprises an adhesive layer and a dynamic releasing layer. Exposure to the stimulus causes an adhesion of the adhesive layer to be reduced. The method includes exposing the release layer to a second stimulus, the dynamic releasing layer responding mechanically to the second stimulus. One or more of the discrete components is transferred to a device substrate upon exposure of the release layer to the second stimulus.

Dicing the wafer comprises dicing a wafer handle assembly to form handle assemblies, the wafer handle assembly comprising a wafer attached to a handle substrate, each handle assembly comprising one of the discrete components and a corresponding portion of the handle substrate.

In an aspect, a method includes releasing a discrete component from a release layer on an interim handle by reducing adhesion between the release layer and the discrete component, the reducing comprising applying a stimulus to cause a change in a surface morphology of the release layer.

Embodiments can include one or more of the following features.

Changing the surface morphology of the release layer comprises blistering the surface. The stimulus comprises heat or light.

In an aspect, a method includes releasing a discrete component from a release layer on an interim handle by reducing adhesion between the release layer and the discrete component, the reducing comprising applying a stimulus to cause a phase transition of at least a portion of the release layer.

Embodiments can include one or more of the following features.

The phase transition comprises a transition from solid to liquid or a transition from solid to gas or both. The stimulus comprises heat or pressure or both.

In an aspect, a method includes releasing a discrete component from a release layer on an interim handle by reducing adhesion between the release layer and the discrete component, the reducing comprising applying a stimulus to change a chemical structure or a chemical composition or both of at least a portion of the release layer.

Embodiments can include one or more of the following features.

The portion of the release layer undergoes thermal decomposition. The portion of the release layer undergoes photodegradation.

In an aspect, a method includes releasing a discrete component from a release layer on an interim handle by reducing adhesion between the release layer and the discrete component, a restoration of adhesion after the reduction of adhesion being prevented, inhibited, or delayed.

In an aspect, a method includes releasing a discrete component from a release layer on an interim handle by reducing adhesion between the release layer and the discrete component, the releasing comprising releasing the discrete component without leaving a residue from the release layer on the discrete component after the release.

In an aspect, a method includes releasing a discrete component from a release layer of an interim handle and depositing the discrete component and a handle substrate, the release layer having a thickness of less than 10 µm prior to the releasing.

Embodiments can include one or more of the following features.

The release layer comprises a single layer.

The release layer comprises a first layer and a second layer. The release layer comprises a first layer attached to the handle and a second layer oriented for discrete component deposition. The second layer is parallel to the first layer. The second layer is UV sensitive. The second layer is thermally sensitive. The first layer is a permanent adhesive. The thermal sensitivity of the second layer causes a decrease in an adhesive strength in response to an application of thermal energy. The thermal sensitivity of the second layer causes an increase in an adhesive strength in response to an application of thermal energy. The UV light sensitivity causes an increase in adhesive strength in response to an application of UV light. The UV light sensitivity causes a decrease in adhesive strength in response to an application of UV light.

The method includes transferring the discrete component on the handle substrate to contact a device substrate. The method includes releasing the discrete component from the handle substrate to deposit the discrete component onto the device substrate. Depositing the discrete component onto the device substrate comprises bonding the discrete component to the device substrate. Releasing the discrete component from the handle is contemporaneous with bonding the discrete component to the device substrate. Releasing the discrete component from the handle is in response to the bonding the discrete component to the device substrate. Releasing the discrete component from the handle is caused by the bonding the discrete component to the device substrate. Releasing the discrete component from the handle is completed after bonding the discrete component to the device substrate. The discrete component is released from the handle through the bonding with the device substrate. The bonding further comprises delivering thermal energy or UV-light to both bond the discrete component with the substrate and release the discrete component from the handle. The handle substrate remains in contact with the device substrate upon release of the discrete component from the handle substrate. The method includes removing the handle substrate from the discrete component. Removing the handle substrate includes applying at least one of the following: a brush, a blade, compressed air, a vacuum force, a vibration, or gravity force, or any combination of two or more of them.

The handle substrate includes a thickness of between 49 and 801 microns. The handle substrate includes a thickness of between 100 and 800 microns. The handle substrate includes a thickness of between 300 and 800 microns. The handle substrate includes at least one side between 400 and 600 microns long.

In an aspect, an apparatus includes a discrete component attached to an interim handle via a release layer, the release layer configured to undergo a change in a surface morphology responsive to an applied stimulus.

Embodiments can include one or more of the following features.

The change in the surface morphology includes a blister. The change in the surface morphology includes multiple blisters across the surface of the release layer.

In an aspect, an apparatus includes a discrete component attached to an interim handle via a release layer, at least a portion of the release layer configured to undergo a phase transition responsive to an applied stimulus.

Embodiments can include one or more of the following features.

The phase transition comprises a transition from solid to liquid or a transition from solid to gas or both.

In an aspect, an apparatus includes a discrete component attached to an interim handle via a release layer, at least a portion of the release layer configured to undergo a change in a chemical structure or a chemical composition or both responsive to an applied stimulus.

Embodiments can include one or more of the following features.

The change includes thermal decomposition. The change includes photodegradation

In an aspect, an apparatus includes a discrete component attached to an interim handle via a release layer; in which the release layer is configured such that a restoration of an adhesion of the release layer is prevented, inhibited, or delayed following a reduction in adhesion between the release layer and the discrete component.

In an aspect, an apparatus includes a discrete component attached to an interim handle via a release layer, the release layer having a thickness of less than 10 µm.

In general, in an aspect, a method includes releasing a discrete component from a carrier and depositing a discrete component on a handle substrate, the discrete component having an ultra-thin, an ultra-small, or an ultra-thin and ultra-small configuration, the handle substrate having a thickness of at least 50 microns and at least one side length of at least 300 microns.

Implementations may include one or a combination of any two or more of the following features. The method may also include a release layer to the handle substrate such that the discrete component is releasably attached to the release layer. The release layer is a thermally sensitive material. The release layer is an ultraviolet ("UV") light sensitive material. The release layer includes a first layer and a second layer. The first layer is attached to the handle and a second layer oriented for discrete component deposition. The second layer is parallel to the first layer. The second layer is UV sensitive. The second layer is thermally sensitive. The first layer is a permanent adhesive. The thermal sensitivity of the second layer causes a decrease in an adhesive strength in response to an application of thermal energy. The thermal sensitivity of the second layer causes an increase in an adhesive strength in response to an application of thermal energy. The UV light sensitivity causes an increase in adhesive strength in response to an application of UV light or causes a decrease in adhesive strength in response to an application of UV light. The method includes transferring the discrete component on the handle substrate to contact a device substrate. The method includes releasing the discrete component from the handle substrate to deposit the discrete component onto the device substrate. Depositing the discrete component onto the device substrate includes bonding the discrete component to the device substrate. Releasing the discrete component from the handle is contemporaneous with bonding the discrete component to the device substrate. Releasing the discrete component from the handle is in response to the bonding the discrete component to the device substrate. Releasing the discrete component from the handle is caused by the bonding the discrete component to the device substrate. Releasing the discrete component from the handle is completed after bonding the discrete component to the device substrate. The discrete component is released from the handle through the bonding with the device substrate. Bonding further includes delivering thermal energy or energy of UV light to both bond the discrete component with the substrate and release the discrete component from the handle. The handle substrate remains in contact with the device substrate upon release of the handle substrate from the discrete component. The method further includes removing the handle substrate from the discrete component. Removing the handle substrate can include applying at least one of the following: a brush, a blade, compressed air, a vacuum force, a vibration, or gravity force, or any combination of two or more of them. The handle substrate includes a thickness of between 49 and 801 microns, 100-800 microns, and/or 300 and 800 microns. The handle substrate includes at least one side between 400 and 600 microns long.

In general, in an aspect, an apparatus includes a discrete component having an ultra-thin, an ultra-small, or an ultra-thin and ultra-small configuration and a handle substrate releasably attached to the discrete component, the handle and the discrete component having a configuration that is thicker and broader than the discrete component Implementations may include one or a combination of any two or more of the following features. The apparatus also includes a release layer attached to the handle substrate such that the discrete component is releasably attached to the release layer. The release layer is a thermally sensitive material. The release layer is an ultraviolet light sensitive material. The release layer includes a first layer and a second layer. The release layer includes a first layer attached to the handle and a second layer oriented for discrete component deposition. The second layer is parallel to the first layer. The second layer is UV sensitive. The second layer is thermally sensitive. The first layer is sensitive permanent adhesive. The thermal sensitivity of the second layer causes a decrease in an adhesive strength in response to heat exceeding a thermal parameter of the adhesive. The thermal sensitivity of the second layer causes an increase in an adhesive strength in response to heat exceeding a thermal parameter of the adhesive. The UV light sensitivity causes an increase in adhesive strength in response to an application of UV light. The UV light sensitivity causes a decrease in adhesive strength in response to the application of UV light. The handle substrate includes a thickness of between 49 and 801 microns. The handle substrate includes at least one side between 100 and 800 microns long. The handle substrate includes at least one side between 300 and 800 microns long. The handle substrate includes at least one side between 400 and 600 microns long.

In general, in an aspect, a method includes applying a process step to cause a material between a surface of an ultra-thin, an ultra-small, or an ultra-thin and ultra-small discrete component and a substrate to which the ultra-thin and ultra-small discrete component is to be attached, to change to a state in which the material holds the ultra-thin and ultra-small discrete component on the substrate. The processing step simultaneously causing a material that temporarily holds an opposite surface of the ultra-thin and ultra-small discrete component on a handle that is being held by a chuck of a pick and place tool, to change to a state in which the material no longer holds the ultra-thin and ultra-small discrete component on the handle. The method includes causing the change in state includes delivering thermal energy, UV light, or both. The material that temporarily holds an opposite surface of the discrete component on a handle substrate includes a release layer including a first layer and a second layer. The material that temporarily holds an opposite surface of the discrete component on a handle substrate includes a release layer including a first layer attached to the handle and a second layer that temporarily holds the discrete component. The release layer is a thermally sensitive material. The release layer is a UV light sensitive material. The second layer is parallel to the first layer. The first layer is permanent adhesive, and the second layer is thermally sensitive. The thermal sensitivity of the second layer causes a decrease in an adhesive strength in response to an application of thermal energy. The thermal sensitivity of the second layer causes an increase in an adhesive strength in response an application of thermal energy. The UV light sensitivity causes an increase in adhesive strength in response to the application of a UV light. The UV light sensitivity causes a decrease in an adhesive strength in response to an application of UV light. The handle includes a thickness of between 49 and 801 microns. The handle includes at least one side between 100 and 600 microns long. The handle includes at least one side between 300 and 800 microns long. The handle includes at least one side between 400 and 600 microns long.

In general, in an aspect, a method includes depositing an ultra-thin wafer onto a handle substrate; and releasing a discrete component from the ultra-thin wafer, the discrete component having an ultra-thin configuration, handle substrate having a thickness of at least 50 microns.

Implementations may include one or a combination of any two or more of the following features.

The method also includes attaching a release layer to the handle substrate such that the ultra-thin wafer is releasably attached to the release layer. Releasing the discrete component includes dicing the ultra-thin wafer. Dicing the ultra-wafer further includes dicing the handle substrate to form a diced-handle substrate such that the discrete component is releasably attached to the handle substrate. The discrete component is sized to cover the surface of the diced-handle substrate. The release layer is a thermally sensitive material. The release layer is an ultraviolet light sensitive material. The release layer includes a first and a second layer. The release layer includes a first layer attached to handle and a second layer oriented for discrete component deposition. The second layer is parallel to the first layer. The second layer is UV sensitive. The second layer is thermally sensitive. The first layer is permanent adhesive. The thermal sensitivity of the second layer causes a decrease in an adhesive strength in response to an application of thermal energy. The thermal sensitivity of the second layer causes an increase in an adhesive strength in response to an application of thermal energy. The UV light sensitivity causes an increase in adhesive strength in response to an application of UV light. The UV light sensitivity causes a decrease in adhesive strength in response to an application of UV light. The method also including transferring the discrete component on the handle substrate to contact a device substrate. The method also including releasing the discrete component from the handle substrate to deposit the discrete component onto the device substrate. Depositing the discrete component onto the device substrate includes bonding the discrete component to the device substrate. Releasing the discrete component from the handle is contemporaneous with bonding the discrete component to the device substrate. Releasing the discrete component from the handle is in response to the bonding the discrete component to the device substrate. Releasing the discrete component from the handle is caused by the bonding the discrete component to the device substrate. Releasing the discrete component from the handle is completed after bonding the discrete component to the device substrate. The discrete component is released from the handle through the bonding with the device substrate. The bonding further includes delivering thermal energy or UV-light to both bond the discrete component with the substrate and release the discrete component from the handle. The handle substrate includes a thickness of between 49 and 801 microns. The handle substrate remains in contact with the device substrate upon release of the handle substrate from the discrete component. The method further includes removing the handle substrate from the discrete component. Removing the handle substrate can include applying at least one of the following: a brush, a blade, compressed air, a vacuum force, a vibration, liquid jet, electrostatic, electromagnetic force or gravity force, or any combination of two or more of them. The handle includes at least one side between 100 and 600 microns long. The handle includes at least one side between 300 and 800 microns long. The handle includes at least one side between 400 and 600 microns long.

In general, in an aspect, an apparatus includes a discrete component having an ultra-thin configuration and a handle substrate releasably attached to the discrete component, the handle and the discrete component having a configuration that is thicker than the discrete component.

Implementations may include one or a combination of any two or more of the following features. The apparatus also includes a release layer attached to the handle substrate such that the discrete component is releasably attached to the release layer. The release layer is a thermally sensitive material. The release layer is an ultraviolet light sensitive material. The release layer includes a first layer and a second layer. The release layer includes a first layer attached to the handle and a second layer oriented for discrete component deposition. The second layer is parallel to the first layer. The second layer is UV sensitive. The second layer is thermally sensitive. The first layer is sensitive permanent adhesive. The thermal sensitivity of the second layer causes a decrease in an adhesive strength in response to heat exceeding a thermal parameter of the adhesive. The thermal sensitivity of the second layer causes an increase in an adhesive strength in response to heat exceeding a thermal parameter of the adhesive. The UV light sensitivity causes an increase in adhesive strength in response to an application of UV light. The UV light sensitivity causes a decrease in adhesive strength in response to the application of UV light. The handle substrate includes a thickness of between 49 and 801 microns. The handle substrate includes at least one side between 100 and 800 microns long. The handle substrate includes at least one side between 300 and 800 microns long. The handle substrate includes at least one side between 400 and 600 microns long.

In general, in an aspect, a method includes applying a process step to cause a material between a surface of an ultra-thin discrete component and a substrate to which the ultra-thin discrete component is to be attached, to change to a state in which the material holds the discrete component on the substrate. The processing step simultaneously causing a material that temporarily holds an opposite surface of the ultra-thin discrete component on a handle that is being held by a chuck of a pick and place tool, to change to a state in which the material no longer holds the discrete component on the handle.

Implementations may include one or a combination of any two or more of the following features. The method includes causing the change in state includes delivering thermal energy, UV light, or both. The material that temporarily holds an opposite surface of the discrete component on a handle substrate includes a release layer including a first layer and a second layer. The material that temporarily holds an opposite surface of the discrete component on a handle substrate includes a release layer including a first layer attached to the handle and a second layer that temporarily holds the discrete component. The release layer is a thermally sensitive material. The release layer is a UV light sensitive material. The second layer is parallel to the first layer. The first layer is permanent adhesive, and the second layer is thermally sensitive. The second layer is UV sensitive. The second layer is thermally sensitive. The thermal sensitivity of the second layer causes a decrease in an adhesive strength in response to an application of thermal energy. The thermal sensitivity of the second layer causes an increase in an adhesive strength in response an application of thermal energy. The UV light sensitivity causes an increase in an adhesive strength in response to the application of a UV light. The UV light sensitivity causes a decrease in an adhesive strength in response to an application of UV light. The handle includes a thickness of between 49 and 801 microns. The handle includes at least one side between 100 and 600 microns long. The handle includes at least one side between 300 and 800 microns long. The handle includes at least one side between 400 and 600 microns long.

In general, in an aspect, a method includes using a releasable layer to attach a handle substrate to a discrete component, and while the handle substrate is attached to the discrete component, using a tool to hold the handle substrate and cause the discrete component to contact an adhesive layer on the device substrate. The method also includes causing the releasable layer to release the handle substrate from the discrete component and causing the discrete component to become attached to the device substrate at the adhesive layer, and withdrawing the tool from the handle substrate while the handle substrate remains in contact with the discrete component through the released releasable layer.

Implementations may include one or a combination of any two or more of the following features:

The method includes removing the handle substrate from contact with the discrete component. Removing the handle substrate from contact with the discrete component includes applying at least one of the following: a brush, a blade, compressed air, a vacuum force, a vibration, or gravity force, or a combination of any two or more of them. The releasable layer is a thermally sensitive material. The releasable layer is an ultraviolet light sensitive material. The releasable layer comprises a first and a second layer. The releasable layer comprises a first layer attached to handle and a second layer oriented for discrete component deposition. The second layer is parallel to the first layer. The second layer is UV sensitive. The second layer is thermally sensitive. The first layer is permanent adhesive. The thermal sensitivity of the second layer causes a decrease in an adhesive strength in response to an application of thermal energy. The thermal sensitivity of the second layer causes an increase in an adhesive strength in response to an application of thermal energy. The UV light sensitivity causes an increase in adhesive strength in response to an application of UV light. The UV light sensitivity causes a decrease in adhesive strength in response to an application of UV light. Releasing the discrete component from the handle is contemporaneous with attaching the discrete component to the device substrate. Releasing the discrete component from the handle is in response to attaching the discrete component to the device substrate. Releasing the discrete component from the handle is caused by the attaching the discrete component to the device substrate. Releasing the discrete component from the handle is completed after attaching the discrete component to the device substrate. The discrete component is released from the handle through attaching the discrete component to the device substrate.

We describe here, among other things, new ways to package ultra-small and/or ultra-thin discrete components, for example, ultra-small and/or ultra-thin semiconductor dies that include integrated circuits that are temporarily attached to handle substrates such that the resulting assembly is compatible with standard electronics packaging equipment, for example, pick-and-place die bonders and other chip assembly equipment. Among other things, the methods and products that we describe can be relatively simple, inexpensive, effective, and compatible with current systems. In that respect, these methods and products will open new markets and expand current markets for technology including low-cost electronic devices.

We use the term discrete component broadly to include, for example, any unit that is to become part of a product or electronic device, for example, electronic, electromechanical, or optoelectronic components, modules, or systems, for example any semiconductor material having a circuit formed on a portion of the semiconducting material.

We use the term device substrate broadly to include, for example, any object that will receive the discrete component or to which the discrete component is assembled, for example, a higher level assembly, for example, a product or electronic device electronic, electromechanical, or optoelectronic components, or system. In some examples, a device substrate can be a flexible, organic substrate.

We use the term handle, handle substrate, interim handle, or interim handle substrate broadly to include, for example, any rigid substrate, such as blank silicon wafers, glass or ceramic substrates, or substrates made of rigid polymers or composite materials, of a thickness or rigidity or both exceeding the thickness or rigidity or both of the discrete component for temporary use to transfer the discrete component to a device substrate and/or for temporary use to support one or more discrete components..

We use the term carrier or carrier substrate broadly to include, for example, any material including one or more discrete components, for example, a collection of discrete components assembled by a manufacturer, such as a wafer including one or more semiconductor dies.

We use the term transparent carrier broadly to include, for example, any material, such as glass or a transparent polymer, to which a discrete component is attached via a carrier release layer and that is at least partially transparent to at least some wavelengths of the ultraviolet, visible, or infrared electromagnetic spectrum.

With respect to a discrete component, we use the term ultra-thin broadly to include, for example, a discrete component having a thickness incompatible with general pick-and-place technology, for example, having a thickness less than or equal to 50 μm.

With respect to a discrete component, we use the term ultra-small broadly to include, for example, a discrete component having a size incompatible with general pick-and-place technology, for example, having a maximum length less than or equal to 300 μm/side.

With respect to a wafer, we use the term ultra-thin broadly to include, for example, a semiconductor wafer having a maximum thickness of less than or equal to 50 μm.

These and other aspects, features, implementations, and advantages can be expressed as methods, apparatus, systems, components, means or steps for performing functions, and in other ways and combinations of them.

These and other aspects, features, implementations, and advantages will become apparent from the following description, and from the claims.

DESCRIPTION OF DRAWINGS

FIG. 7 is a diagram of an ultra-thin wafer mounted on a handle substrate.

FIGS. 8A and 8B are diagrams of ultra-thin wafer dicing.

DETAILED DESCRIPTION

Figure 1A:
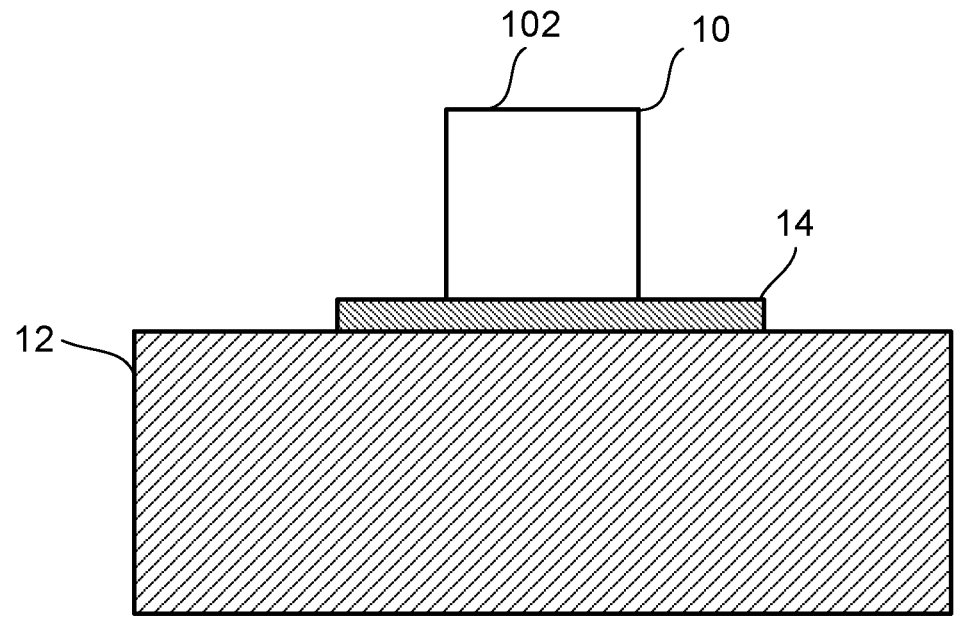
FIGS. 1A and 1B are diagrams of a discrete component on a device substrate.

We describe herein, among other things, new ways to package highly flexible and/or tiny (for example, imperceptible) discrete components. For instance, the discrete components can be semiconductor dies that include integrated circuits. Such flexible and imperceptible discrete components are ultra-thin and/or ultra-small and provide the flexibility and low cost beneficial to a wide range of applications, but are also currently incompatible with conventional packaging techniques, e.g., pick-and-place equipment. Among other things, the methods and products we describe herein are optimized to handle such ultra-thin and/or ultra-small discrete components in combination with conventional pick-and place equipment. In that respect, these methods and products can result in a reduction in production cost of electronics products while supporting packaging rates higher than those possible with conventional discrete components and pick-and-place equipment.

The discrete components are packaged according to a sequence of process steps, each process step having one or more possible approaches. The approaches can be combined in a mix-and-match scheme to obtain a variety of processes for packaging ultra-small or ultra-thin discrete components. In some of these processes, the discrete components are temporarily attached to handle substrates such that the resulting assembly is compatible with standard electronics packaging equipment, such as pick-and-place die bonders or other chip assembly equipment. In some of these processes, a laser assisted contactless transfer method is used to transfer discrete components that are not compatible with standard electronics packaging equipment. Among other things, the methods and products that we describe can be relatively simple, inexpensive, effective, and compatible with current systems. In that respect, these methods and products will open new markets and expand current markets for technology including low-cost electronic devices.

The processes described here can enable packaging of discrete components that are ultra-small or ultra-thin or both, e.g., discrete components that are too thin or too small or both for standard integrated circuit packaging equipment or approaches. The discrete components are formed to be ultra-thin having, for example, a maximum thickness of 50 µm or less, 40 µm or less, 30 µm or less, 25 µm or less, 20 µm or less, 10 µm or less, and 5 µm and less, to be ultra-small having, for example, a maximum length or width dimension less than or equal to 300 µm/side, 250 µm/side, 200 µm/side, 150 µm/side and 100 µm/side, or both ultra-thin and ultra-small. As such, the dimensions of the discrete components render current mass integrated circuit packaging technologies, such as the mechanical pick-and-place systems, ineffective (due to, for example, physical limitations, prohibitive costs, inefficiency, and/or low production rates) if not wholly unable to package the discrete components or similarly sized discrete components.

Referring to FIG. 1A, one or more of the processes described here can be used to position a discrete component 10 that is ultra-thin, ultra-small, or both, on a device substrate 12 for packaging into an electronics device. The device substrate 12 can be a substrate that is compatible with integrated circuit packaging, such as a printed circuit board, plastic casing, ceramic substrate, flexible circuit, or another device substrate. The discrete component 10 can be mechanically bonded, electrically connected, or both to the device substrate 12 via an attachment element 14, such as a curable conductive or non-conductive adhesive (discussed below).

The discrete component 10 includes an active face 102 on which is formed one or more integrated circuit devices. In some examples, the active face 102 can include a passivation layer (not shown). In the example of FIG. 1A, the discrete component 10 is positioned on the device substrate 12 such that the active face 102 of the discrete component 10 is oriented away from the device substrate 12 (which we sometimes call a "face-up" position). When positioned in a face-up position on the device substrate 12, the discrete component 10 can electrically connected to other components on the device substrate 12 using approaches such as wire bonding, tape automated bonding (TAB), screen printing, direct write, or other methods. The backside of the discrete component is bonded to the device substrate using approaches such as eutectic alloys, solders, adhesives such as conducting or non-conducting epoxies, polyamides, or other materials or methods.

Figure 1B:
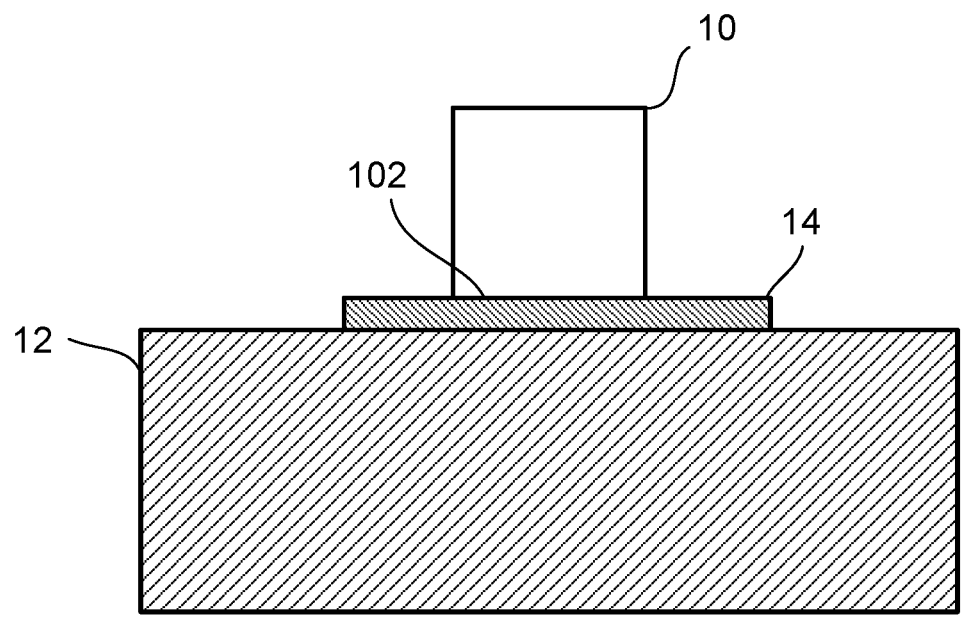

Referring to FIG. 1B, in some examples, one or more of the processes described here can be used to position the discrete component 10 on the device substrate 12 such that the active face 102 of the discrete component 10 is oriented toward the device substrate 12 (which we sometimes call a "face-down" position or a "flip-chip" configuration). When packaged in a flip-chip configuration, the discrete component can be electrically connected to other components on the device substrate using flip-chip assembly methods such as conductive adhesives or soldering.

Figure 2:
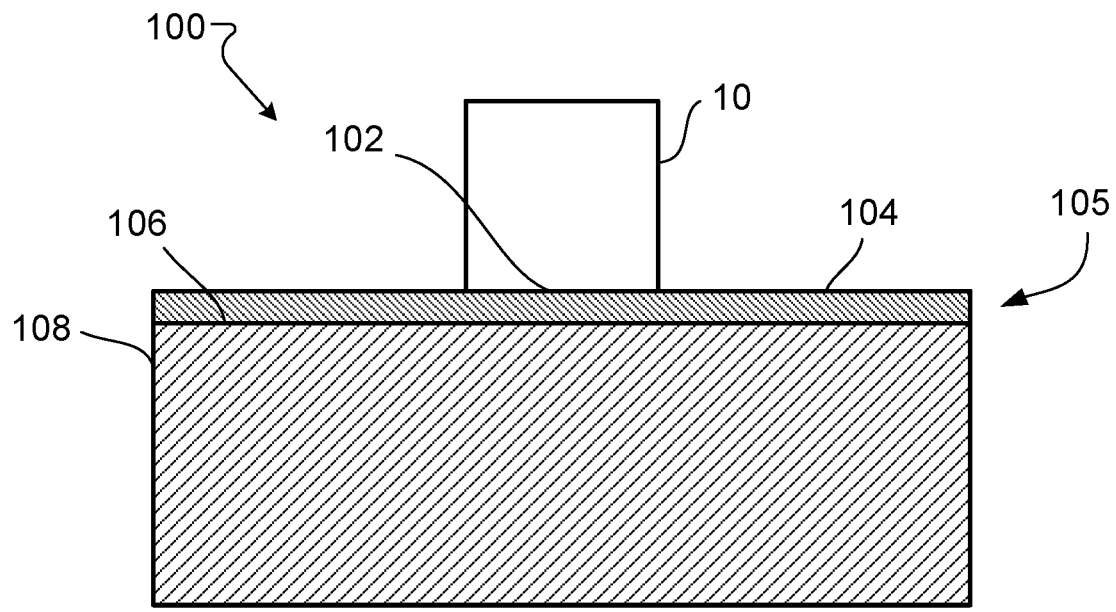
FIG. 2 is a schematic side view of a handle assembly including an ultra-small and ultra-thin bare discrete component and a handle substrate.
Figure 3:
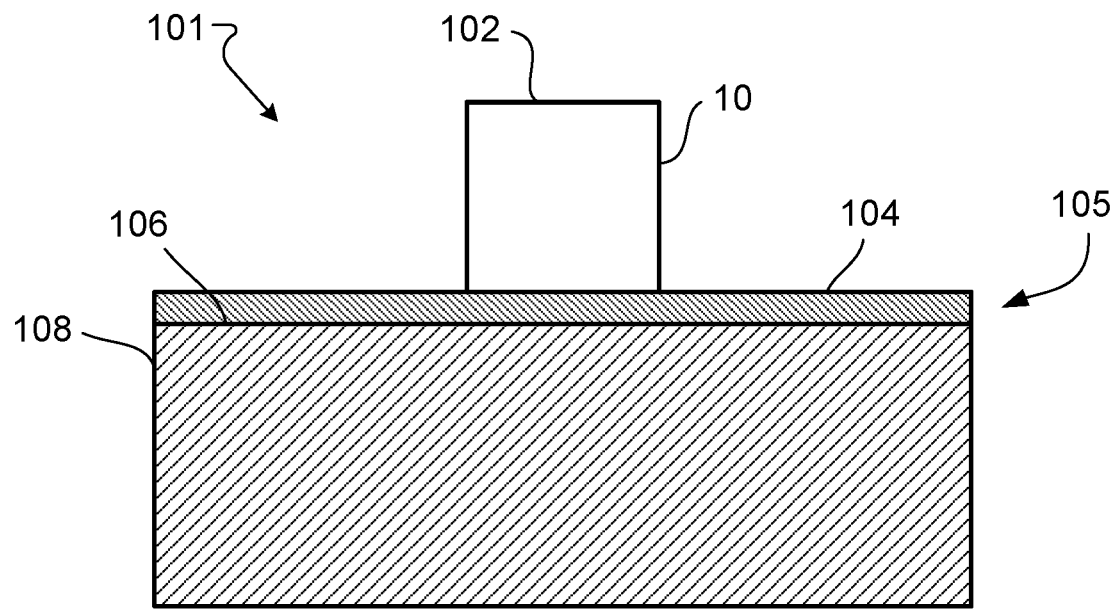
FIG. 3 is a schematic side view of a handle assembly including an ultra-small and ultra-thin bare discrete component and a handle substrate.

As shown in FIGS. 2 and 3, in some examples, a handle assembly 100 including the discrete component 10 and a handle substrate 108 is manipulated to position the discrete component 10 onto the device substrate. The discrete component 10 includes an active face 102, which includes an integrated circuit device. The active face 102 may also include a passivation layer (not shown). The discrete component 10 is releasably attached to the handle substrate 108 via an attachment to a handle release layer 105 having a first surface 104 exposed to the discrete component 10 and a second surface 106 exposed to the handle substrate 108. The handle release layer 105 is discussed in more detail below.

In FIG. 2, the discrete component 10 is oriented with the active face 102 facing the handle substrate 108. Such a configuration is advantageous if the discrete component is expected to be positioned in a face-up position on the device substrate and electrically connected to other components on the device substrate using means and materials commonly used for such a connection, for example, wire bonding, tape automated bonding (TAB), screen printing, direct write, or other methods. The backside of the discrete component is bonded to the device substrate using means and materials commonly used for such an attachment, for example, bonding with eutectic alloys, solders, adhesives such as conducting or non-conducting epoxies, polyamides, or other suitable materials and methods.

Figure 24:
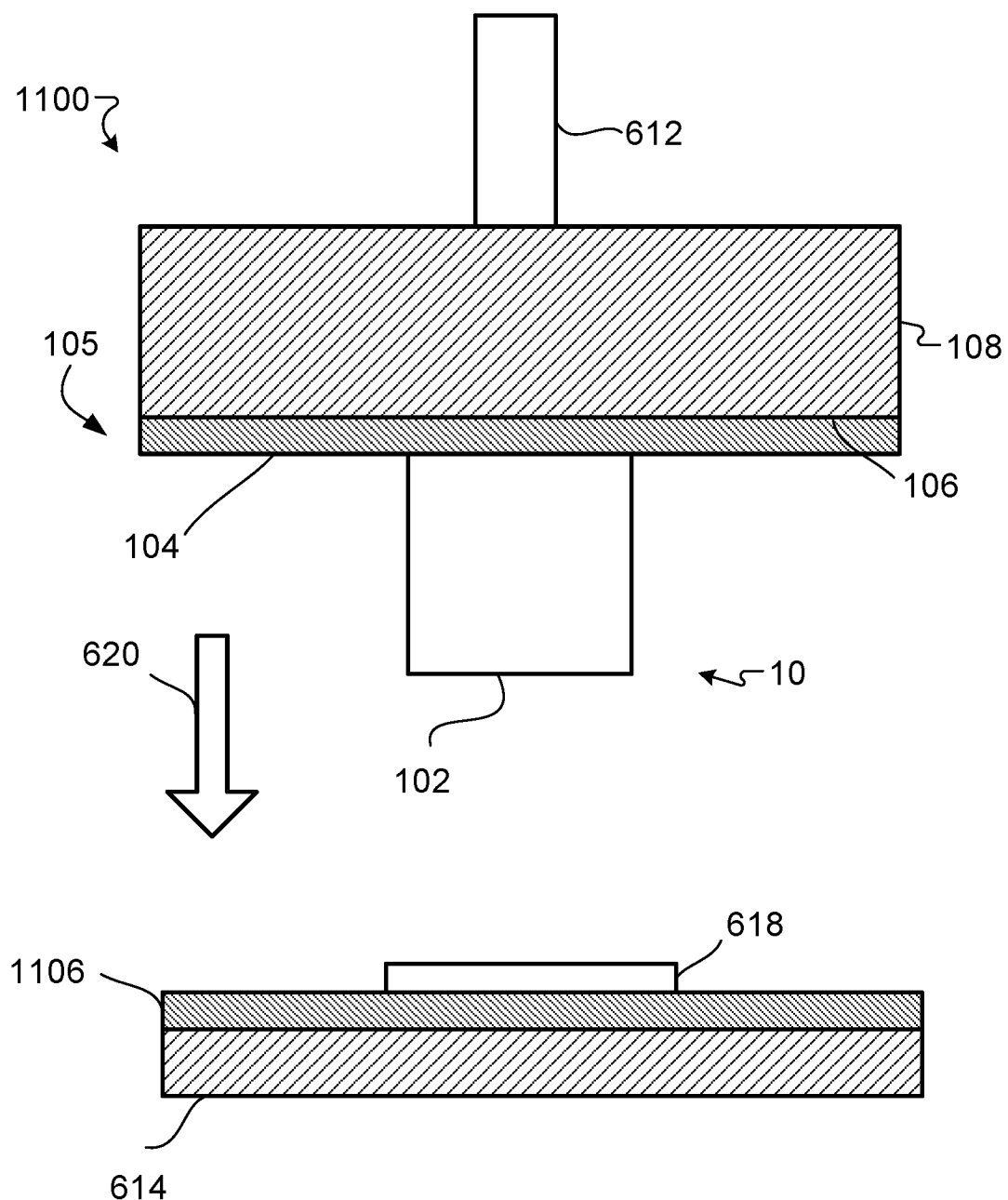
FIG. 24 is a schematic side view of a handle substrate prior to an attachment with a discrete component.

The integrated packing methods, as described below, are alternatively capable of producing a discrete component with an alternative active face orientation. For example, as shown in FIG. 3, a handle assembly 101 can include discrete component 10 with the active face 102 exposed or oriented away from the handle substrate 108. Such an orientation is advantageous if the discrete component 10 is expected to be electrically connected using the method referred to as a flip-chip assembly to components, for example, conductors on a device substrate, such as those shown, for example in FIG. 24.

In some implementations, the handle substrate 108, for example, a blank silicon wafer, glass, ceramics, or other inorganic or organic substance, extends beyond the discrete component 10 and is sized and configured to be compatible with current pick-and-place systems. In some cases, one or more circuits are placed on oversized handle substrate, and each individual handle is cut to size. Generally, the handle substrate 108 can have a length greater than or equal to 300 μm/side, preferably 400-600 μm/side, and thickness exceeding 50 μm, for example, a thickness greater than 50 μm, and between 100-800 μm. In these cases, while pick-and-place systems may be unable to effectively transfer the discrete component 10, the pick-and-place system will be able to transfer the discrete component 10 so long as the discrete component 10 is attached to the sufficiently sized and configured handle substrate. As such, however, standard deployment means of the pick-and-place system, for example, the absence of a vacuum force, are unable to release only the discrete component, but rather would release the handle and discrete component assembly. However, among other advantages, the characteristics of the attachment means and their relative relationship to each other, particularly between the discrete component, the handle substrate, and the device substrate, are selectable and customizable to release the discrete component from the handle substrate and attach it to the device substrate while the pick-and-place system retains control over the handle substrate.

Figure 4:
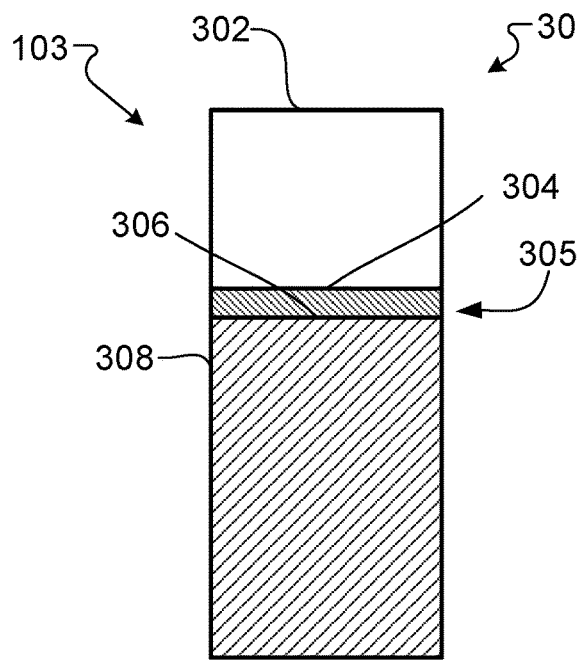
FIG. 4 is a schematic side view of a handle assembly including an ultra-thin bare discrete component and a handle substrate.

In some implementations, a discrete component 30 can have a size but remain too thin for compatibility with current packaging technologies. In these cases, as shown in FIG. 4, a handle assembly 103 can include the ultra-thin discrete component 30 attached to a handle substrate 308 having a similar length to the discrete component 30. As such, the handle assembly 103 is thick enough for compatibility with pick-and place systems. The properties of a handle release layer 305 including a second surface 306 and a first surface 304 are generally similar to those described with reference to FIGS. 2 and 3.

We describe here several processes that can be used to position discrete components that are ultra-thin, ultra-small, or both, onto device substrates in face-up or face-down positions. The processes described here follow a general flow including multiple general process steps, each of which can be accomplished by one or more different approaches. The processes described here are established by a "mix-and-match" approach among the general process steps and the approaches for each of the general process steps. Some processes described here include all of the general process steps; some processes include fewer than all of the general process steps.

Figure 5:
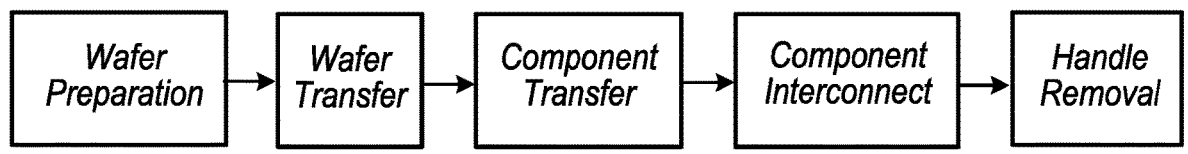
FIG. 5 is a flow chart.

Referring to FIG. 5, a general flow 200 for positioning discrete components that are ultra-thin, ultra-small, or both, on a device substrate includes the following general process steps: wafer processing (202), wafer preparation (204) wafer transfer (206), component transfer (208), component interconnection (210), and handle removal (212). Each of these general process steps is described briefly here and in more detail later in this document. In some examples, the process steps can occur in an order different from that shown in FIG. 5. For instance, wafer preparation 204 can occur after wafer transfer 206. In some examples, one or more of the process steps can be divided into multiple sub-steps that can occur at different points in the sequence shown in FIG. 5. For instance, wafer preparation 204 can be divided into a first sub-step that occurs before wafer transfer 206 and a second sub-step that occurs after wafer transfer 206.

Wafer processing (202) includes fabricating or obtaining wafers bearing large numbers of discrete components fabricated thereon. We sometimes refer to wafer processing as discrete component fabrication. The discrete components are fabricated on the wafers using semiconductor processing techniques such as thin film processing methods on a semiconductor substrate, such as a bulk silicon substrate, a silicon-on-insulator substrate, a germanium substrate, a gallium arsenide substrate, a sapphire substrate, or another type of semiconductor substrate.

In some examples, the discrete components fabricated on the wafers are bumped such that the discrete components are compatible with a flip-chip configuration. Discrete components can be bumped by stud bumping, electroless nickel-gold plating, solder balls, solder paste printing, solder electroplating, or other approaches. In some examples, the discrete components are bumped at a later point in the general process.

Wafer preparation (204) includes aspects such as thinning the wafer, mounting the wafer on a handle substrate, mounting the wafer on a dicing tape, mounting the wafer on a transparent carrier, dicing the wafer into individual discrete components, or a combination of any two or more of these aspects. A transparent carrier is a material, such as glass or a transparent polymer, to which a discrete component is attached via a carrier release layer and that is at least partially transparent to at least some wavelengths of the ultraviolet, visible, or infrared electromagnetic spectrum" instead. In some processes described here, no handle substrate is used.

Wafer transfer (206) includes transferring the diced wafer to a transparent carrier or repackaging the diced wafer in a die carrier, such as a waffle pack, a gel pack, or another type of die carrier. In some processes described here, the wafer transfer process step is not performed.

Component transfer (208) includes transferring individual discrete components onto target positions on a device substrate. Component transfer can be performed by a pick-and-place approach, a laser assisted contactless transfer method, another transfer method, or a combination of multiple transfer methods.

Component interconnection (210) includes bonding the discrete components to the device substrate, e.g., such that the discrete components are electrically connected to the circuitry on the device substrate.

Handle removal (212) includes releasing the handle substrate from the bonded discrete components and removing the detached handle substrate from the device substrate. In processes that do not use a handle substrate, the handle removal process step is not performed.

Each of the general process steps shown in FIG. 5 can have one or more aspects, one or more of which can be carried out for each specific process described here.

Wafer Preparation

In the wafer preparation process step, the wafer is thinned and diced to obtain discrete components having a desired size and thickness. In some of the processes described here, wafer preparation can include mounting the wafer onto a handle substrate. In some examples, the wafer preparation process step can occur before the wafer transfer process step (described below). In some examples, the wafer preparation process step can occur after the wafer transfer process step. In some examples, the wafer preparation process step can include multiple sub-steps, one or more of which can occur before the wafer transfer process step and one or more of which can occur after the wafer transfer process step.

Figure 6A:
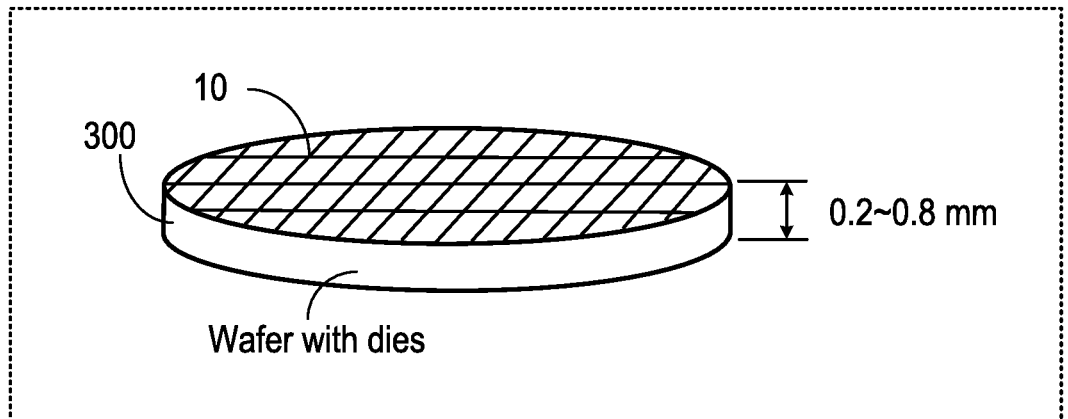
FIGS. 6A and 6B are diagrams of wafer thinning.
Figure 6B:
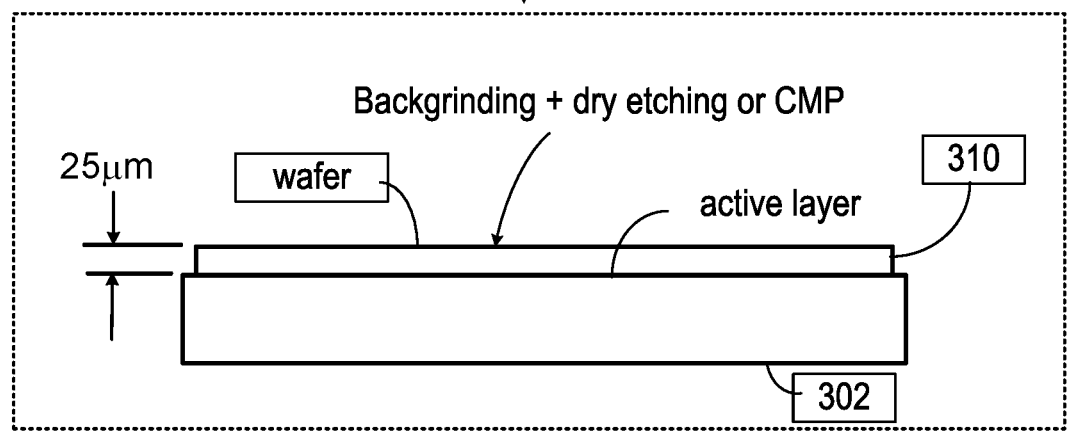

Wafer preparation can include thinning of the wafer. Referring to FIGS. 6A and 6B, a wafer 300 bearing large numbers of discrete components 10 is thinned to a desired thickness. The wafer 300 can be thinned (meaning the thickness of the wafer 300 can be reduced) through any of a variety of semiconductor processing techniques, such as mechanical grinding, chemical mechanical planarization (CMP), wet etching, atmospheric downstream plasma etching (ADP), reactive-ion etching (ME), dry chemical etching (DCE), vapor-phase etching (VPE), or any combination thereof, e.g., mechanical grinding followed by chemical-mechanical polishing. The initial thickness of the wafer 300 prior to thinning can be between about 0.1 mm and about 1 mm, such as between about 0.2 mm and about 0.8 mm, such as about 0.2 mm, about 0.3 mm, about 0.4 mm, about 0.5 mm, about 0.6 mm, about 0.7 mm, about 0.8 mm, or another thickness; and can be thinned to a thickness of about 50 µm or less, about 40 µm or less, about 30 µm or less, about 20 µm or less, about 10 µm or less, about 5 µm or less, or another thickness.

In some examples, the wafer 300 can be thinned to a thickness of approximately 50 µm using a mechanical grinding technique such as backside grinding. However, in general, as the wafer thickness decreases, the wafer 300 becomes more susceptible to damage by a mechanical grinding due to the fragility of the thin wafer. To reduce the risk of damaging the wafer, a noncontact material removal process can be used to reduce the wafer thickness beyond what is achievable by the conventional mechanical grinding process. For example, to achieve a wafer thickness of 25 µm or less, a noncontact material removal process, such as Reactive Ion Etching (ME), vapor phase etching, or any other appropriate processes can be used to produce the thin wafer.

In some examples, wafer thinning to a thickness of about 50 µm can be accomplished by mechanical backside grinding followed by polishing. During the thinning process, the wafer is temporarily bonded to a support substrate 302, such as a thicker wafer (e.g., the 3M Wafer Support System®). In a backside grinding and polishing process, an active layer 310 on the top surface of the wafer 300, on which the integrated circuitry is formed, faces down toward the support substrate 302. Following wafer thinning, the thinned wafer is removed from the support substrate 304.

Referring to FIGS. 7, wafer preparation can include mounting the thinned wafer 300 on a handle substrate 108 to form a wafer handle assembly 400. The thinned wafer 300 can be mounted on the handle substrate 108 in a face-up configuration (as shown in FIG. 7) or a face-down configuration. The handle substrate 108 can be, for example, a blank silicon wafer, glass, ceramic, or another inorganic or organic substance. The handle substrate can be sized to be compatible with standard integrated circuit processing techniques, such as pick-and-place systems. For instance, the handle substrate 108 can have a thickness of greater than about 50 µm, such as a thickness of between about 100 µm and about 800 µm, such as about 100 µm, about 150 µm, about 200 µm, about 250 µm, about 300 µm, about 350 µm, about 400 µm, about 450 µm, about 500 µm, about 550 µm, about 600 µm, about 650 µm, about 700 µm, about 750 µm, about 800 µm, or another thickness.

The thinned wafer 300 can be releasably mounted on the handle substrate 108 via an attachment to the handle release layer 105. The handle release layer provides adhesion between the wafer 300 and the handle substrate 108 that can be released upon application of a stimulus, such as ultraviolet (UV) light, high temperature, a normal or shear mechanical force, or another stimulus, or a combination of any two or more of them.

In some examples, the handle release layer 105 is a double-sided handle release layer formed of a composite of multiple sub-layers (e.g., a first layer and a second layer). The double-sided handle release layer 105 and one or more of the sub-layers (if any) can include one or more surfaces (such as an internal surface or an external surface). The double-sided handle release layer 105 includes a first surface 104 exposed to the discrete component 10 and a second surface 106 exposed to the handle substrate 108. In some examples, the handle release layer 105 is a double-sided thermal- or UV-release tape known to be compatible with wafer mounting for wafer dicing or thinning. In such a tape, the second surface 106 includes a pressure-sensitive adhesive and the first surface 104 can include a UV-release material or a thermal-release material. Exemplary release materials that are compatible with semiconductor materials are known, and selectable based on the desired adhesion characteristics.

In some examples, the handle release layer 105 is a single layer such that the first surface 104 and the second surface 106 are the same material. Such materials can include, for example, spin-on thermal release materials for temporary wafer bond, for example, the Valtron® Heat Release Epoxy System by Valtech or the Logitech's OCON-196 Thin Film Bonding Wax. Other examples of thermal release materials include the Ethylene Vinyl Acetate (EVA) copolymer films such as the WaferGrip adhesive films by Dynatex. Other exemplary materials include UV-release adhesives such as polymers with photofunctional groups that easily change their chemical structure when exposed to UV light energy. Other examples of materials for a single layer handle release layer 105 include sublimation materials that under the influence of the stimulus undergo a transition from the solid state directly to the gas phase without passing through an intermediate liquid phase.

In general, the handle release layer 105 is formed of a material that responds mechanically to an applied stimulus. In some examples, the handle release layer undergoes a mechanical change in response to a stimulus. For instance, the handle release layer can lose adhesion as a result of a change in surface morphology caused by application of the stimulus. Example handle release layers can be formed of materials that transition from smooth and highly adhesive to rough and poorly adhesive responsive to heat, ultraviolet light, or another type of stimulus. In some examples, the handle release layer undergoes a phase transition in response to a stimulus, losing adhesion as a result of a physical change in state. The transition can be from the solid to the liquid phase (melting) or from the solid to the gas phase (sublimation). In some examples, the handle release layer undergoes a chemical change in response to a stimulus and loses adhesion as a result of a change in its chemical structure or composition. Some materials undergo thermal decomposition, or thermolysis, which is a chemical decomposition caused by heat. Some materials undergo photodegradation, which is degradation induced by the absorption of light.

In some examples, the bond strength between the handle release layer 105 and the wafer 300 and between the handle release layer 105 and the handle substrate 108, for example, are each chosen so that when the wafer 300 attaches to the first surface 104, the bond strength of that attachment is weaker than the bond strength between the second surface 106 and the handle substrate 108. The bond strength between the wafer 300 and the first surface 104 could also be selected to be weaker than the bond strength between the discrete component 10 and a device substrate as described below. For example, in some cases the handle release layer 105 may be a material with a melting temperature lower than the temperature required to bond the discrete component 10 and a device substrate as described below first. Examples include wax or similar materials.

In other examples, the handle release layer 105 is chosen such that the adhesion mechanism of the first surface 104 is independently controllable relative to the attachment mechanism of the second surface 106. This arrangement helps to ensure that the wafer 300 (or an individual discrete component 10) is selectably releasable from the handle substrate 108 without necessarily releasing the handle release layer 105 from the handle substrate 108.

In other cases, for example, the handle release layer 105 could alternatively or additionally include a double coated thermal release tape (such as a REVALPHA® double-coated thermal release tape by Nitto®) that includes a pressure sensitive adhesive layer and a heat-release adhesive layer. In some cases, the first surface 104 could include the heat-release adhesive layer while the second surface 106 could include the pressure sensitive adhesive. At least upon the application of thermal energy, the bond strength between the wafer 300 (or an individual ultra-thin or ultra-small discrete component 10) and the handle release layer 105 could be weaker as compared with the bond strength between the handle release layer 105 and the handle substrate 108. As such, a force applied to the wafer 300 (or to an individual ultra-thin or ultra-small discrete component 10) away from the handle substrate, for example, a pulling and/or shear force away from the handle substrate 108, could remove the wafer 300 or the individual ultra-thin or ultra-small discrete component 10 freely from the handle substrate 108 without also removing the handle release layer 105, which remains attached to the handle substrate 108.

While the attachment means between the discrete component 10 and the handle substrate 108 is generally described as an adhesive tape, other arrangements would be possible. For example, vacuum or electrostatic forces could be used to form this attachment temporarily. As with the handle release layer 105, the attachment means and characteristics, such as bond strength, can be selected such that the bond strength between the discrete component and the substrate is greater than the bond strength between the discrete component and the handle as the discrete component is bonded with the substrate.

In some cases, it is desirable to arrange for the handle release layer 105 to be relatively thin, for example to have a thickness less than 20 μm, preferably less than 10 μm, and in some cases less than 5 μm. Using a thin handle release layer enables the use of certain advantageous chip dicing methods and improves chip quality after dicing and transfer to the substrate. The use of thicker handle release layers can contribute to die chipping or cracking during the dicing process.

Referring to FIGS. 8A and 8B, wafer preparation can include dicing the wafer handle assembly 400 into handle assemblies 500 (sometimes referred to as singulating the wafer), or dicing a wafer without handle substrate into discrete components. A wafer handle assembly is a wafer attached to a handle substrate. A handle assembly is an individual discrete component attached to a portion of a handle substrate. The wafer handle assembly can be completely or partially diced by dry or wet etching, by plasma dicing, by mechanical sawing (as shown in FIG. 8A), by laser ablation, by stealth dicing (as shown in FIG. 8B), or by another dicing technique. In some examples, the wafer handle assembly 400 can be diced by approaching the wafer handle assembly 400 with a dicing tool from the front side of the wafer handle assembly 400 (e.g., the side on which the wafer is disposed). In the example of FIG. 8A, the wafer handle assembly 400 is partially diced directly by mechanical sawing using a blade 502. In some examples, the wafer handle assembly 400 can be diced by approaching the wafer handle assembly 400 with a dicing tool from the back side of the wafer handle assembly 400 (e.g., the side on which the handle substrate 108 is disposed). In the example of FIG. 8B, the wafer handle assembly 400 is diced indirectly by laser micromachining (sometimes referred to as laser stealth dicing) using a laser beam 504 incident on the back side of the wafer handle assembly 400. In some examples, mechanical sawing and laser stealth dicing are used sequentially to completely dice a wafer handle assembly 400.

In some examples, (e.g., as shown in FIGS. 8A and 8B), the wafer handle assembly 400 including the thinned wafer and the handle substrate can be diced. In some examples, the thinned wafer is not attached to a handle substrate during dicing.

In some examples (e.g., as shown in FIGS. 8A and 8B), the wafer handle assembly 400 or the wafer can be adhered to a dicing tape 506 for dicing. The dicing tape 506 can have a backing material of polyvinyl chloride (PVC), polyolefin, polyethylene, or another material, and an adhesive surface to which the wafer handle assembly or the wafer is adhered.

In some examples (not shown), wafer transfer (described below) can occur before wafer dicing. For instance, the wafer handle assembly or the wafer can be mounted on a transparent carrier and the mounted wafer handle assembly or wafer is diced. The transparent carrier can be formed of a material, such as glass or a transparent polymer, that is at least partially transparent to at least some wavelengths of the ultraviolet, visible, or infrared electromagnetic spectrum. The transparent carrier can have a layer of a dynamic releasing layer (DRL) disposed on a surface thereof, such as described in PCT WO2012/033147, the contents of which are incorporated here by reference in their entirety.

In some examples, the wafer can be partially diced before the wafer transfer process step and dicing can be completed after the wafer transfer process step (described below).

Wafer Transfer

In the wafer transfer process step, partially or completely diced handle assemblies or an undiced wafer or wafer handle assembly is transferred from a dicing tape to a transparent carrier or to a die carrier, such as a waffle pack, a gel pack, or another type of carrier. Various approaches can be used for wafer transfer, sometimes in combination with dicing processes.

The transparent carrier 600 can be formed of a transparent material, such as glass or a transparent polymer, that is at least partially transparent to at least some wavelengths of the ultraviolet, visible, or infrared electromagnetic spectrum. The transparent carrier can have a carrier release layer, which includes a layer of a dynamic releasing layer (DRL) 604, an adhesive layer (not shown), or both, disposed on a surface thereof.

Figure 9:
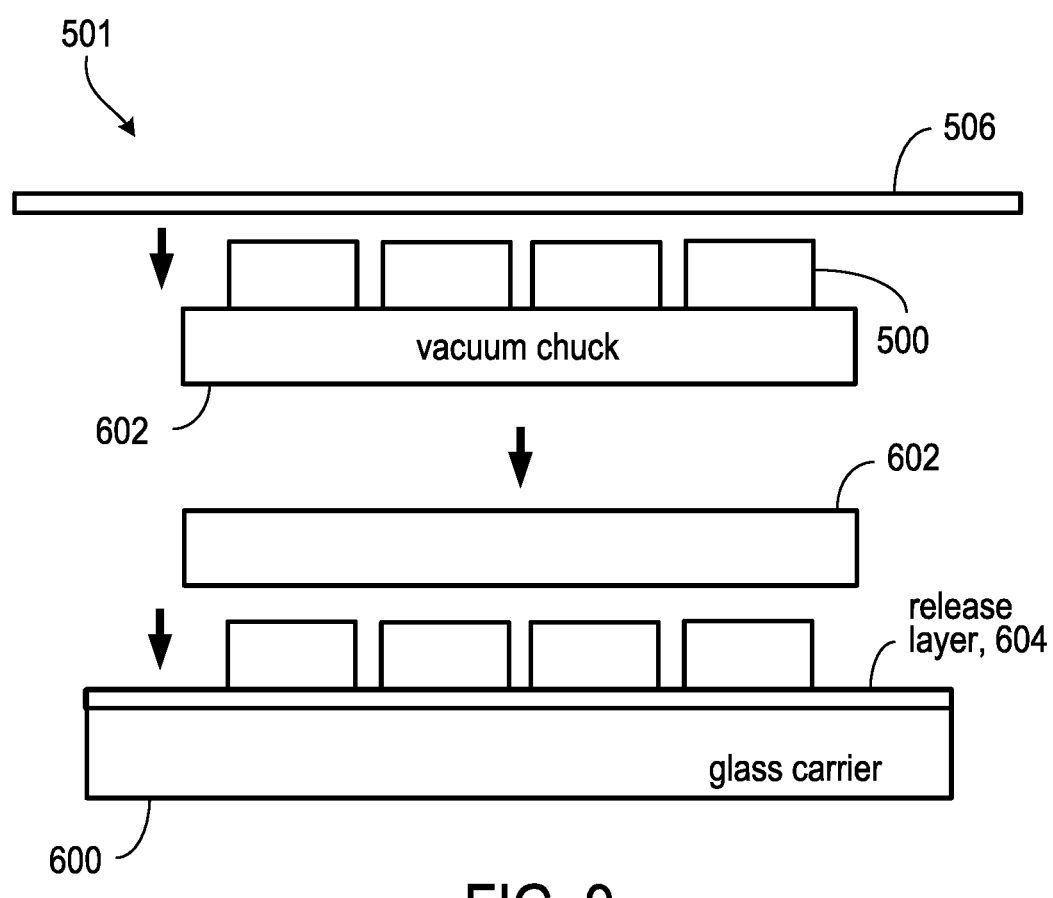
FIGS. 9-13 are diagrams of diced ultra-thin wafer transfer.

Referring to FIG. 9, in a wafer transfer approach 501, diced handle assemblies 500 or discrete components are transferred from dicing tape 506 onto the transparent carrier 600 or a die carrier. The diced handle assemblies 500 or discrete components are removed from the dicing tape 506, for instance, using suction provided by a vacuum chuck 602. A transparent carrier 600 or a die carrier is brought into contact with the diced handle assemblies 500 or undiced wafer or wafer handle assembly that is suctioned onto the vacuum check 602. The suction force is removed, causing the handle assemblies 500 or undiced wafer or wafer handle assembly to be transferred onto the transparent carrier 600 or the die carrier.

Figure 10:
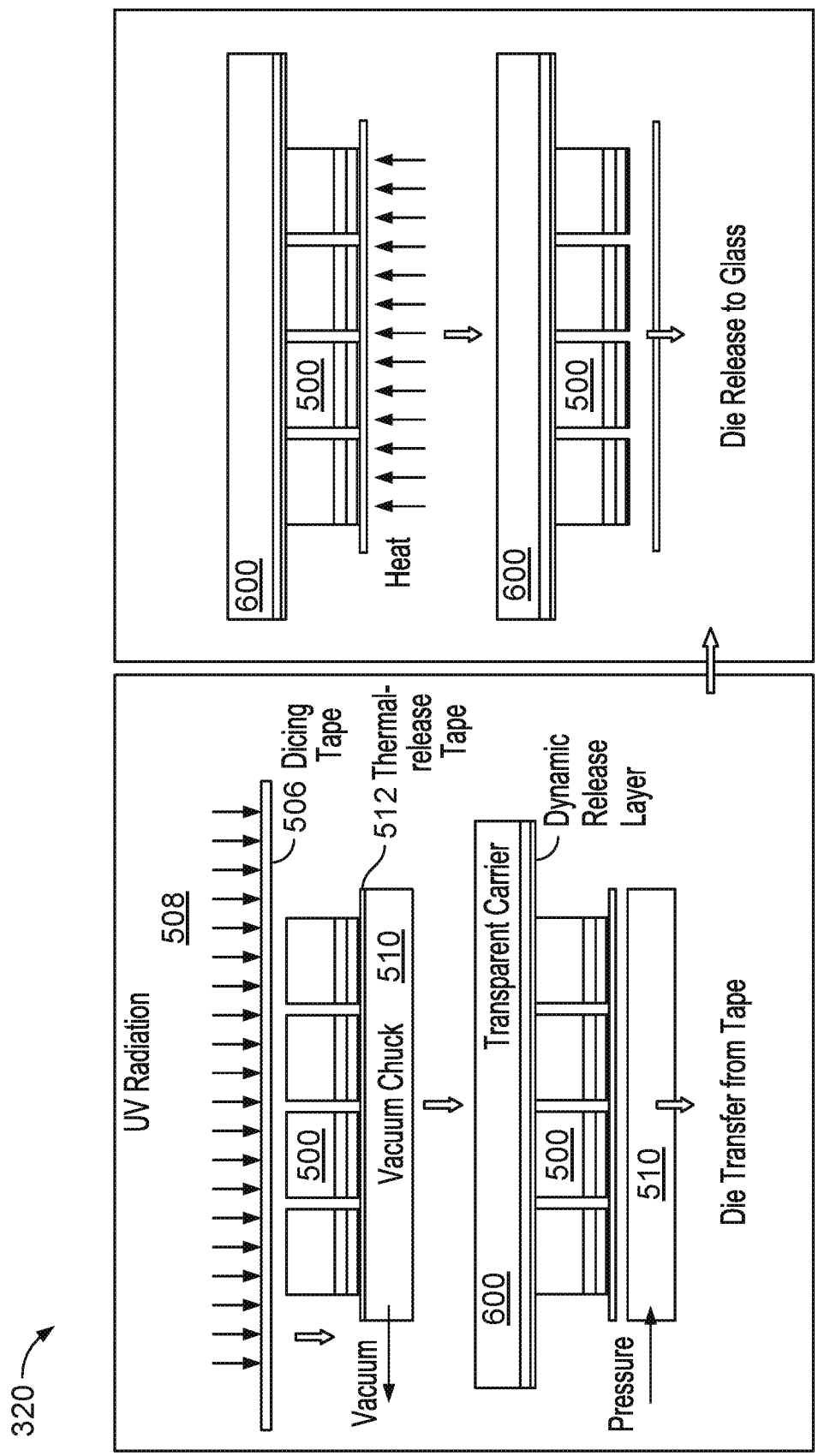

Referring to FIG. 10, in a wafer transfer approach 320, diced handle assemblies 500 or discrete components are transferred from dicing tape 506 onto the transparent carrier 600 or a die carrier. A wafer or wafer handle assembly is adhered to a dicing tape and diced into handle assemblies 500 or discrete components. The dicing tape 506 is formed of a material that undergoes a reduction in adhesion responsive to a stimulus, such as heat or light. For instance, the dicing tape 506 can be an ultraviolet (UV)-release adhesive that undergoes a reduction in adhesion when exposed to UV light. The UV dicing tape is exposed to ultraviolet light 508, causing the adhesion between the diced handle assemblies or discrete components to be weakened. A vacuum chuck 510 is coated with a material 512 that undergoes a reduction in adhesion responsive to a stimulus, such as heat or light. For instance, the vacuum chuck 510 can be coated with a thermal release tape 512 (e.g., such as a REVALPHA® double-coated thermal release tape by Nitto®) and a vacuum is drawn to keep the thermal release tape 512 in position. The diced handle assemblies 500 or discrete components are removed from the UV dicing tape 506 by contact with the tape-covered vacuum chuck 510. In some examples, the thermal release tape 512 adheres to the diced handle assemblies 500 or discrete components with an adhesion that is greater than the weakened adhesion between the previously exposed UV dicing tape 506 and the diced handle assemblies 500 or discrete components, thus removing the diced handle assemblies 500 or discrete components from the dicing tape 506. The dicing tape 506 is peeled off, leaving the handle assemblies 500 or discrete components adhered to the thermal release tape 512.

A transparent carrier 600 with a dynamic releasing layer disposed thereon is brought into contact with the diced handle assemblies 500 or discrete components adhered to the thermal release tape 512 on the vacuum chuck 510. For instance, the transparent carrier 600 can be placed on top of the diced handle assemblies 500 or discrete components and weighted for strong contact. A positive pressure can be applied to the vacuum chuck 510 to push the thermal release tape 512 away from the chuck 510, thus further pressing the diced handle assemblies or discrete components against the dynamic releasing layer of the transparent carrier 600.

The stack including the transparent carrier 600, diced handle assemblies 500 or discrete components, and the thermal release tape 512 is removed from the vacuum chuck 510 and heated to a temperature at which the thermal release tape loses some or all of its adhesion (referred to as the characteristic temperature of the thermal release tape). The thermal release tape 512 is then peeled off, leaving the diced handle assemblies 500 or discrete components on the transparent carrier 600.

The wafer transfer approach 320 can be used as long as the characteristic temperature of the thermal release tape is lower than the temperature that causes the handle release layer 105 of the handle assemblies to melt, flow, or degrade. Losses can also be mitigated by providing uniform contact between the discrete components or handle assemblies and the dynamic releasing layer on the transparent carrier, e.g., by providing a flat vacuum chuck and flat surface of the dynamic releasing layer or by providing positive pressure from the vacuum chuck to force a better contact. In some cases, accuracy of placement of discrete components or handle assembles on the transparent carrier can be facilitated by lifting the thermal release tape straight up when removing the thermal release tape.

Figure 11:
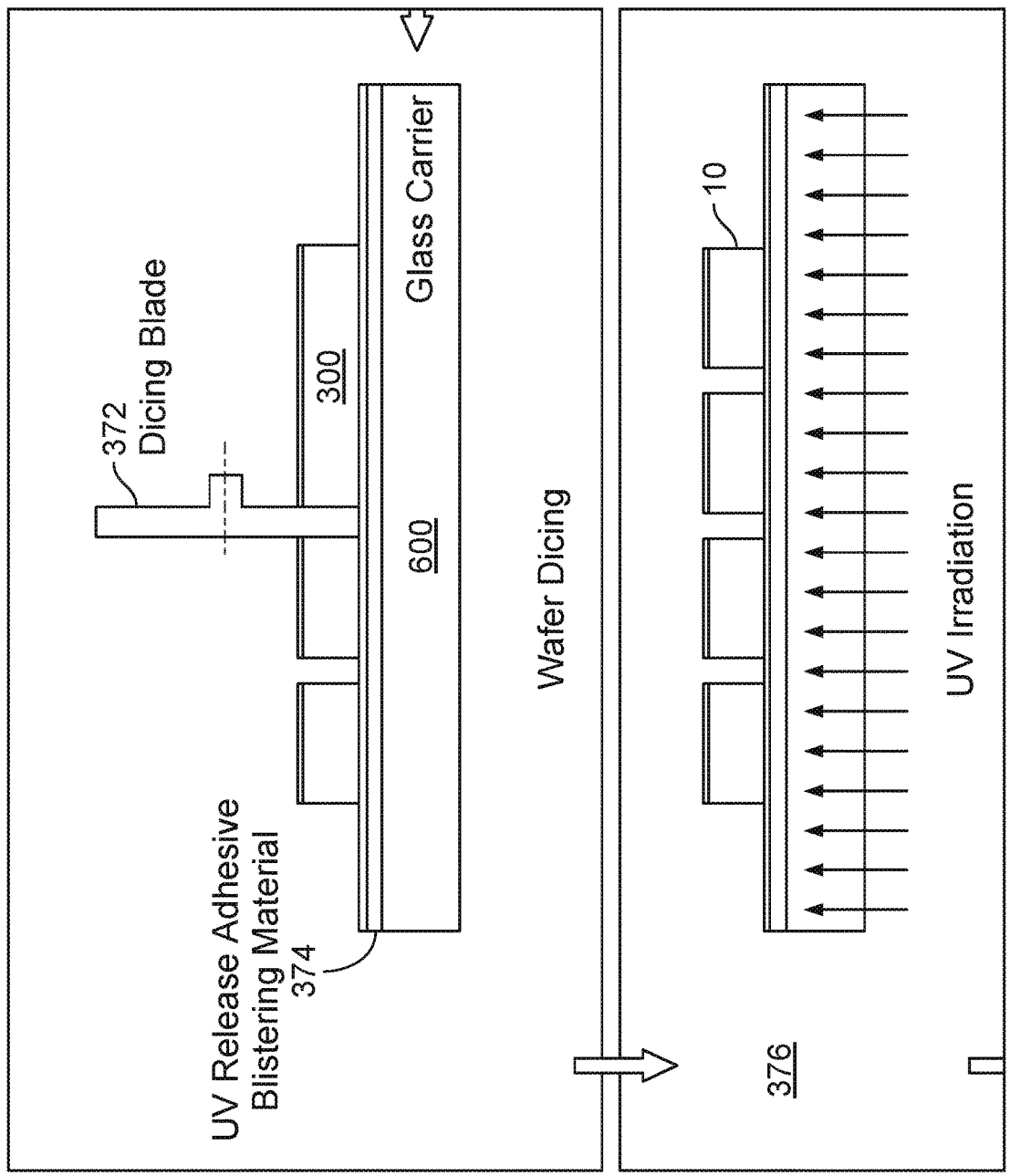

Referring to FIG. 11, in a wafer transfer approach 370, a wafer 300 or wafer handle assembly is adhered to the transparent carrier 600 via a material with controllable adhesion 374. For instance, the transparent carrier 600 can include both the dynamic releasing layer and a UV or thermal release adhesive, or can include only a UV or thermal release adhesive. The wafer 300 or wafer handle assembly is diced (372) directly on the transparent carrier 600. The material with controllable adhesion 374 has an adhesion that is strong enough to allow for secure attachment of the wafer 300 or wafer handle assembly to the transparent carrier 600 during dicing.

After dicing is complete, the material with controllable adhesion 374 is exposed to a stimulus (376), such as heat or ultraviolet light, causing the adhesion of the material 374 to be reduced. The adhesion level of the material 374 following exposure can be controlled by controlling parameters of the stimulus, such as the exposure intensity (e.g., the intensity of the ultraviolet light or the temperature), exposure time, or other stimulus parameters. For instance, the adhesion of the material 374 can be reduced to a level compatible with the laser assisted contactless transfer method 800 described below.

The wafer transfer approach 350 eliminates the component transfer process (discussed below), thus simplifying the process flow. In addition, without a component transfer process, there is no possibility of loss of discrete components or handle assemblies during component transfer, and thus process yield can be improved using the wafer transfer approach 350.

Figure 12:
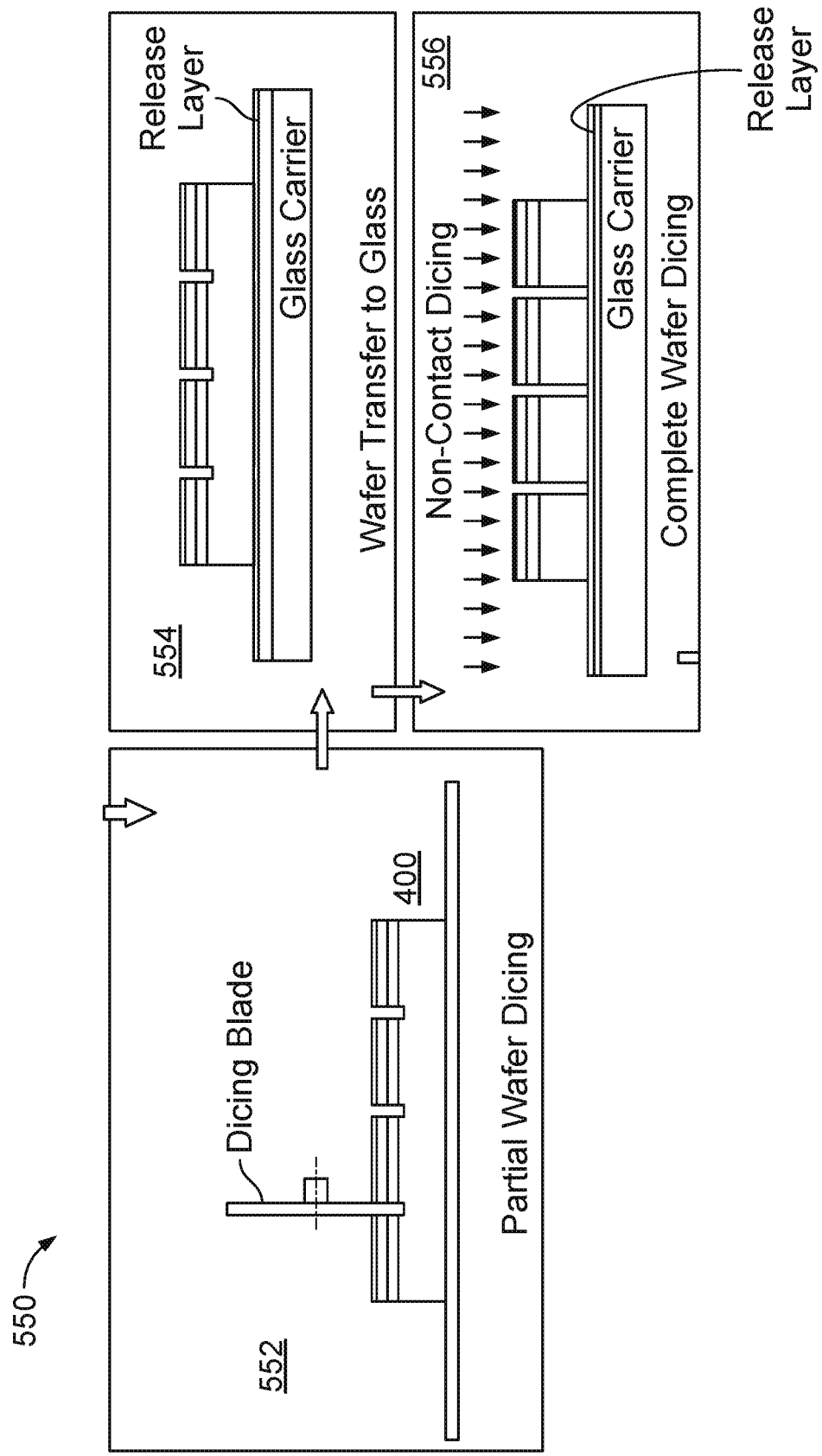

Referring to FIG. 12, in a wafer transfer approach 550, a wafer or wafer handle assembly 400 is partially diced (552), e.g., using partial blade dicing (as shown), laser dicing, wet etching, or another approach. Partial dicing removes the passivation layer and the metal from the spaces (sometimes called streets) between the discrete components on the wafer or wafer handle assembly 400, leaving a small amount of material (e.g., less than about 20 µm, such as about 5 µm, about 10 µm, about 15 µm, about 20 µm, or another amount) at the bottom of each dicing street. Partial dicing facilitates subsequent non-contact dicing such as plasma dicing.

The partially diced wafer or wafer handle assembly is transferred (554) to the transparent carrier 600 having a dynamic releasing layer disposed thereon, e.g., using a vacuum chuck. Dicing is completed on the transparent carrier 600 using a non-contact approach such as plasma dicing or wet etching (556). In the example of FIG. 12, the wafer handle assembly 400 is partially diced on a dicing tape followed by complete dicing on the transparent carrier; in some examples, the wafer handle assembly 400 can be partially diced while attached to the transparent carrier 600 followed by complete dicing using a non-contact approach. In some cases, the wafer transfer approach 550 may be more efficient for dicing and transfer of wafers rather than wafer handle assemblies or other thick components. For instance, the wafer transfer approach 550 may be used with the laser enabled packaging process 150 described below.

Figure 13:
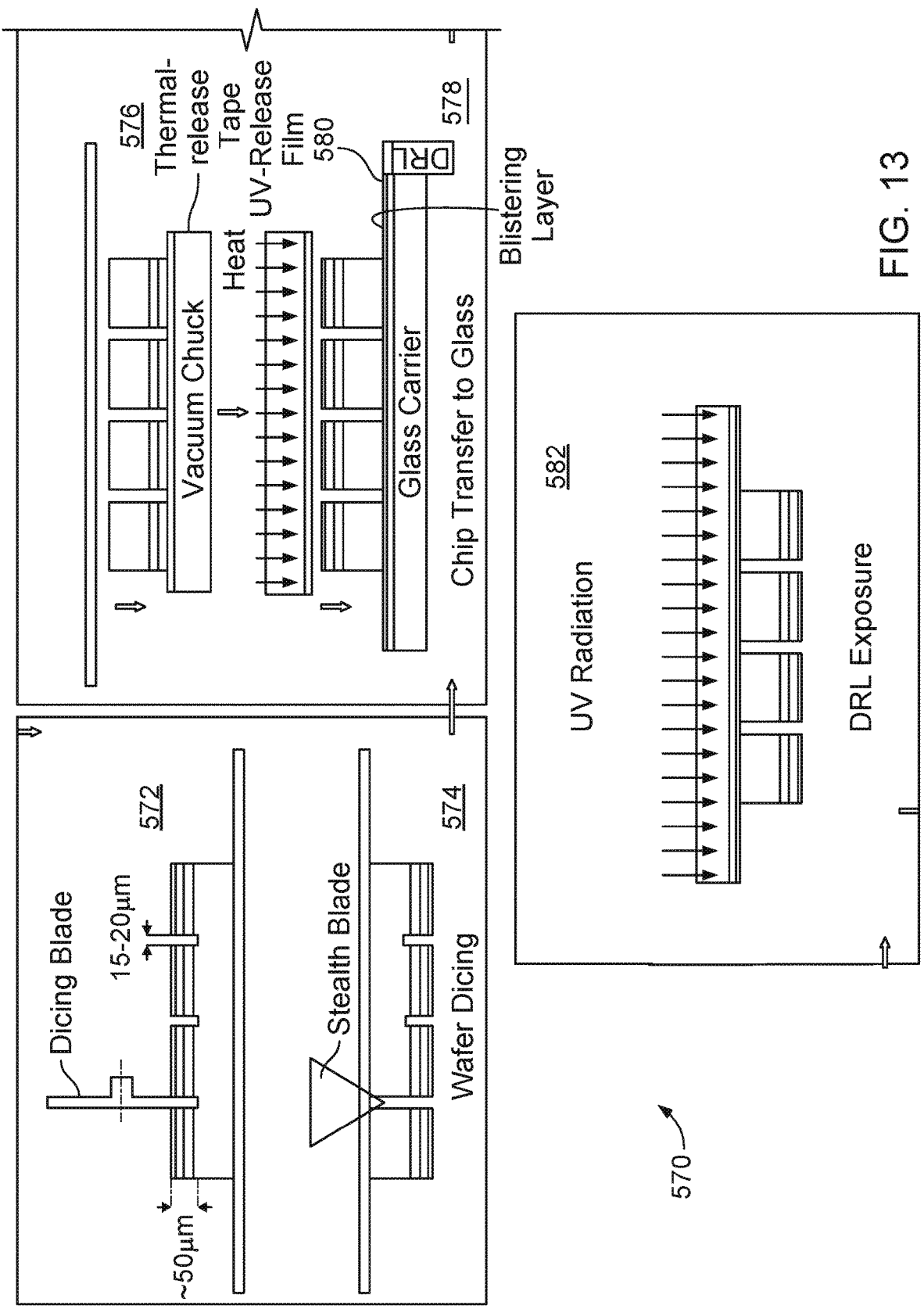

Referring to FIG. 13, in a wafer transfer approach 570, the wafer or wafer handle assembly 400 is completely diced on dicing tape. For instance, a two-step dicing process can be used in which the wafer or wafer handle assembly 400 is partially diced with a dicing blade (572) followed by complete dicing using a stealth dicing approach (574). The diced discrete components or handle assemblies are transferred (576) to a vacuum chuck covered with a thermal release tape (e.g., Revalpha) and released to a transparent carrier 600 (578) as described above for the wafer transfer approach 320.

The transparent carrier includes a material with controllable adhesion 580, in addition to or in place of the dynamic releasing layer. Once the diced discrete components are adhered to the transparent carrier, the material with controllable adhesion 580 is exposed to a stimulus (582) as described above for the wafer transfer approach 370 to reduce the adhesion of the material 580 to a level compatible with the laser assisted contactless transfer method 800 described below.

The wafer transfer approach 570 can achieve lower loss of discrete components or handle assemblies and can enable precise control of the laser assisted contactless transfer method 800 via control of the adhesion level of the material 580.

In a wafer transfer approach, pick-and-place tools are used to transfer handle assemblies or discrete components to the transparent carrier. In this approach, the handle assemblies or discrete components can be rearranged on the transparent carrier according to a desired placement, e.g., in a rectangular array, enabling simplification of placement algorithms. This approach also allows only "good" handle assemblies or discrete components to be transferred, thus improving downstream yield. This wafer transfer approach may be limited to handle assemblies or discrete components having sizes compatible with pick-and-place equipment and can sometimes have low throughput compared to other wafer transfer approaches. This wafer transfer approach can be useful in prototyping, e.g., in processes in which individual discrete components are thinned and prepared for laser transfer.

Some processes described here do not include the wafer transfer process step. For instance, processes in which the wafer is mounted on a transparent carrier prior to dicing do not include the wafer transfer process step.

Component Transfer

In the component transfer process step, individual discrete components are placed onto target positions on a device substrate.

Before the discrete components are placed onto the device substrate, the device substrate or the discrete components or both can be provided with an attachment element that promotes attachment, such as adhesion, electrical connection, or both, between the discrete components and the device substrate. The attachment element can be a material that is curable responsive to an applied stimulus, such as a material that is thermally curable, curable upon exposure to ultraviolet (UV) light, curable upon exposure to mechanical pressure, or otherwise curable. The attachment element can be a conductive material, such as a conductive epoxy, e.g., a conductive paste including metal (e.g., silver) or metal-coated particles in a paste, a solder paste, or another conductive material. The attachment element can be a non-conductive material, such as Ablebond 8008NC (Henkel Electronic Materials, Irvine, Calif.). The attachment element can be a film, such as an anisotropic conductive film or a non-conductive die attach film.

In some examples, the attachment element can be an anisotropically conductive material that, once cured, is conductive only in one direction, or in fewer than all directions. For instance, the attachment element can be an anisotropic conductive paste, such as Ablestik ACP-3122 (Henkel Electronic Materials, Irvine, Calif.), that is conductive in a vertical direction between a discrete component and the underlying device substrate, but not in a horizontal direction parallel to the surface of the device substrate. An anisotropically conductive attachment element can be disposed uniformly across the device substrate such that the discrete components can be transferred onto the device substrate without precise alignment.

Figure 14:
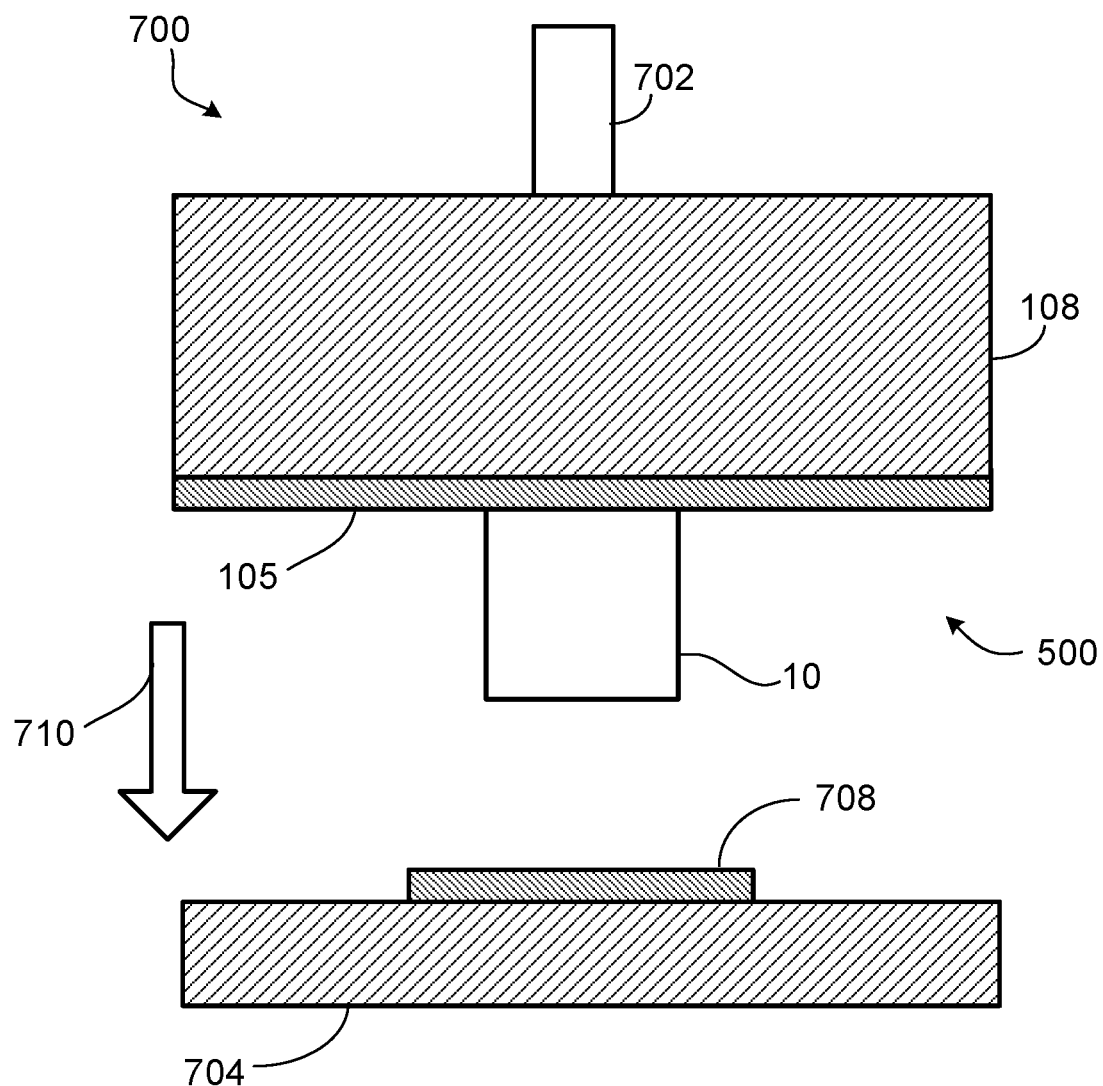
FIG. 14 is a diagram of a pick-and-place assembly of a discrete component.

Referring to FIG. 14, in some examples, transfer of the discrete components onto the device substrate is achieved via a pick-and-place approach 700. The pick-and-place approach may be unable to effectively transfer ultra-thin or ultra-small discrete components, but can be used when the discrete components are mounted on a larger or thicker handle substrate (we sometimes refer to an individual discrete component mounted on a handle substrate as a handle assembly). For instance, the pick-and-place approach can be used to transfer handle assemblies having a length of at least about 300 µm per side, handle assemblies having a length of one or more millimeters or tens of millimeters per side. The pick-and-place approach can be used to transfer handle assemblies having a thickness of greater than about 50 µm, such as a thickness of between about 100 µm and about 800 µm.

The pick-and-place approach 700 includes a tool 702 that transfers a handle assembly 500 onto a device substrate 704. The tool 702 picks up the handle assembly 500, e.g., by applying a suction to the handle substrate 108 of the handle assembly 500. The tool 702 positions the handle assembly 500 directly over an attachment surface 708 on the device substrate 704. The tool 702 then moves the handle assembly 500 toward the device substrate 704, for example, in a direction generally show by an arrow 710, until the discrete component 10 contacts the attachment surface 708 on the device substrate 704.

Figure 15:
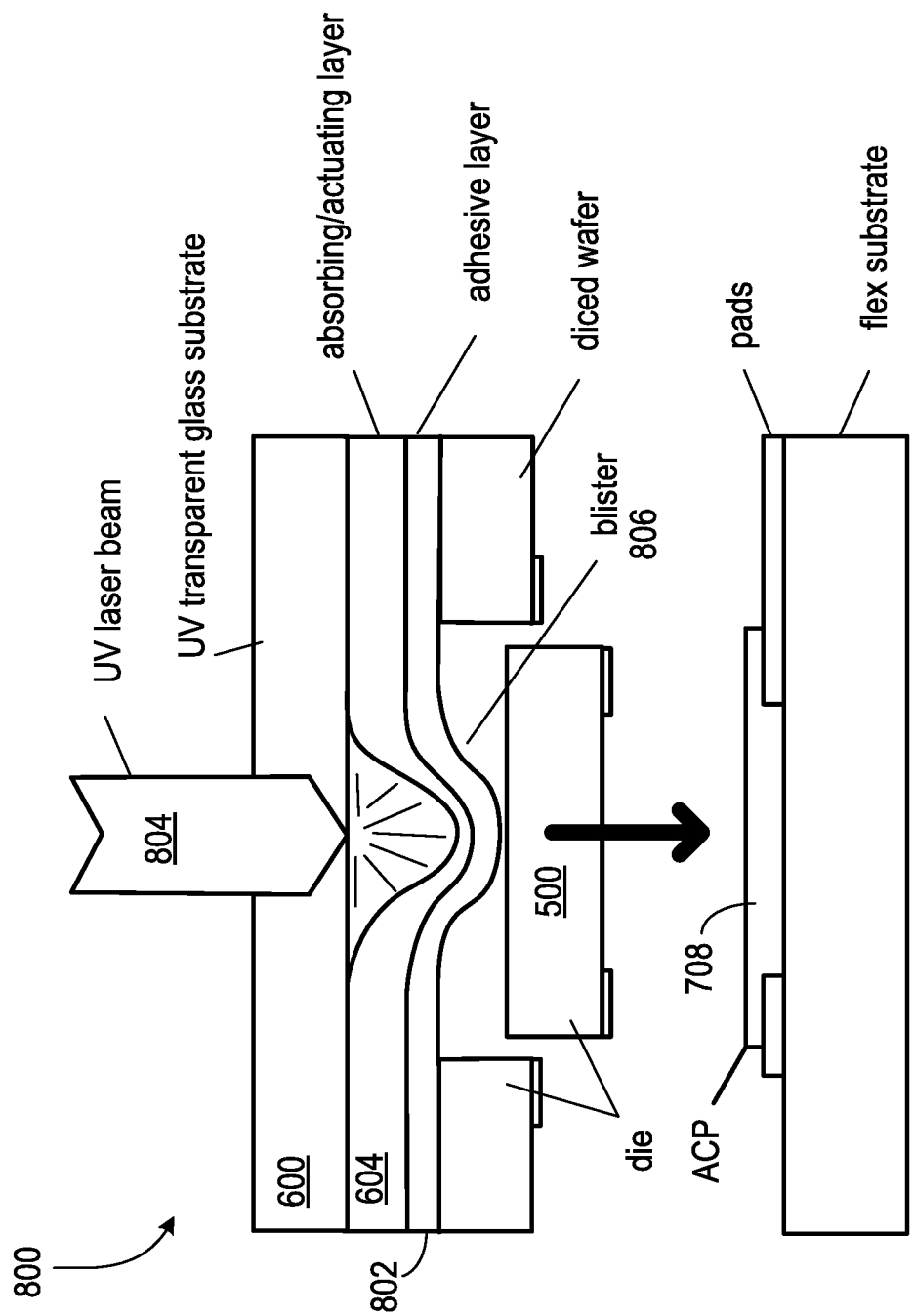
FIG. 15 is a diagram of a laser assisted contactless method for transfer of a discrete component that is ultra-thin or ultra-small or both.

Referring to FIG. 15, in some examples, component transfer is accomplished by a laser assisted contactless transfer method 800, which we sometimes call tmSLADT (thermo-mechanical selective laser assisted die transfer). In the tmSLADT method, the handle assemblies 500 (as shown) or discrete components are adhered to a transparent carrier 600 having a dynamic releasing layer (DRL) 604 disposed thereon, e.g., as described above, by an adhesive layer 802. The combination of DRL 604 and adhesive layer 802 is sometimes referred to as a carrier release layer. The dynamic releasing layer (DRL) 604 is illuminated with light 804 from a laser. The DRL 604 absorbs the energy incident thereon from the laser light 804, heating up and partially evaporating, and resulting in formation of a blister 806. The blister 806 mechanically pushes the handle assembly 500 onto the attachment surface 708 of the device substrate 704. The tmSLADT method is described in PCT WO2012/142177, the contents of which are incorporated here by reference in their entirety.

The adhesion of the adhesive layer 802 is an important parameter in the tmSLADT process 800. The force balance during tmSLADT includes the force caused by the acceleration of the expanding blister 806, Fb=ma, where a is the acceleration of the expanding blister; the gravitational force, Fg=mg, where g is the gravitational constant; and the adhesive force between the handle assembly 500 or discrete component and the adhesive layer, Fa.

When the handle assembly 500 or discrete component is attached to the DRL 604 before laser illumination, Fb (the force of the expanding blister) is zero and Fg is less than Fa (Fg<Fa). When the transfer is initiated (e.g., when laser illumination begins), the sum of the force of the expanding blister and the gravitational force exceed the adhesive force (Fb+Fg>Fa), causing the discrete component to be transferred. Combining both conditions yields $$Fg < Fa < Fg + Fb,$$

meaning that the adhesion force must be large enough to hold the handle assembly in place before transfer but smaller than the combined inertia and gravitational forces to allow for detachment of the discrete component or handle assembly during transfer.

The mass of the discrete component plays a role in both Fb and Fg, making these conditions difficult to achieve for the transfer of ultra-small or ultra-thin discrete components. In addition, the success of the transfer process is generally proportional to the difference between forces that promote transfer (Fb and Fg) and the force opposing transfer (Fa).

The adhesive force between the discrete component or handle assembly and the DRL 604 can be kept at a low level, e.g., just enough to prevent the gravitational force from making the discrete component or handle assembly drop. However, during transfer of the wafer, wafer handle assembly, discrete components, or handle assemblies from the dicing tape onto the transparent carrier 600, a larger adhesive force to the DRL 604 can be helpful. The transfer thus involves a balance between the adhesive forces of the dicing tape and the DRL 604 and the suction force of the transfer device (e.g., the vacuum chuck). The wafer transfer approaches described above are operable with various levels of adhesion to the DRL 604, providing flexibility for successful tmSLADT transfer.

In some examples, component transfer can include both tmSLADT and pick-and-place approaches. For instance, discrete components can be transferred to a handle substrate via a tmSLADT approach to form handle assemblies, which can be transferred to the device substrate by a pick-and-place approach. Conversely, handle assemblies can be transferred to a transparent carrier using a pick-and-place approach and then transferred to the device substrate via a tmSLADT approach.

Discrete components can be transferred onto the device substrate in a face up orientation such that the active face of the discrete components faces up (such as shown in FIG. 1A), e.g., for wire bonding applications. Discrete components can be transferred onto the device substrate in a face down orientation such that the active face of the discrete components faces down (such as shown in FIG. 1B), e.g., for flip chip assembly.

Component Interconnection

In the component interconnection process step, the discrete components are bonded (e.g., mechanically bonded or electrically bonded or both) to the device substrate. Referring again to FIG. 14, the attachment surface 708 on the device substrate includes attachment element that promotes attachment, such as adhesion, electrical connection, or both, between the discrete components and the device substrate. The attachment element can be a material that is curable responsive to an applied stimulus, such as a material that is thermally curable, curable upon exposure to ultraviolet light, curable upon exposure to mechanical pressure, or curable in response to another type of stimulus, or a combination of any two or more of them.

To cure the attachment element, a bonding tool applies a stimulus to the attachment element, such as a high temperature, ultraviolet light, mechanical pressure, or another stimulus, or a combination of any two or more of them. The bonding tool can apply the stimulus through the discrete component (as shown in FIG. 14), through the device substrate, or both. In some examples, the bonding tool is the same tool as the tool that transfers a handle assembly onto the device substrate in the pick-and-place approach to component transfer. The stimulus is removed after a time sufficient to allow the attachment element to cure, forming a mechanical bond, an electrical bond, or both between the discrete components and the device substrate.

In some examples, the component interconnection process step can include wire bonding. In some examples, the component interconnection process step can include placing the discrete components onto the device substrate in a face-up configuration and printing a conductive material onto the substrate and the active face of the discrete components.

Handle Removal

In the handle removal process step, the handle substrate is detached from the discrete component and removed, leaving only the discrete component bonded to the device substrate. The handle substrate is attached to the discrete component via a handle release layer, which provides adhesion between the discrete component and the handle substrate that can be released responsive to an applied stimulus, such as temperature, ultraviolet light, a normal or shear mechanical force, or another type of stimulus, or a combination of any two or more of them.

To detach the handle substrate from the discrete component, a release tool applies a stimulus to the handle release layer, such as high temperature, ultraviolet light, normal or shear force, or another stimulus, or a combination of any two or more of them. The release tool can apply the stimulus through the discrete component, through the device substrate, or both. In some examples, the release tool is the same as the bonding tool that applies a stimulus to the attachment element. The stimulus is removed after a time sufficient to allow release of the handle release layer. The handle substrate is removed, e.g., by a suction force, by forced air, by an action of the release tool, or in another way.

In some examples, the handle release layer and the attachment element are responsive to the same stimulus. A single stimulus can be applied that concurrently cures the attachment element and causes the handle release layer to release. For instance, when the handle release layer and the attachment element are responsive to the same stimulus, a single release tool can be used to cure the attachment element, release the handle layer, and remove the handle. In some examples, the handle release layer and the attachment element are responsive to different stimuli that are applied concurrently or sequentially.

In some of the processes described here, a handle substrate is not used, and thus the handle removal process step is not carried out.

As discussed above, by combining these steps in various combinations we can various processes for placing discrete components onto device substrates. Five example processes are summarized in Table 1 and each discussed here.

applying photoresists, to the wafer. The thickness and composition of the masking film material are selected in view of anticipated processing steps downstream from the wafer fabrication. For example, the thickness and composition of the masking film is selected such that that the masking film is removed, for example during an etching process (420) (as described below), after the streets are opened.

TABLE 1

Processes for packaging of an ultra-thin or ultra-small discrete component.

| Process | Wafer Preparation | Wafer Transfer | Component Transfer | Component Interconn. | Handle Removal |
|---|---|---|---|---|---|
| Handle assisted packaging (900) | Wafer thinning; Handle attachment; Dicing on dicing tape | To die carrier (optional) | Pick-and-place | Curing of attachment element | Handle detachment and removal |
| Laser enabled packaging (150) | Wafer thinning; Dicing on dicing tape | To transparent carrier | Laser assisted contactless transfer | Curing of attachment element | N/A |
| Direct laser enabled packaging (160) | Wafer thinning; Dicing on transparent carrier | N/A | Laser assisted contactless transfer | Curing of attachment element | N/A |
| Laser enabled, handle assisted packaging (180) | Wafer thinning; Handle attachment; Dicing on dicing tape | To transparent carrier | Laser assisted contactless transfer | Curing of attachment element | Handle detachment and removal |
| Direct laser enabled, handle assisted packaging (250) | Wafer thinning; Handle attachment; Dicing on transparent carrier | N/A | Laser assisted contactless transfer | Curing of attachment element | Handle detachment and removal |
| Handle assisted ultra-small chip assembly (350, 380) | Wafer thinning; Dicing on dicing tape and transparent carrier | N/A | Laser assisted contactless transfer onto handle; Pick-and-place | Curing of attachment element | Handle detachment and removal |

Handle-assisted Ultra-small Chip Assembly

Figure 16:
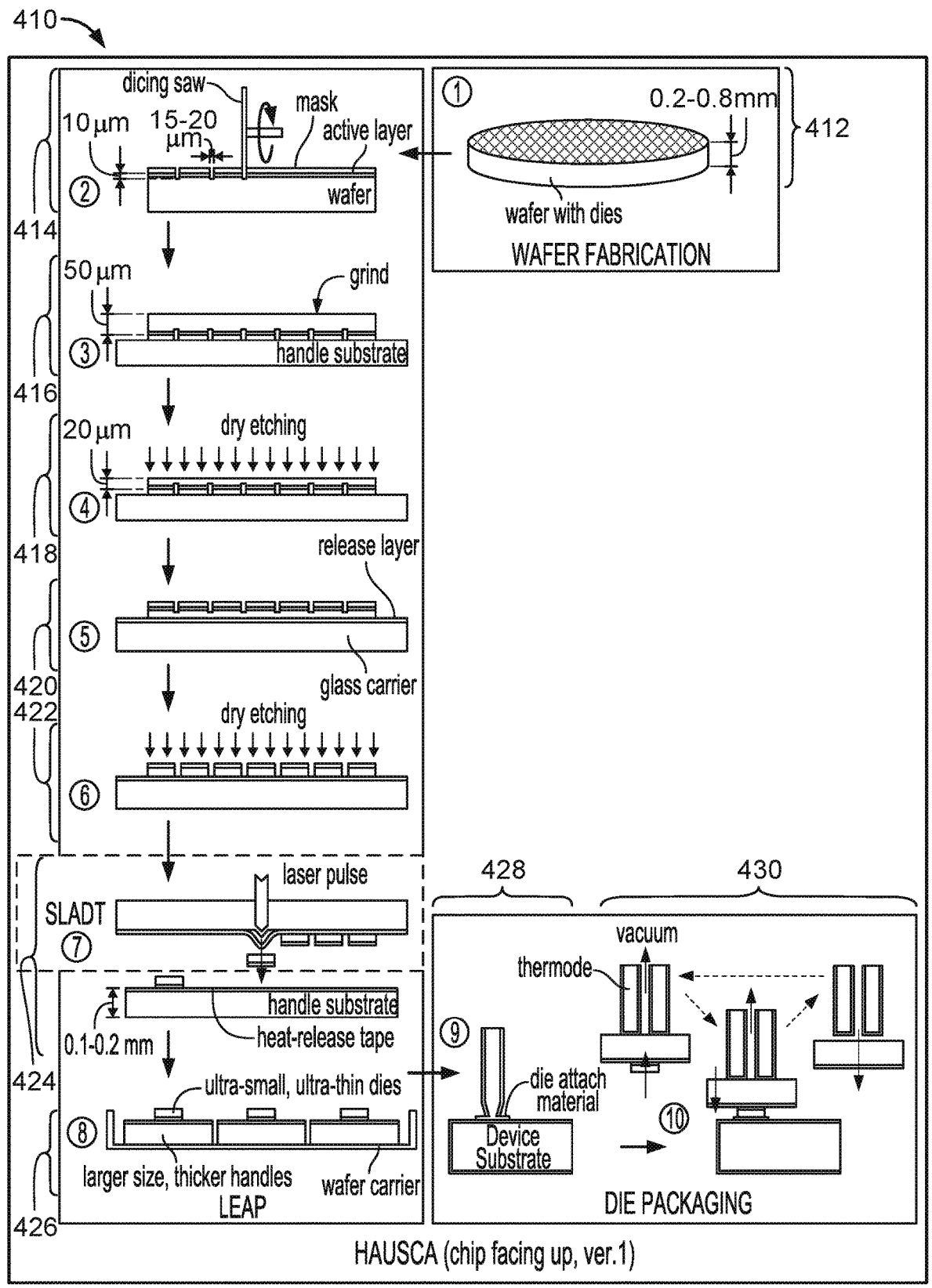
FIG. 16 is a schematic view showing an example of a discrete component packaging process using the handle assembly of FIG. 2. The active face of the ultra-small and ultra-thin bare discrete component faces away from the device substrate.

Handle assisted ultra-small chip assembly processes enable the assembly of discrete components that are too small (in a lateral dimension) to be moved using a pick-and-place approach. As shown in FIG. 16, a process 410 for packaging ultra-small and ultra-thin discrete components can generally include discrete component fabrication (412), wafer preparation (414-422), discrete component transfer (424-430), discrete component interconnection (430), and handle removal. Discrete component transfer in the process 410 includes discrete component transfer onto a handle substrate (424), handle substrate dicing (416426 attachment site preparation (428), and discrete component transfer onto the device substrate (430).

In general, wafers bearing large numbers of discrete components can be fabricated using known semiconductor techniques such as thin-film methods on a semiconductor material, for example, on a bulk silicon substrates or on layered silicon-insulator-silicon substrates (412).

Wafer preparation in the process 410 can include partial dicing (404) of the wafer using known semiconductor techniques. For example, the discrete components can be partially separated by dry or wet etching, by mechanical sawing (as shown in FIG. 16), or by laser micromachining. The wafer surface can be protected from damage with a masking film and/or a passivation layer. For example, a layer of photoresist, polymers, UV-curable polyimide, laminating films, or another suitable material can be applied and patterned using methods of photolithography or stencil/screen printing.

The masking film can be formed in accordance with known semiconductor techniques and materials such as by The depth of the removed material in the wafer streets can be selected based on the anticipated attachment process and the desired final thickness of the assembled discrete component. For example, in a discrete component face-up process used to form the handle assembly 100 as shown in FIG. 2, the depth of wafer streets is less than the desired final discrete component thickness, preferably greater than 1 μm and less than ½ of final discrete component thickness. The street width is selectable based on the method of dicing, for example, in view of the accuracy and precision of the dicing method.

Wafer preparation in the process 410 can include forming a thin wafer (416-418), for example, a thin wafer having a thickness of 50 μm or less, 40 μm or less, 30 μm or less, 20 μm or less, 10 μm or less, and 5 μm or less. The thickness of the wafer can be reduced or thinned based on the desired final discrete component dimensions through known semiconductor thinning techniques, for example mechanical grinding, chemical mechanical planarization (CMP), wet etching, atmospheric downstream plasma etching (ADP), dry chemical etching (DCE), vapor-phase etching, or any combination thereof, e.g., mechanical grinding followed by chemical-mechanical polishing.

In some instances, the wafer can be thinned to a thickness of approximately 50 μm using a mechanical grinding technique such as backgrinding. However, in general, as the wafer thickness decreases, the wafer becomes more susceptible to damage by a mechanical grinding due to the fragility of the thin wafer. To reduce the risk of damaging the wafer, a noncontact material removal process can be used to reduce the wafer thickness beyond what is achievable by the conventional mechanical grinding process. For example, to achieve a wafer thickness of 20 µm or less, a known noncontact material removal process, such as Reactive Ion Etching (ME), vapor phase etching, or any other appropriate processes can be used to produce the thin wafer.

Prior to and during the wafer thinning, the wafer can be attached to a temporary handling substrate (416-418). The temporary handling substrate releasably adheres to the wafer and is removable without damaging the wafer. For example, the temporary handling substrate can include a semiconductor tape such as a thermal-release tape (for example, ELEP Holder® by Nitto), or ultraviolet-release tape, or can include a wafer handling fixture that is configured to releasable connect to the wafer using a vacuum force, electrostatic forces, or other appropriate means of handling thin wafers. The thermal-release tape or ultraviolet-release tape is selected such that the tape adheres to the wafer, but is removable either by the application of heat or UV respectively. In some cases, the temporary handling substrate can be a laser transparent interim handle (420-422), for example, a glass interim handle using a dynamic releasing layer (which we call DRL), disclosed in PCT WO2012/033147, which is incorporated here by reference in its entirety.

As discussed above, the discrete components are formed by the separation of portions of the semiconductor material from the wafer, for example, along the streets formed in the wafer. As shown in FIG. 16, individual discrete components can be released from the wafer using a dry etching technique, for example, RIE is used (420-422). As described above, the parameters and plasma gas composition are selected such that the silicon in the streets is completely etched or removed (420) prior to etching or removing any other mask material (422). For example, a photoresist material and thickness can be selected, depending on the process parameters and plasma gas compositions if a RIE is used. In this case, the parameters and plasma gas composition are selected such that the silicon in the streets is completely etched or removed prior to etching or removing any other mask material. In some cases, process parameters include a 1:1 mix of SF6 and O2 as a plasma gas, pressure 13-14 Pa, power 135 W, and DC-bias 150 V. In this example, after the streets are opened, etching continues until the masking layer is completely removed from the discrete component surface.

Component transfer in the process 410, which includes releasing the individual discrete components from the handling substrate, will depend upon the handling substrate material and/or adhesive material used. As described above, the discrete components, for example, are mounted to a glass interim handle using a DRL layer. In this case, the discrete components can be released from the DRL using a laser transfer method (424) without contacting the ultra-thin discrete component. Other methods than can handle ultra-thin discrete components can be used to transfer the discrete components to the handle substrate.

In the example of FIG. 16, component transfer includes both a laser transfer method and pick-and-place. The discrete components are transferred from the DRL onto a handle substrate using a laser transfer method. The handle substrate provides a larger handle that is compatible in size with a pick-and-place approach to component transfer, thus enabling the handle assemblies to be transferred to the device substrate by a pick-and-place approach.

Figure 17:
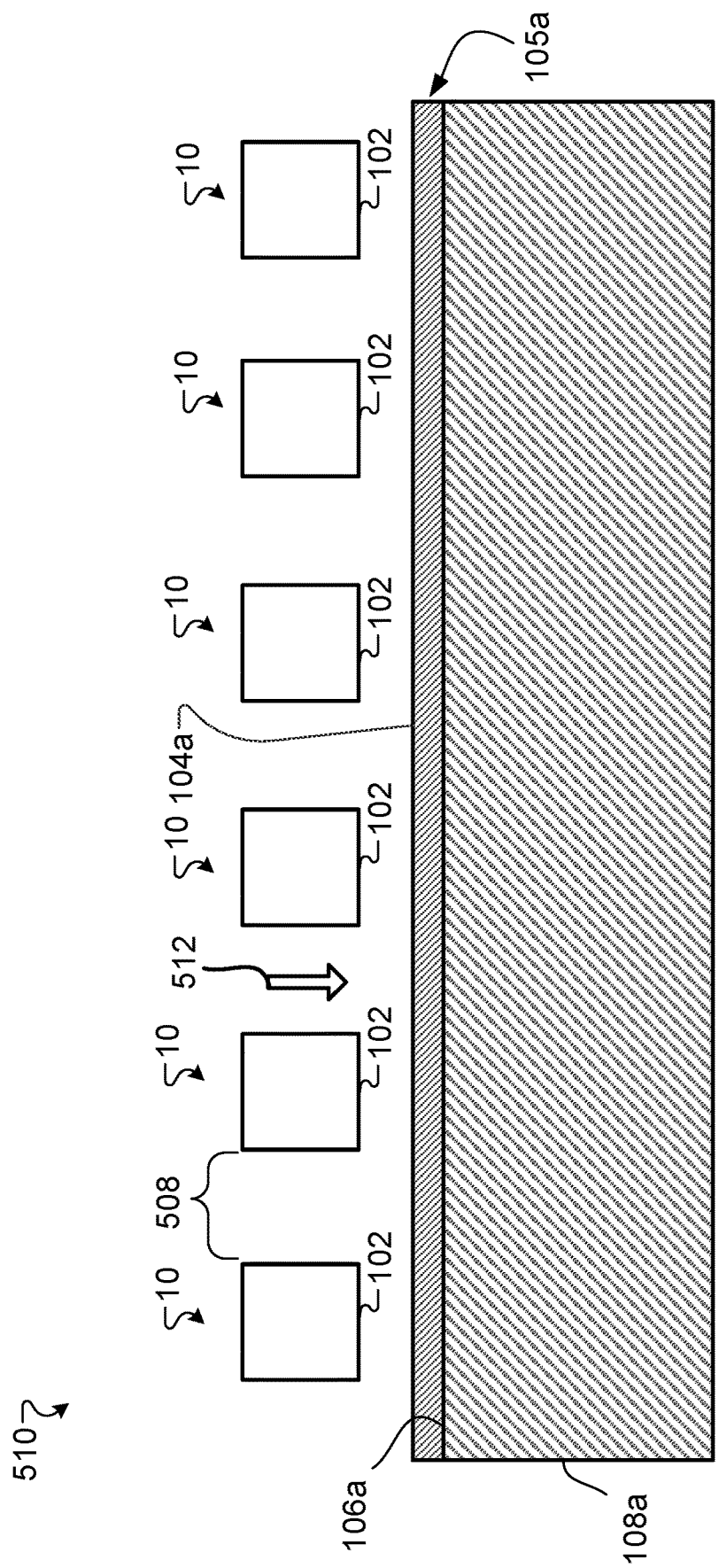
FIG. 17 is a schematic side view of a handle substrate prior to an attachment with a discrete component.

Referring to FIGS. 16 and 17, the discrete components can be released from the DRL layer and attached to a handle substrate by using a laser contactless technology (424) for ultra-thin chips assembly (which we call tmSLADT), disclosed in PCT W 02012142177, which is incorporated here by reference in its entirety. A distance 508 between each discrete component 10 is selectable based on the capabilities of the wafer dicing tool, for example, kerf and precision, dimensions of the ultra-small and ultra-thin discrete component 10, and dimensions of the handle 108. Suitable wafer dicing tools and/or methods include sawing, laser cutting, scribing, stealth dicing, and other known suitable methods. In some examples, the distance 502 is greater than 50 µm, for example, inclusive of and between 50 µm and 200 µm. Prior to forming the individual handle assemblies, for example, the handle assembly 100, one or more discrete components 10 are released onto an oversized handle substrate 108*a* to form an oversized handle assembly 510. In some cases, the oversized handle assembly is positioned below the glass interim handle from which the discrete components are released using the laser transfer method so that when the discrete components are released from the glass interim handle, each discrete component travels in a direction generally indicated by arrow 512 towards a handle release layer 105*a*, which is pre-coated, for example, using any suitable process such as lamination or spin coating, onto the handle substrate 108*a*. The properties of the handle substrate 108*a*, the handle release layer 105*a* including a second surface 106*a* and a first surface 104*a* are generally similar to those described with reference to the handle assembly 100, with the exception of the increased size of the handle substrate 108*a* and associated handle release layer 105*a*.

In some examples, the second surface 106*a* includes a pressure activated adhesive for attachment of the handle release layer 105*a* to the handle substrate 108*a* and the first surface 104*a* includes a thermal-release surface or a UV release surface, for example, a thermal-release layer or a UV-release layer for attaching the discrete component 10 to the handle release layer 105*a*. Thus, as the discrete component comes into contact with the handle release layer 105*a*, the discrete component is releasably attached to the handle substrate 108*a*, until, for example, an application of heat or UV light. In some examples, the handle release layer 105*a* is a single layer such that the first surface 104*a* and the second surface 106*a* are the same material, for example, a thermal release adhesive or a UV-release adhesive.

Component transfer in the process 410 includes transferring the handle assemblies 100 onto the device substrate. As described elsewhere, the methods described herein are used to attach ultra-thin and/or ultra-small bare discrete components to any device substrate used in integrated circuit packaging, such as a printed circuit board, plastic casing, ceramic substrate, flexible circuit, or other device substrates. Prior to attaching the discrete components to a device substrate, for example a device substrate 614, attachment means for the discrete component can be provided. For example, as shown in FIG. 18, a thermally cured non-conductive discrete component attachment material (such as Ablebond 8008 NC by Henkel) can be dispensed to form an adhesive surface 618 for the discrete component to attach to device substrate 614 (418).

Figure 18:
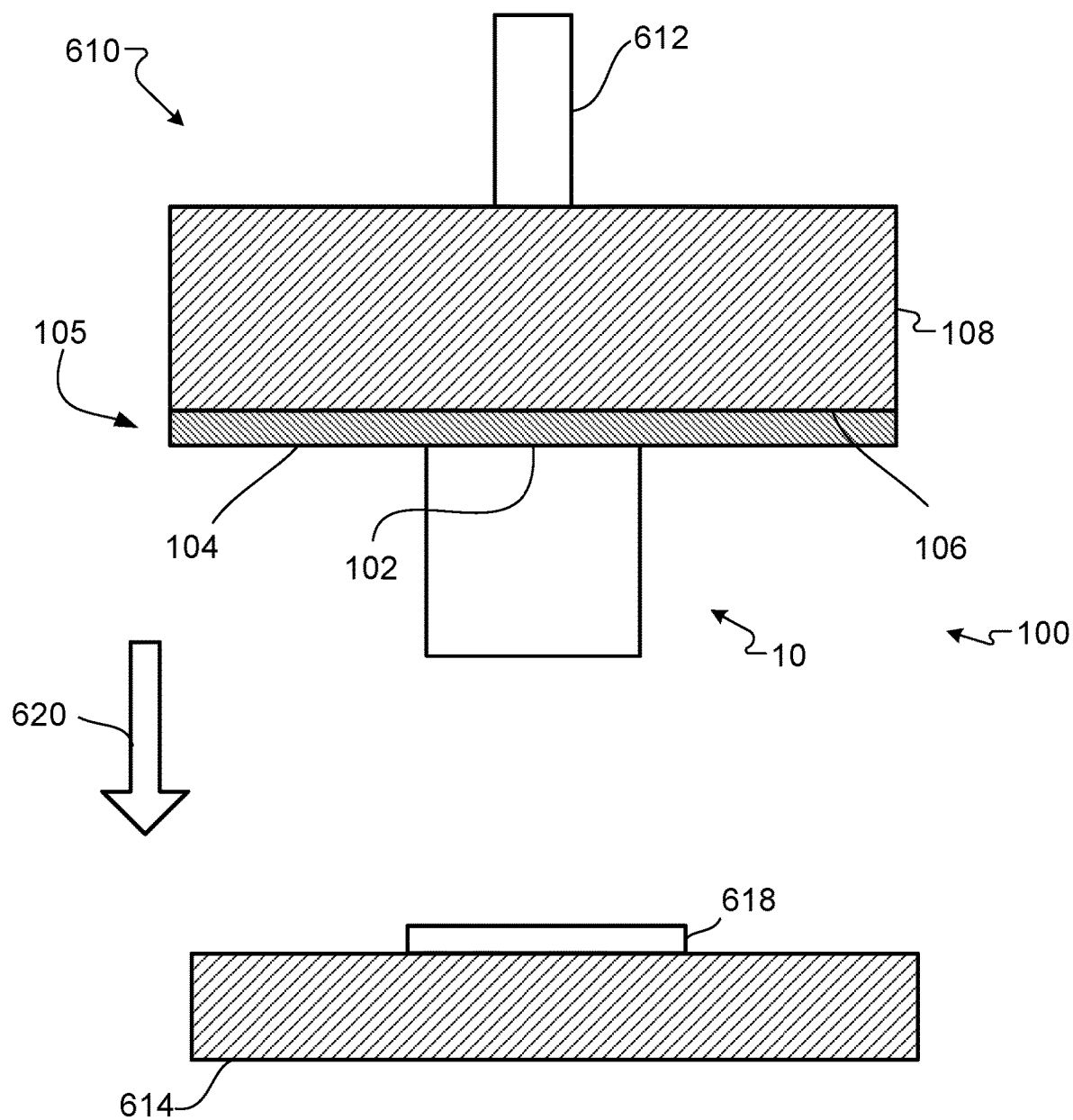
FIG. 18 is a schematic side view of the transfer assembly and device substrate assembly.

Referring to FIGS. 16 and 18, a transfer 610 to a device substrate can include, for example, a discrete component bonding tool 612, a handle assembly 100, and a device substrate 614. In some implementations, the discrete component bonding tool 612 attaches to the handle substrate 108 of the handle substrate assembly 100. The discrete component bonding tool 612 moves towards the device substrate and positions the discrete component 10 directly over the attachment surface 618 on the device substrate 614. The discrete component bonding tool 612 then moves the handle assembly 100 toward the device substrate, for example, in a direction generally show by an arrow 620, until the discrete component 10 contacts the adhesive surface 618. Once contact is made, discrete component interconnection and handle removal are performed. The discrete component bonding tool applies a force and temperature profile that can cure the adhesive on the adhesive surface 618. Because the discrete component 10 is attached to the handle substrate assembly through a thermal-release layer, temperature profile delivered to the adhesive on the adhesive surface 618 quickly or simultaneously weakens the adhesion between the discrete components 10 from the handle substrate 108. Any remaining bond strength between the handle substrate 108 and the discrete component 10 is insufficient to overcome the bond strength between the discrete component 10 and the device substrate 614. As a result, the discrete component 10 remains attached to the device surface as the discrete component bonding tool 612 and handle substrate move away from the device substrate. The handle substrate can subsequently be released from the discrete component bonding tool for disposal at a different location by applying a positive pressure through the discrete component bonding tool.

If the handle substrate includes a UV releasable layer (104) rather than a thermal release layer, the transfer means, for example, the discrete component bonding tool 612, can be facilitated with a device that is capable of emitting UV light. As with the thermal-release discrete component bonding tool, the UV-release discrete component bonding tool can emit UV light with sufficient intensity to de-bond the discrete component from the handle. In this case, an additional heat source is required to bond the discrete component to the device substrate. Such a heat source can be integrated with the work table that holds the device substrate.

In certain implementations, the discrete component can be bonded to the handle substrate by a UV releasable layer while the adhesive on the device substrate can be a UV-cured adhesive material. In this case, emitting a UV light of a sufficient intensity, based on the chosen adhesives, can weaken the bond between the discrete component and the handle substrate and bond the discrete component to the adhesive on the device substrate.

In some examples, various combinations of thermally sensitive or UV sensitive adhesives are used such that the bond between the discrete component and the handle substrate weakens while the bond between the discrete component and the device substrate strengthens.

In some cases, heat or UV light are also or alternatively applied through the device substrate to cure the adhesive on the device substrate.

In some implementations, transferring the discrete component to a device substrate can include the steps as follows.

Figure 19:
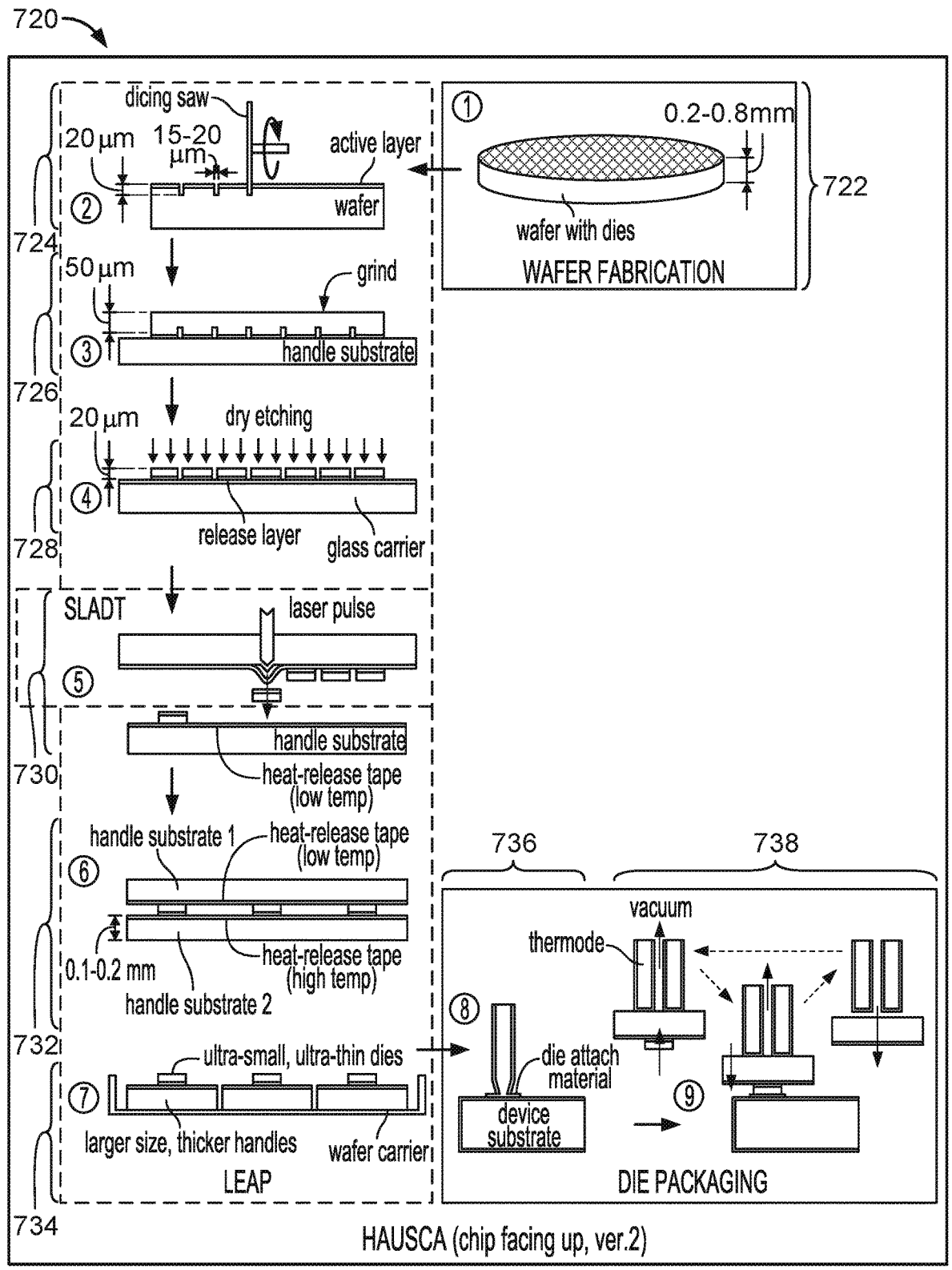
FIG. 19 is a schematic view showing another example of a discrete component packaging process using the handle assembly of FIG. 2. The active face of the ultra-small and ultra-thin bare discrete component faces away from the device substrate.

As shown in FIG. 19, a process 720 for packaging ultra-small and/or ultra-thin discrete components in a face up configuration can generally include obtaining or fabricating a wafer (722), partially dicing the wafer (724), thinning the wafer (726), separating the discrete components from the wafer (728), transfer the discrete components from the wafer to an interim handle substrate (730), transfer the discrete components from the interim handle substrate to the handle substrate (732), bonding the discrete components to the handle substrate while weakening the bond between the interim handle substrate and the discrete components (732), dividing the handle substrate into a plurality of individual handle substrates each including a discrete component (734), preparing the device substrate for attachment with the discrete component (736), picking up the handle assembly using a discrete component bonding tool and positioning the handle assembly over the device substrate to align the discrete component with the attachment adhesive on the device substrate (738), moving the discrete component into contact with the attachment adhesive on the device substrate (738), emitting energy such that the bond between the discrete component and the handle substrate weakens while the bond between the discrete component and the device substrate strengthens (738), moving the discrete component bonding tool away from the device substrate while the discrete component remains bonded to the device substrate (738), and releasing the handle substrate from the discrete component bonding tool (739).

In general, wafers bearing large numbers of discrete components can be fabricated using known semiconductor techniques such as thin-film methods on a semiconductor material, for example, on bulk silicon substrates or on layered silicon-insulator-silicon substrates (722).

During dicing (724) the wafers can undergo partial dicing using known semiconductor techniques. For example, the discrete components can be partially separated by dry or wet etching, by mechanical sawing (as shown in FIG. 19), or by laser cutting. In certain cases, the wafer is diced to form street depth equal or slightly greater than the final discrete component thickness.

In some implementations, wafer thinning, discrete component separation are generally similar to the wafer thinning, and discrete component separation described with reference to the process 410 except for any discussion related to a masking film. For example, the process 720 omits a masking film so the dry etching (728) is simply carried out until the streets are unobstructed.

Figure 20:
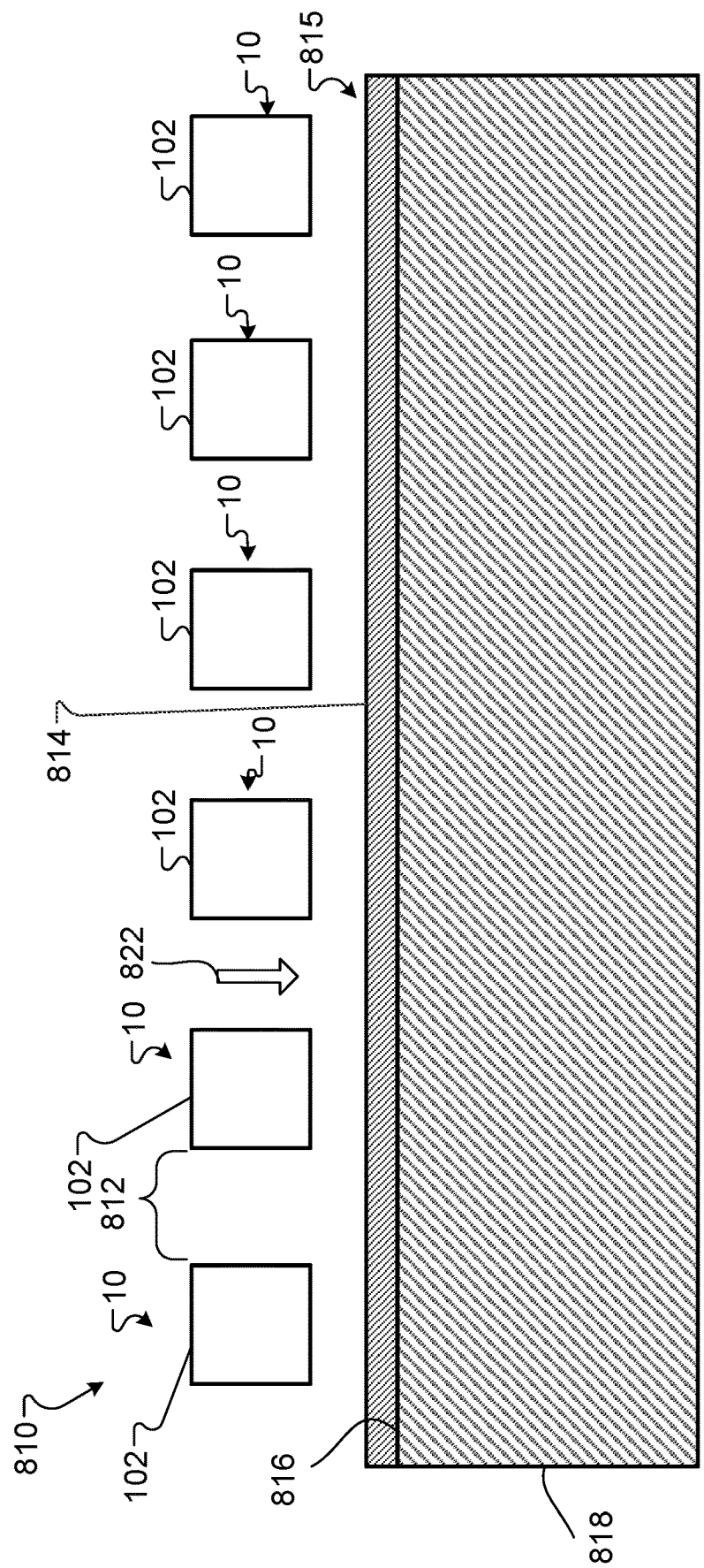
FIG. 20 is a schematic side view of a handle substrate prior to an attachment with a discrete component.

While the process of transferring the discrete components from the wafer (730) is generally similar to the process described with reference to the process 410, here discrete components are first transferred to an interim substrate handle 818 along a direction 822, with each discrete component 10 separated by a distance 812. Referring to FIG. 20, an oversized handle assembly 810 is generally similar to the oversized handle assembly 510, with the exception of the location of the active discrete component face 102 and the type of handle release layer 815. Here, the active discrete component face is oriented away from the interim substrate 818. Further, the interim substrate 818 is coated with a low-temperature adhesive heat-release tape so that when the tape is exposed to a certain temperature, the tape loses its adhesive properties. For example, REVALPHA 319Y-4L by Nitto® has a release temperature of 90° C.

Figure 21:
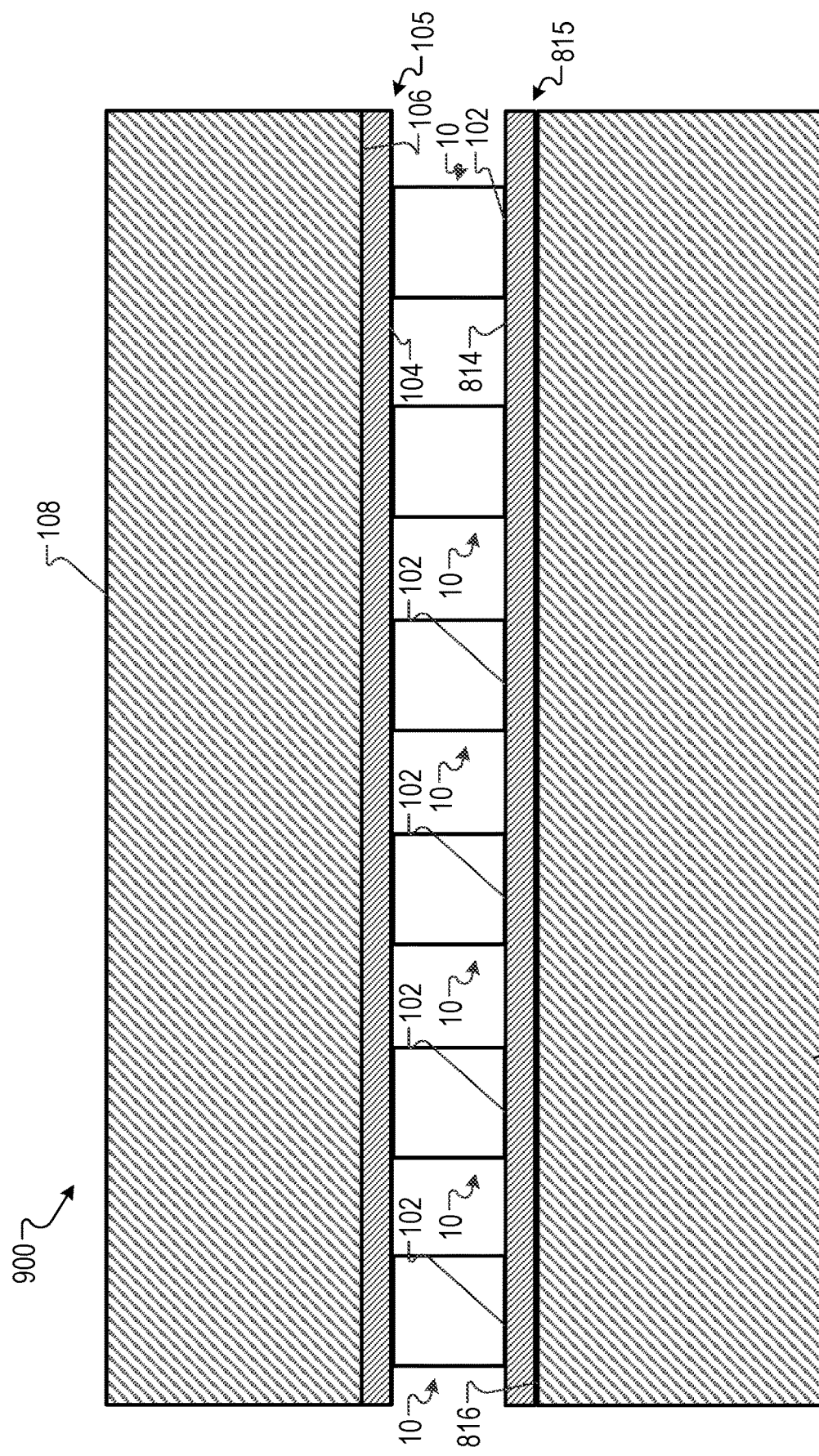
FIG. 21 is a schematic side view of a multi-handle substrate assembly.

Referring to FIG. 21, to transfer the discrete components from the interim handle substrate 818 to the handle substrate 108, the interim handle substrate 818 is placed over or stacked on the handle substrate 108. In this case, the handle substrate 108 includes handle release layer 105 including a layer 104 that heat sensitive with a higher release temperature, for example, REVALPHA 319Y-4H by Nitto® with a release temperature of 150° C., than the release temperature of the interim handle substrate. To weaken the bond between the discrete components and the interim handle substrate, the stack is heated to a temperature higher than the release temperature of the low-temperature tape but lower than the release temperature of the high-temperature tape. The conditions result in the interim handle substrate 818 losing adhesion. As such, the interim handle substrate is freely removable. In some cases, the interim substrate assembly is also reusable.

Although we mention heating as a mode of causing the interim handle substrate to lose adhesion, a variety of techniques can be used for that purpose.

For example, mechanical techniques can be used. In those approaches, the handle release layer could be made to lose adhesion by applying a stimulus to cause a change in the surface morphology of the handle release layer. In some implementations, the stimulus could be heat or UV light and the corresponding change in the surface morphology of the handle release layer could include formation of small blisters on the surface. Such a change in the surface morphology from smooth to blistered will cause a transition of adhesion from sufficiently adhesive to very rough with very low adhesion. In some cases, the material used for the handle release layer can be chosen to respond to such a stimulus by changing its surface morphology.

In some examples, the reduction in adhesion is achieved by a phase transition in which the handle release layer loses adhesion by a physical change of state caused by applying a stimulus. The phase transition can be from a solid phase to a liquid phase (for example, melting) or from a solid phase to a gas phase (sublimation) or a combination of them. The stimulus could be light, heat, pressure, or a combination of any two or more of them.

In some instances, the loss of adhesion could be caused by a chemical process. For example, chemically triggered loss of adhesion could be based on a change in the chemical structure or composition of the handle release layer or components of it. In some cases the handle release layer or components of it can be ones that change their chemical structure when exposed to the stimulus. In some examples the materials can be ones that change their chemical composition (e.g., degrade) when the stimulus is applied. Such materials could include: i) materials that undergo thermal decomposition, or thermolysis, which is a chemical decomposition caused by heat, and ii) materials that undergo photodegradation, which is degradation caused by the absorption of light. The stimulus for the chemical process could be light or heat or both.

Thus, in some examples, the release mechanism does not involve melting of the handle release layer material. Release without melting of the handle layer allows the handle substrate to be removed by a vertical motion rather than a lateral sliding motion. Vertical removal of the handle substrate can be advantageous, e.g., when the handle substrate is removed by a conventional die bonder. Removal of the handle substrate by a lateral sliding motion can be advantageous in environments such as roll-to-roll assembly lines in which the handle substrate forms part of a continuous web. Release without melting of the handle release layer material can help avoid leaving a residue on the surface of the discrete component after handle removal.

In some implementations, the handle release layer or the process of reducing its adhesion or both can be selected so that the loss of adhesion is permanent or so that the restoration of adhesion is prevented, inhibited, or delayed. This approach has the advantage of reducing or eliminating a time constraint on when the handle must be removed. For instance, such materials may undergo a restoration of adhesion within about 10 seconds, 30 seconds, one minute, 5 minutes, 10 minutes, or another time following reduction of adhesion. Melting a wax, for example, to reduce the adhesion of the handle release layer will leave very little time for removing the handle after the heat that causes the melting of the wax is reduced, because the wax will re-solidify relatively quickly. Imposing a requirement that the handle must be quickly removed before the material of the handle release layer solidifies imposes an undesirable constraint on the manufacturing process. Example materials in which the loss of adhesion is permanent or the restoration of adhesion is prevented, inhibited, or delayed include materials that degrade, decompose, or sublimate; or adhesive tapes such as REVALPHA® double-coated thermal release tape by Nitto®.

In some cases, the material of the handle release layer or the process of releasing it or both can be selected so that no residue remains on the discrete component after the release. For instance, materials that leave no residue on the discrete component after the release can include materials that change surface morphology (e.g., such as a REVALPHA® double-coated thermal release tape by Nitto®) or materials that sublimate.

The discrete component packaging process including preparing the device substrate (736) and transferring the discrete component to the device substrate (738) is generally similar to the discrete component packaging process described with respect to FIG. 16.

Figure 22:
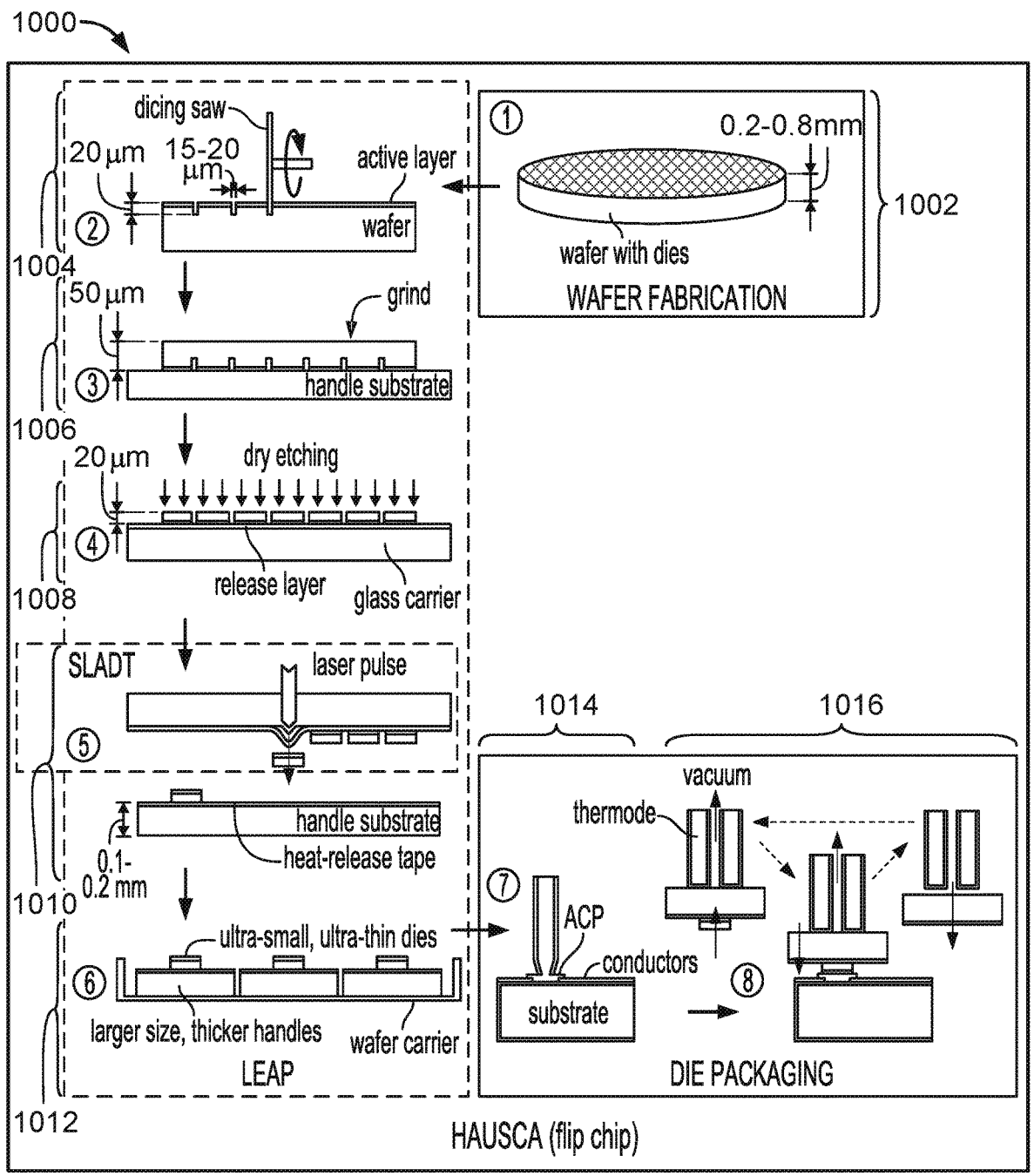
FIG. 22 is a schematic view of showing an example of discrete component packaging process using the handle assembly of FIG. 3. The active face of the ultra-small and ultra-thin bare discrete component faces toward the device substrate.

As shown in FIG. 22, a process 1000 for packaging ultra-small and ultra-thin discrete components in a flip-chip configuration can generally include obtaining or fabricating a wafer (1002), partially dicing the wafer (1004), thinning the wafer (1006), separating the discrete components from the wafer (1008), transfer the discrete components to a handle substrate (1010) dividing the handle substrate into a plurality of individual handle substrates each including a discrete component (1012), preparing the device substrate for attachment with the discrete component (1014), picking up the handle assembly using a discrete component bonding tool and positioning the handle assembly over the device substrate to align the discrete component with the attachment adhesive on the device substrate (1016), moving the discrete component into contact with the attachment adhesive on the device substrate (1016), emitting energy such that the bond between the discrete component and the handle substrate weakens while the bond between the discrete component and the device substrate strengthens, (1016) moving the discrete component bonding tool away from the device substrate while the discrete component remains bonded to the device substrate, and releasing the handle substrate from the discrete component bonding tool (1016).

In general, wafers having bumped out discrete components, as required by a flip-chip configuration, are generally known. Common methods for wafer bumping include stud bumping, electroless nickel-gold plating, solder balls, solder paste printing, solder electroplating, etc. While an initial wafer having a low profile electroless nickel-gold plating is compatible with the process described here, the creation of bumps can occur after transferring the discrete components from the glass substrate (1010) and before placing the discrete components on the handle substrate (1012).

Figure 23:
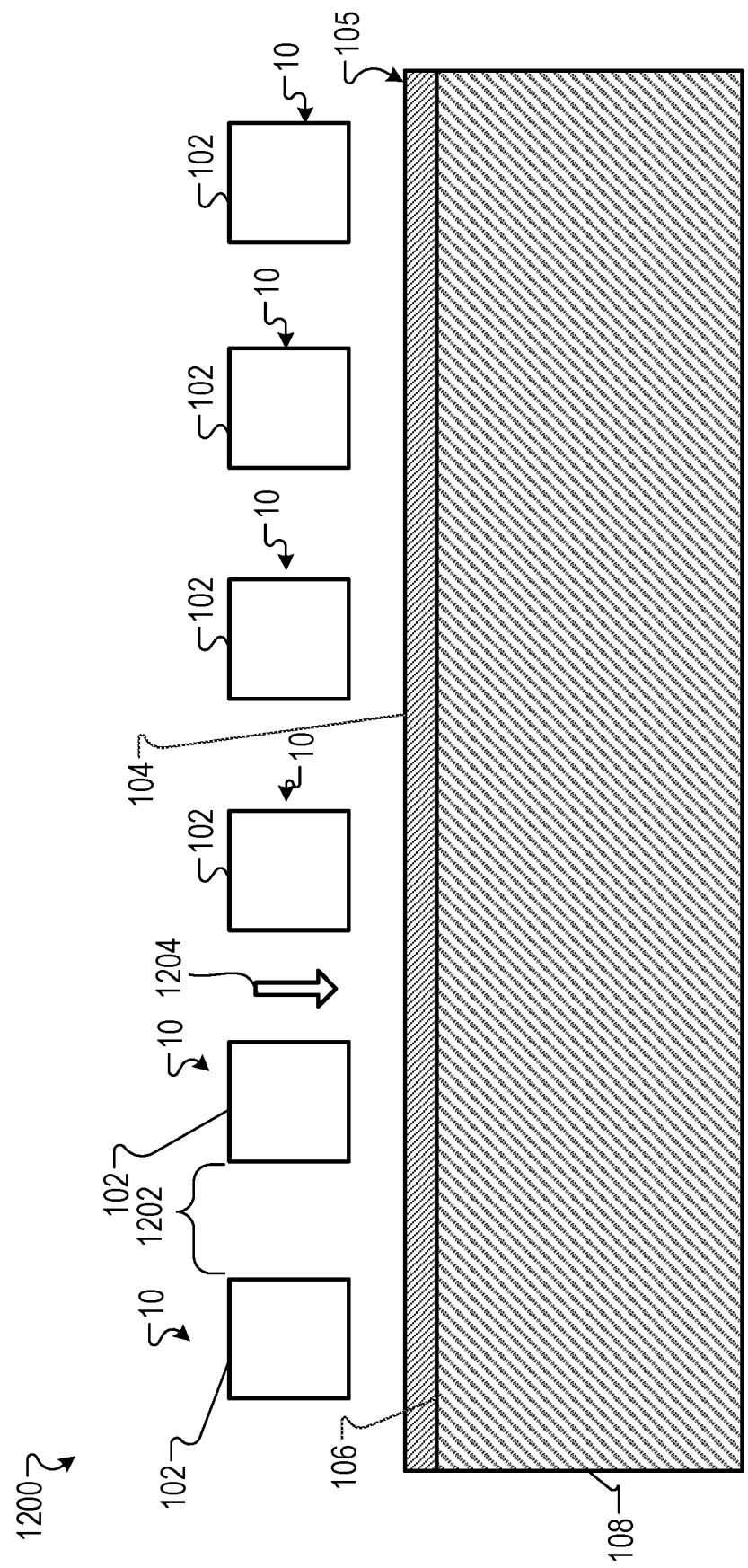
FIG. 23 is a schematic side view of a transfer assembly and device substrate assembly.

The wafer dicing process (1004), the wafer thinning process (1006), the discrete component separation (1008), the discrete component transfer (1010), forming individual handle substrates (1012), and discrete component bonding (1016) are generally similar to other methods discussed above. For example, the discrete components 10 are placed on the handle substrate 108, as shown in FIGS. 17 and 23, in the same manner but for the orientation of the active face 102 on the discrete component 10. Here, each of the discrete components 10 are separated by a distance 1202 and travel along a direction 1204.

Referring to FIG. 22-23, the discrete component 10 is attached to the device substrate 618 using electrically conductive materials 1106 and an adhesive material 1108.

The types of adhesive materials and application methods depend on the method selected to connect the discrete component electrically to the conductor traces on the device substrate. For example, conductive adhesives in a liquid form (e.g., anisotropic conductive adhesive, ACP, for example, type 115-29 by Creative Materials) or other commonly used methods and materials, for example, anisotropic conductive films and pastes, isotropic conductive films and pastes, and solders can be used. The discrete component bonding generally includes picking up the handle assembly using a discrete component bonding tool and positioning the handle assembly over the device substrate to align the discrete component with the attachment adhesive on the device substrate (1016), moving the discrete component into contact with the attachment adhesive on the device substrate (1016), emitting energy such that the bond between the discrete component and the handle substrate weakens while the bond between the discrete component and the device substrate strengthens, (1016) moving the discrete component bonding tool away from the device substrate while the discrete component remains bonded to the device substrate, and releasing the handle substrate from the discrete component bonding tool (1016).

In certain implementations, if adhesion methods beyond ACP bonding are used, it is desirable to customize the site preparation mechanisms and/or process (1014) to accommodate for the new material.

Handle Assisted Packaging Process

Figure 25:
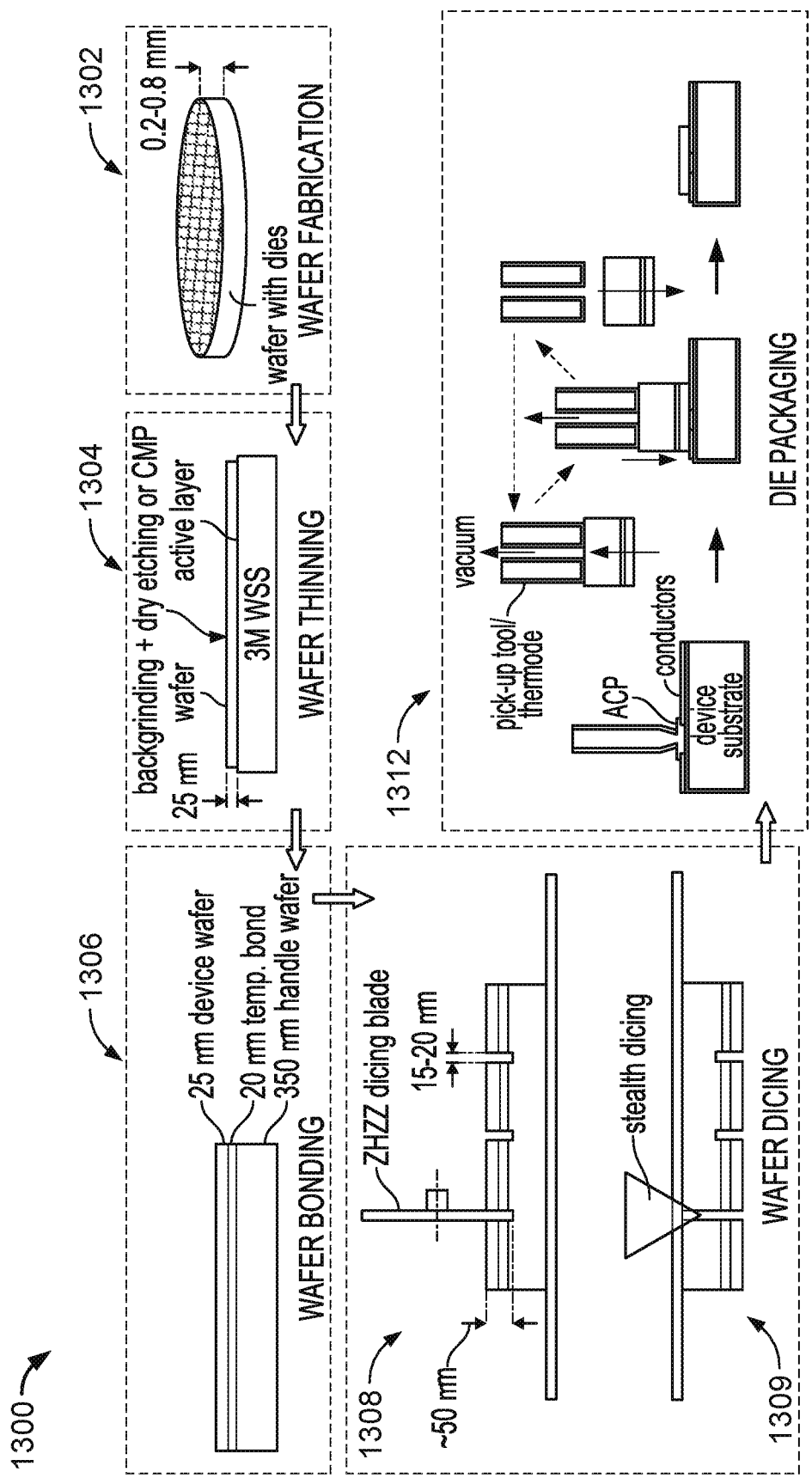
FIG. 25 is a schematic view showing an example of a discrete component packaging process using the handle assembly of FIG. 4. The active face of the ultra-thin bare discrete component faces toward the device substrate.

As shown in FIG. 25, a handle assisted packaging process 1300 enables packaging of an ultra-thin discrete component in a flip-chip configuration using a handle substrate. A wafer bearing large numbers of discrete components is obtained or fabricated (1302).

Wafer preparation in the process 1300 includes wafer thinning, handle attachment, and dicing. The wafer is thinned, e.g., to a thickness of less than 50 such as a thickness of about 25 μm. For instance, the wafer can be thinned using a mechanical thinning process or a mechanical thinning process followed by a non-contact thinning process (1304). The ultra-thin wafer is mounted to a handle substrate (1306). In the example of FIG. 25, the back side of the wafer is bonded to a 350 μm thick handle substrate via a 20 μm thick handle release layer, leaving the active layer of the wafer exposed. In some examples, the active layer of the wafer can be bonded to the handle substrate, leaving the back side of the wafer exposed.

The assembly of wafer and handle substrate is adhered to a dicing tape and diced into individual, discrete components. For example, the assembly of wafer and handle substrate can be diced by mechanical sawing (1308) followed by laser stealth dicing (1309) or both to form discrete components attached to a diced portion of the handle substrate. We sometimes refer to a discrete component on a diced portion of the handle substrate as a handle assembly.

Generally, the wafer formation (1302) and wafer thinning by contact or non-contact material removal processes (1304) are generally similar to process described elsewhere. However, the singulation of the individual discrete component and sizing of the handle substrate (1308, 1309) are somewhat streamlined in certain cases. For example, referring to FIG. 26, the handle release layer 305 including a second surface 306 and a first surface 304 is applied along handle substrate with a thermal or UV-release layer exposed to the backside of the ultra-thin wafer and the pressure sensitive layer attached to the handle substrate (1306). In this case, the length and width of the handle substrate 308 can be equal to the dimensions of the ultra-thin discrete component 30. As such, the handle substrate and wafer can be simultaneously diced into the individual handle assemblies 300 (1308).

Figure 26:
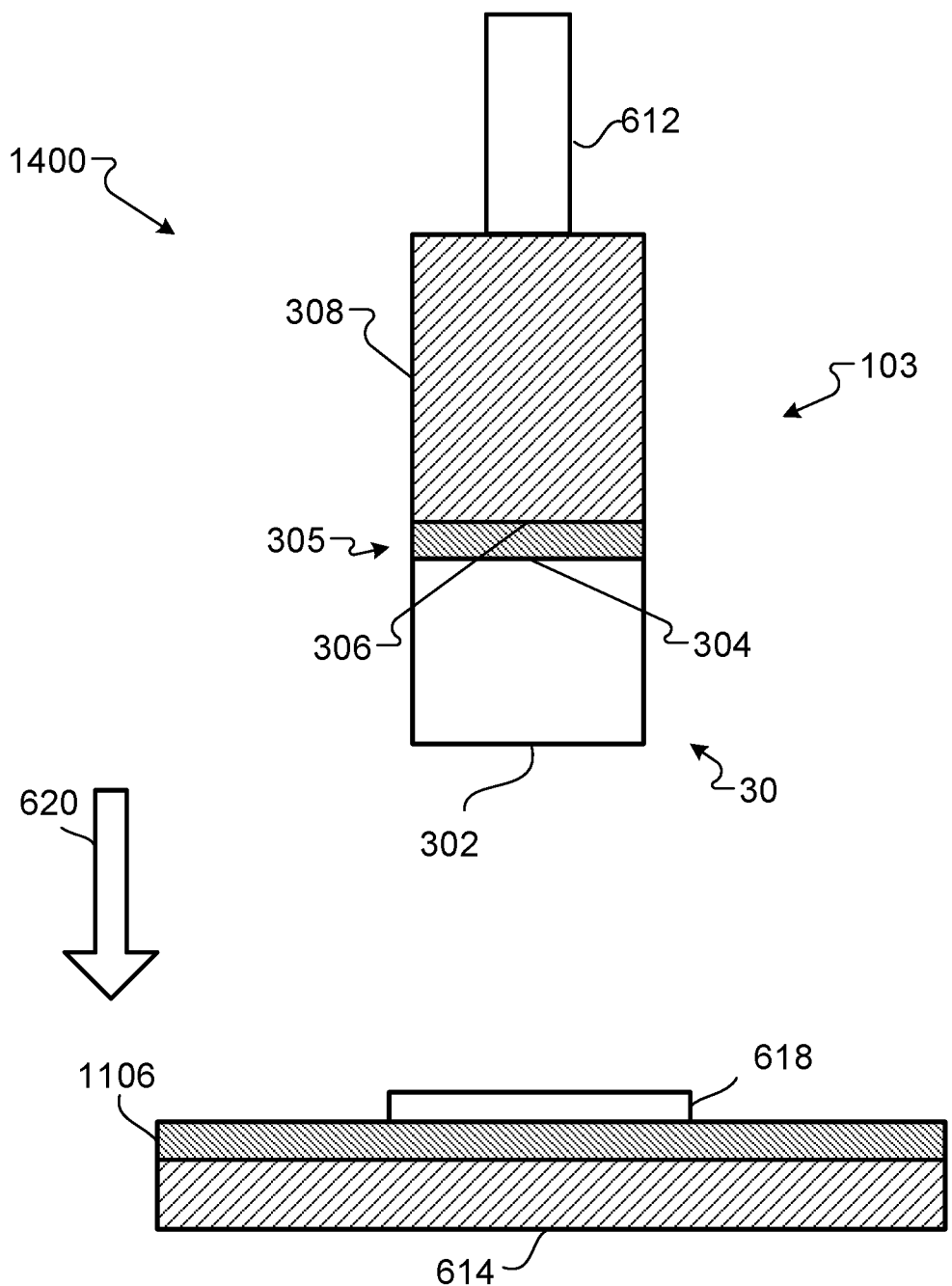
FIG. 26 is a schematic side view of a transfer assembly and device substrate assembly.

Component transfer in the process 1300 includes preparing the device substrate for attachment of the discrete component (1310) and transferring the handle assemblies using a pick-and-place approach onto the prepared device substrate (1312). Referring also to FIG. 26, in a pick-and-place approach, the handle assembly 300 is picked up using a discrete component bonding tool 612 and positioned over the device substrate 614 to align the discrete component 30 with the attachment adhesive 618 on the device substrate 614. The discrete component is moved into contact with the attachment adhesive 618 on the device substrate 614.

Component interconnection and handle removal in the process 1300 include emitting energy such that the bond between the discrete component 30 and the handle substrate 618 weakens while the bond between the discrete component 30 and the device substrate 614 strengthens (1312). The discrete component bonding tool 612 is moved away from the device substrate 614 while the discrete component 30 remains bonded to the device substrate 614. The handle substrate 618 is released from the discrete component bonding tool 612 (1312).

As with other flip-chip configurations, the discrete component is attached to the device substrate 618 using electrically conductive materials 1106.

Laser Enabled Packaging Process

Figure 27:
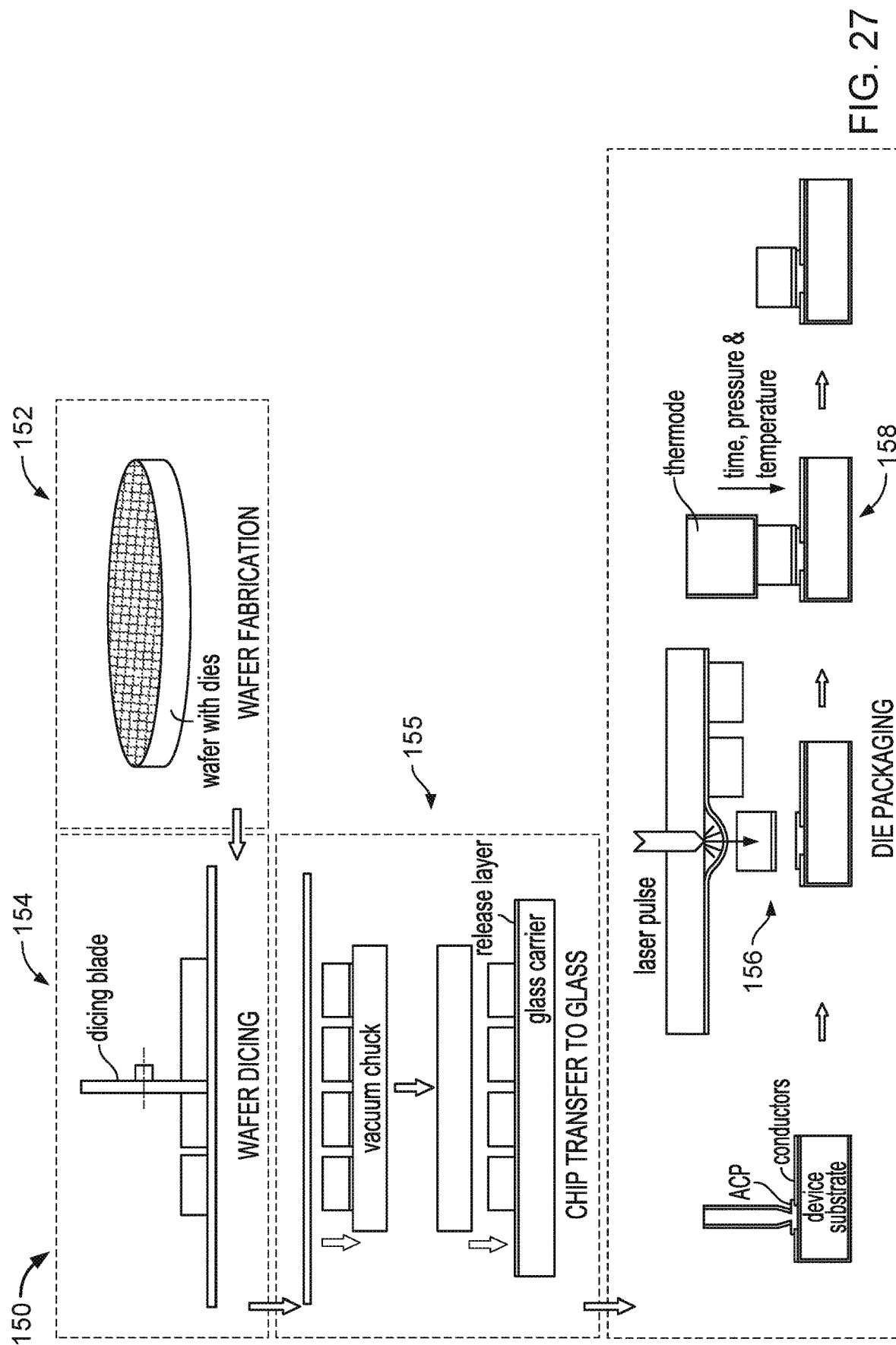
FIG. 27-30 are flow diagrams of processes.

Referring to FIG. 27, a laser enabled packaging process 150 enables packaging of ultra-thin, ultra-small discrete components without use of a handle substrate. A wafer bearing large numbers of discrete components is fabricated or obtained (152).

Wafer processing in process 150 can optionally include wafer thinning (not shown). The wafer (which may be thinned) is adhered to a dicing tape and diced into individual, discrete components (154) using approaches such as those described above. In some examples, the process 150 is carried out within thinning the wafer.

Wafer transfer (155) in process 150 can include transferring the diced discrete components from the dicing tape to a transparent carrier, such as a glass carrier, e.g., in a vacuum assisted transfer. This transfer enables process 150 to be used for flip-chip assembly. Other approaches to dicing and wafer transfer can also be used in process 150.

Component transfer in process 150 includes releasing the discrete components from the transparent carrier (156) using the laser assisted contactless transfer method described above. The discrete components are transferred onto a device substrate having attachment element formed thereon. Discrete component interconnection (158) is performed by applying pressure, temperature, or ultraviolet light as described above. No handle removal is necessary because process 150 does not make use of a handle substrate.

The process 150 can have advantages. For instance, the use of the laser assisted contactless transfer method to perform component transfer allows the process to be applied to the transfer of a wide range of sizes and types of components, such as components that are too small for a pick-and-place approach or components that are unsuited to be mounted on a handle substrate. The process 150 can operate with a higher throughput than other processes that are not laser assisted, because the laser can be electronically scanned to rapidly transfer successive discrete components with little or no realignment of the transparent carrier.

Direct Laser Enabled Packaging Process

Figure 28:
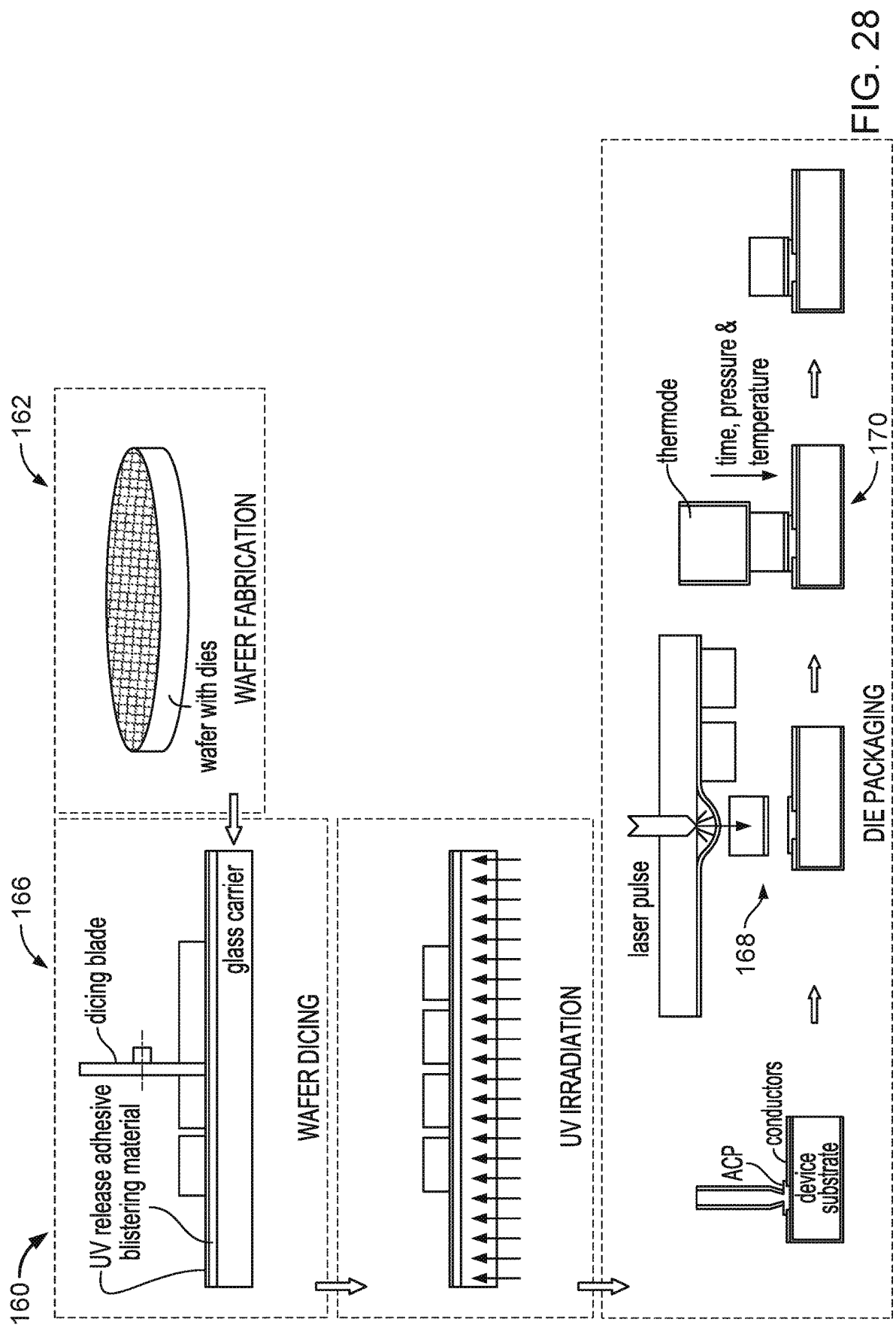

Referring to FIG. 28, a laser enabled packaging process (160) enables packaging of ultra-small discrete components without use of a handle substrate. A wafer bearing large numbers of discrete components is fabricated or obtained (162).

Wafer processing in process 160 can optionally include wafer thinning (not shown). The wafer (which may be thinned) is adhered to a transparent carrier, such as a glass carrier, having a dynamic releasing layer disposed thereon, and diced (166) into individual, discrete components while adhered to the transparent carrier using approaches such as those described above. Although the wafer is shown as adhered to a UV release adhesive material on the transparent carrier, the wafer can also be adhered to dynamic releasing layers without UV release material.

Because the assembly of wafer and handle substrate is directed adhered to the transparent carrier for dicing, rather than to a dicing tape, the wafer transfer process can be bypassed. Other approaches to wafer transfer and dicing can also be used in process 160.

Component transfer in process 160 includes releasing the discrete components from the transparent carrier (168) using the laser assisted contactless transfer method described above. The discrete components are transferred onto a device substrate having attachment element formed thereon. Discrete component interconnection (170) is performed by applying pressure, temperature, or ultraviolet light as described above. No handle removal is necessary because process 160 does not make use of a handle substrate.

In the process 160, the use of the laser assisted contactless transfer method to perform component transfer allows the process to be applied to the transfer of a wide range of sizes and types of components, such as components that are too small for a pick-and-place approach or components that are unsuited to be mounted on a handle substrate.

The process 160 can have advantages. For instance, the process 160 has a simplified process flow relative to other laser assisted processes by the elimination of the diced wafer transfer step. The process yield can be improved because there is no opportunity for die loss during transfer of diced discrete components. In addition, the possibility of die shifting or rotating with respect to their original positions in the wafer during transfer of the diced discrete components is eliminated because the wafer is transferred as an intact unit.

Laser Enabled, Handle Assisted Packaging Process

Figure 29:
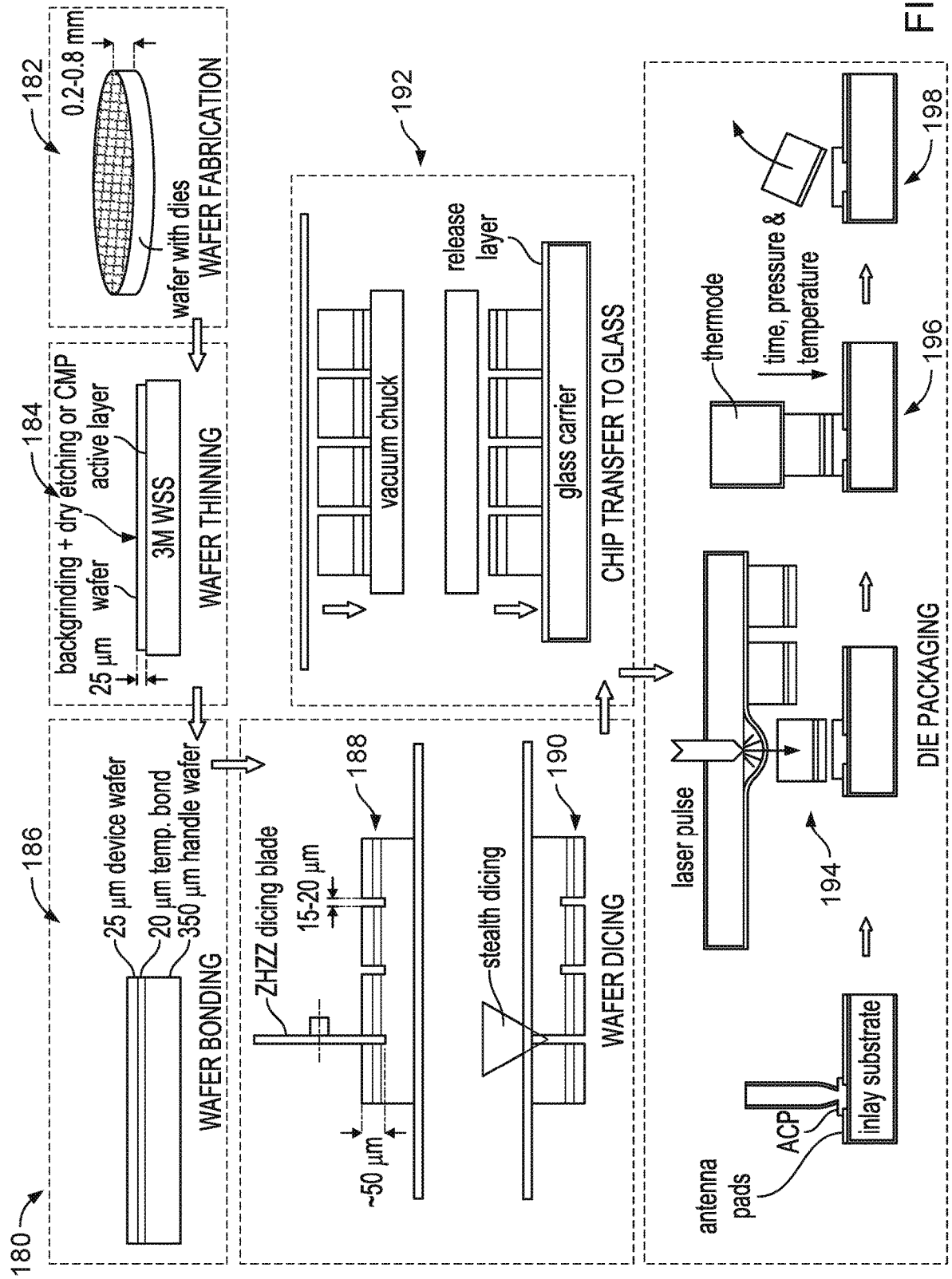

Referring to FIG. 29, a laser enabled, handle assisted packaging process 180 enables packaging of ultra-thin discrete components using a handle substrate. A wafer bearing large numbers of discrete components is fabricated or obtained (182).

Wafer preparation in process 180 includes wafer thinning, handle attachment, and dicing. The wafer is thinned (184) to a thickness of less than 50 μm using one or more of the wafer thinning approaches described above. In the example of FIG. 29, the wafer is thinned to a thickness of about 25 μm using a combination of backgrinding, dry etching or chemical mechanical polishing, and the use of a support substrate. A handle substrate is attached to the thinned wafer (186). In the example of FIG. 29, the back side of the wafer is bonded to a 350 μm thick handle substrate via a 20 μm thick handle release layer, leaving the active layer of the wafer exposed. In some examples, the active layer of the wafer can be bonded to the handle substrate, leaving the back side of the wafer exposed. The assembly of wafer and handle substrate is adhered to a dicing tape and diced into individual, discrete components. For example, the assembly of wafer and handle substrate can be diced directly by mechanical sawing (188) and indirectly by laser micromachining (sometimes referred to as laser stealth dicing) (190) to form discrete components attached to a diced portion of the handle substrate (which we collectively call a handle assembly). Other approaches to dicing the assembly of wafer and handle substrate can also be used, such as those described above.

Wafer transfer in process 180 includes transferring the handle assemblies from the dicing tape to a transparent carrier (192), such as a glass carrier. The handle assemblies adhered to the dicing tape are removed from the dicing tape, for instance, by suction provided from a vacuum chuck. A transparent carrier, such as a glass carrier, having a dynamic releasing layer disposed thereon is brought into contact with the handle assemblies suctioned onto the vacuum chuck, causing the handle assemblies to be transferred to the carrier. The suction force is removed and the vacuum chuck is taken away. Other approaches to dicing and wafer transfer can also be used in process 180.

Component transfer in process 180 includes releasing the handle assemblies from the transparent carrier (194), e.g., using the laser assisted contactless transfer method described above. The handle assemblies are transferred onto a device substrate having attachment element formed thereon. Discrete component interconnection (196) and handle removal (198) are performed by applying pressure, temperature, or ultraviolet light as described above.

In the process 180, the use of the laser assisted contactless transfer method to perform component transfer allows the process to be applied to the transfer of a wide range of sizes and types of components, such as components that are too small or too thin for a pick-and-place approach.

In the process 180, the laser assisted contactless transfer method is used to transfer the handle assemblies rather than only the discrete components. Because the mass of the item being transferred is correlated to the precision of the transfer in the laser assisted contactless transfer method, the transfer of handle assemblies rather than only discrete components enables the handle assemblies to be more accurately positioned on the device substrate.

In the process 180, discrete component interconnection is performed while the discrete components are still attached to the associated portion of the handle substrate. The thick assembly of a discrete component and a handle substrate is less prone to cracking during curing of the attachment element on the device substrate (e.g., during curing of a conductive epoxy) during discrete component interconnection than is a discrete component that is not mounted on a handle substrate.

The process 180 can have advantages. For instance, the accuracy of component transfer can be improved. In addition, the process 180 can be used to transfer ultra-thin chips that can otherwise be difficult to manipulate.

Direct Laser Enabled, Handle Assisted Packaging Process

Figure 30:
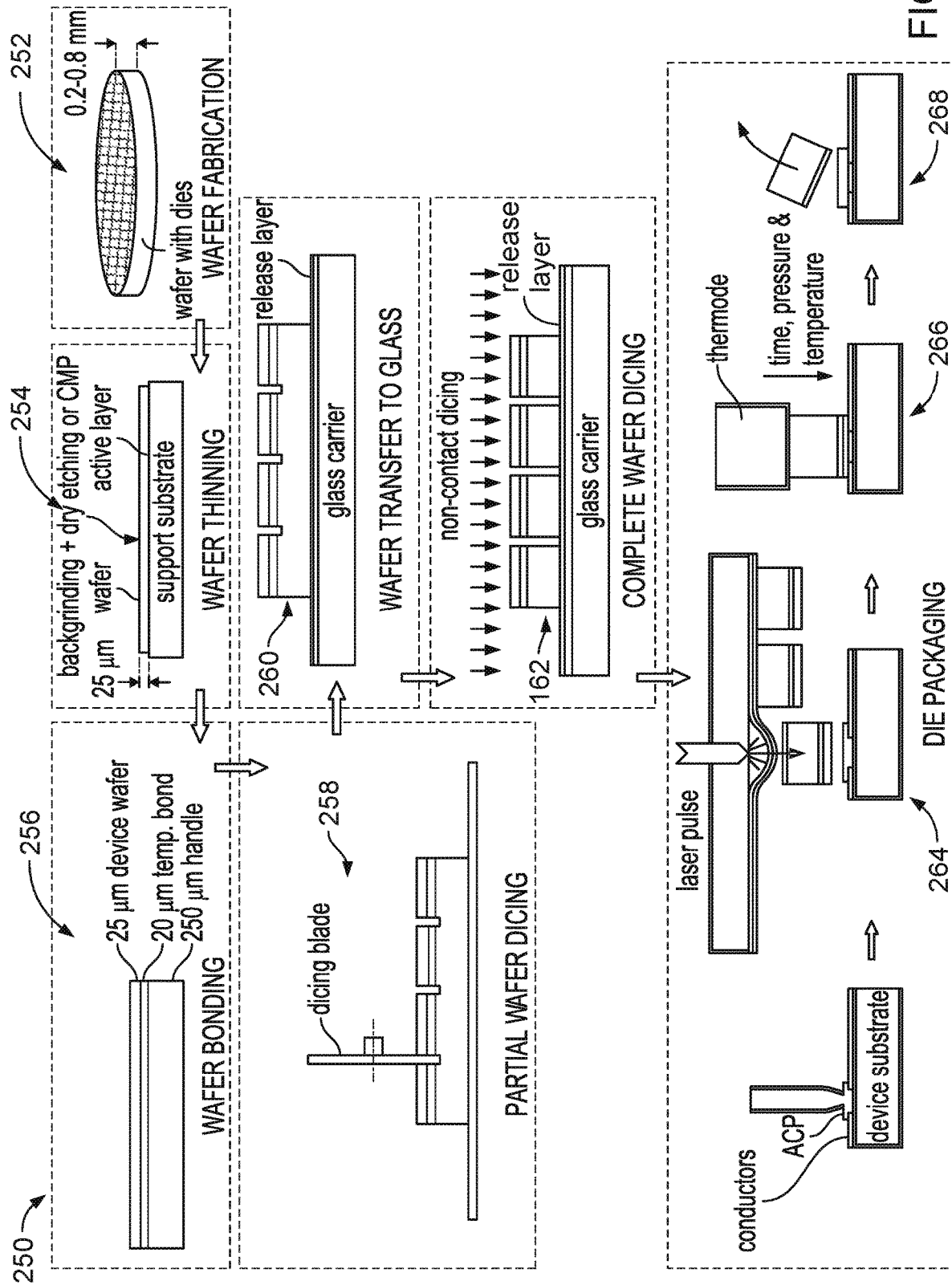

Referring to FIG. 30, a laser enabled, handle assisted packaging process 250 enables packaging of ultra-thin discrete component. A wafer bearing large numbers of discrete components is fabricated or obtained (252).

Wafer preparation in process 250 includes wafer thinning, handle attachment, and dicing. The wafer is thinned (254) to a thickness of less than 50 μm using one or more of the wafer thinning approaches described above. In the example of FIG. 30, the wafer is thinned to a thickness of about 25 μm using a combination of backgrinding, dry etching or chemical mechanical polishing, and the use of the 3M Wafer Support System®. The thinned wafer is mounted onto a handle substrate to form a handle assembly (256). In the example of FIG. 30, the back side of the wafer is bonded to a 350 μm thick handle substrate via a 20 μm thick handle release layer, leaving the active layer of the wafer exposed.

In some examples, the active layer of the wafer can be bonded to the handle substrate, leaving the back side of the wafer exposed.

In some examples, the wafer is partially pre-diced (258) while attached to a dicing tape and then transferred to a transparent carrier (260) for complete dicing (262). In some examples, the assembly of wafer and handle substrate is adhered to a transparent carrier (258), such as a glass carrier, having a dynamic releasing layer disposed thereon, and diced (259) into individual, discrete components using approaches such as those described above. Because the assembly of wafer and handle substrate is directed adhered to the transparent carrier for dicing, rather than to a dicing tape, the wafer transfer process can be bypassed. Other approaches to dicing and wafer transfer can also be applied in process 250.

Component transfer in process 250 includes releasing the discrete components from the transparent carrier (264) using the laser assisted contactless transfer method described above. The discrete components are transferred onto a device substrate having attachment element formed thereon. Discrete component interconnection (266) and handle removal (268) are performed by applying pressure, temperature, or ultraviolet light as described above.

In the process 250, the use of the laser assisted contactless transfer method to perform component transfer allows the process to be applied to the transfer of a wide range of sizes and types of components, such as components that are too thin for a pick-and-place approach.

The process 250 can have advantages. For instance, the process 250 has a simplified process flow relative to other laser assisted processes by the elimination of the diced wafer transfer step. The process yield can be improved because there is no opportunity for die loss during transfer of diced discrete components. In addition, the possibility of die shifting or rotating with respect to their original positions in the wafer during transfer of the diced discrete components is eliminated because the wafer is transferred as an intact unit.

Figure 31:
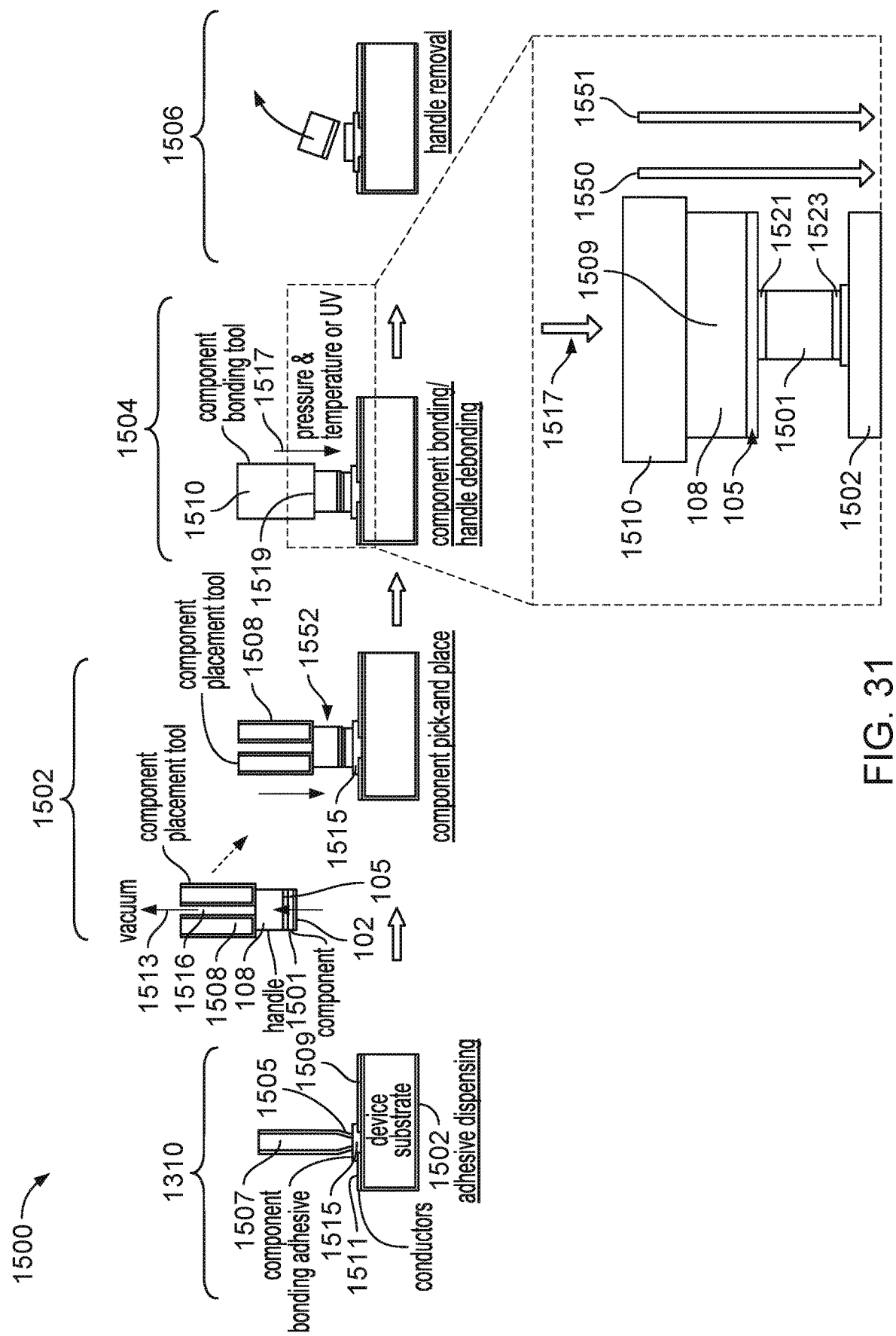
FIG. 31 is a schematic view showing an example of a process for use with the discrete component packaging process of FIG. 25.

As shown in FIG. 31, the processes for packaging a discrete component, as described above, can be modified as illustrated in a process 1500 for attaching a discrete component 1501 to a device substrate 1502. For example, the device substrate 1502 is first prepared (1310) for attaching to the discrete component 1501 by dispensing an amount of adhesive 1505 through a dispensing tube 1507 onto the device substrate surface 1509 (including conductors 1511) at a location 1515 of the device substrate 1502 where the discrete location is to be attached.

The process 1500 can then generally include picking up (1502) the handle assembly 1552 (which includes the discrete component 1501, the handle substrate 108, the handle release layer 105) by applying a vacuum 1513 through a vacuum tube 1516 of a discrete component transfer tool 1508. The transfer tool with the handle assemble is then positioned (1502) over the location 1515 of the device substrate as also shown in FIGS. 25 and 26, aligning the discrete component with the attachment adhesive on the device substrate 1502 (614 in FIG. 18). The discrete component is then moved into contact with the attachment adhesive 1505 (618 in FIG. 18) on the device substrate 1502.

After the discrete component contacts the attachment adhesive 1505 (618 in FIG. 18) (which may or may not be at that moment in a somewhat fluid state) on the device substrate 1502, the vacuum in the vacuum tube can be broken to release the transfer tool 1508 from the handle and the transfer tool can be moved away. Then a separate discrete component bonding tool 1510 may be moved into contact with the discrete component. Pressure 1550 or energy 1551, e.g., thermal or UV energy, or both, then can be applied 1517 to the discrete component 1501, the handle substrate 108, the handle release layer 105 through a contact surface 1519 of the bonding tool 1510 into the handle and also through the handle to the bond 1521, through the bond to the discrete component 1501, and through the discrete component 1501 to the bond 1523 with the device substrate. The pressure or energy or both can simultaneously or in sequence cause the bond 1521 between the discrete component and the handle substrate to weaken and the bond 1523 between the discrete component and the device substrate to strengthen (1504). When pressure is being applied, the pressure can operate simultaneously to weaken the bond 1521 and to strengthen the bond 1523. When energy is being applied, in some cases, the energy must flow through the successive elements of the system so that the weakening of bond 1521 may begin or be completed before the strengthening of the bond 1523 begins or is completed, or the weakening and the strengthening can occur in sequence.

In some cases the handle release layer 105 and the attachment adhesive are selected such that the bond 1523 between the discrete component 1501 and the device substrate 1502 forms before the bond 1521 is formed between the handle and the discrete component 1501, or the formation of the bond 1523 and the bond 1521 can occur simultaneously with complete overlap in time, or the formation can overlap partly with either the bond 1523 or the bond 1521 partly occurring earlier than or later than the overlapping period. The formation of either the bond 1523 or the bond 1521 can include a hardening or softening of a material, e.g., a wax material. For example, in some cases, the handle release layer 105, the attachment adhesive 1505, or both the handle release layer 105 and the attachment adhesive 1505 may include one or more materials that soften or harden in response to an application of energy. In this case, the softening of the bond 1523 can occur before the hardening of the bond 1521, or the softening of the bond 1523 can occur after the hardening of the bond 1521, or the two events can occur simultaneously with complete overlap in time, or they can overlap but one or the other can partly occur earlier than or later than the overlapping period.

Once the weakening and strengthening after progresses to an appropriate degree, the discrete component bonding tool 1510 may be removed leaving the handle assembly (including the discrete component 1501, the handle substrate 108, the handle release layer 105) in contact with the discrete component, which is bonded to the device substrate 1502. While not bonded to the discrete component (because of the weakening of bond 1523), the handle remains in contact with the discrete component, for example, due to gravitational force, surface attraction force, or residual adhesive force remaining after the debonding process, or a combination of two or more of these forces the two. The handle substrate may then be removed (1506) from the discrete component using any of a variety of separation techniques, e.g., brushing, compressed air, vacuum, vibration, liquid jet, electrostatic, electromagnetic force reorienting the device substrate such that gravity separates the handle from the discrete component, or any combination of two or more of those. In general, a variety of separation techniques are contemplated, e.g., techniques applying force, energy, contact, and any combination of two or more of these to separate the handle substrate from the discrete component so long as the discrete component and/or the handle substrate are not damaged.

In some examples, the discrete transfer tool 1508 may be configured to apply a vacuum force to the handle assembly similarly to the use of the discrete component transfer tool 612 in FIG. 18. In some examples, the discrete transfer tool 1508 may be configured to apply pressure, heat, or UV light, or a combination of them to the handle assembly similarly to use of the discrete component transfer tool 602 in FIG. 18.

Although FIG. 31 shows the removal of one handle assembly; the same separation technique or techniques may be used to remove two or more handle assemblies at the same time. For example, multiple handle substrates may be arranged in proximity to each other such that a brush, a blade, an application of compressed air, an application of a vacuum, or an application of a vibrational force, or any combination of two or more of them, may remove the two or more handle assemblies from their corresponding discrete components.

In some examples, one or more of the processes described here can be used to position thin discrete components onto a device substrate starting from individual discrete components with regular thickness rather than starting from a wafer. Processes starting from individual discrete components can be used to place multiple, different discrete components on a single device substrate. The pick-and-place approach or the laser assisted contactless transfer method can be used to position individual discrete components in target positions in the device substrate. In some examples, the device substrate can remain stationary and each discrete component can be moved relative to the device substrate until its target position is reached. In some examples, the device substrate can be moved relative to the discrete components until the target position for a particular discrete component is positioned under that discrete component. The ability to place multiple, different discrete components onto a single substrate can have applications in research and development, for instance, in order to facilitate testing of multiple types of discrete components.

Figure 32:
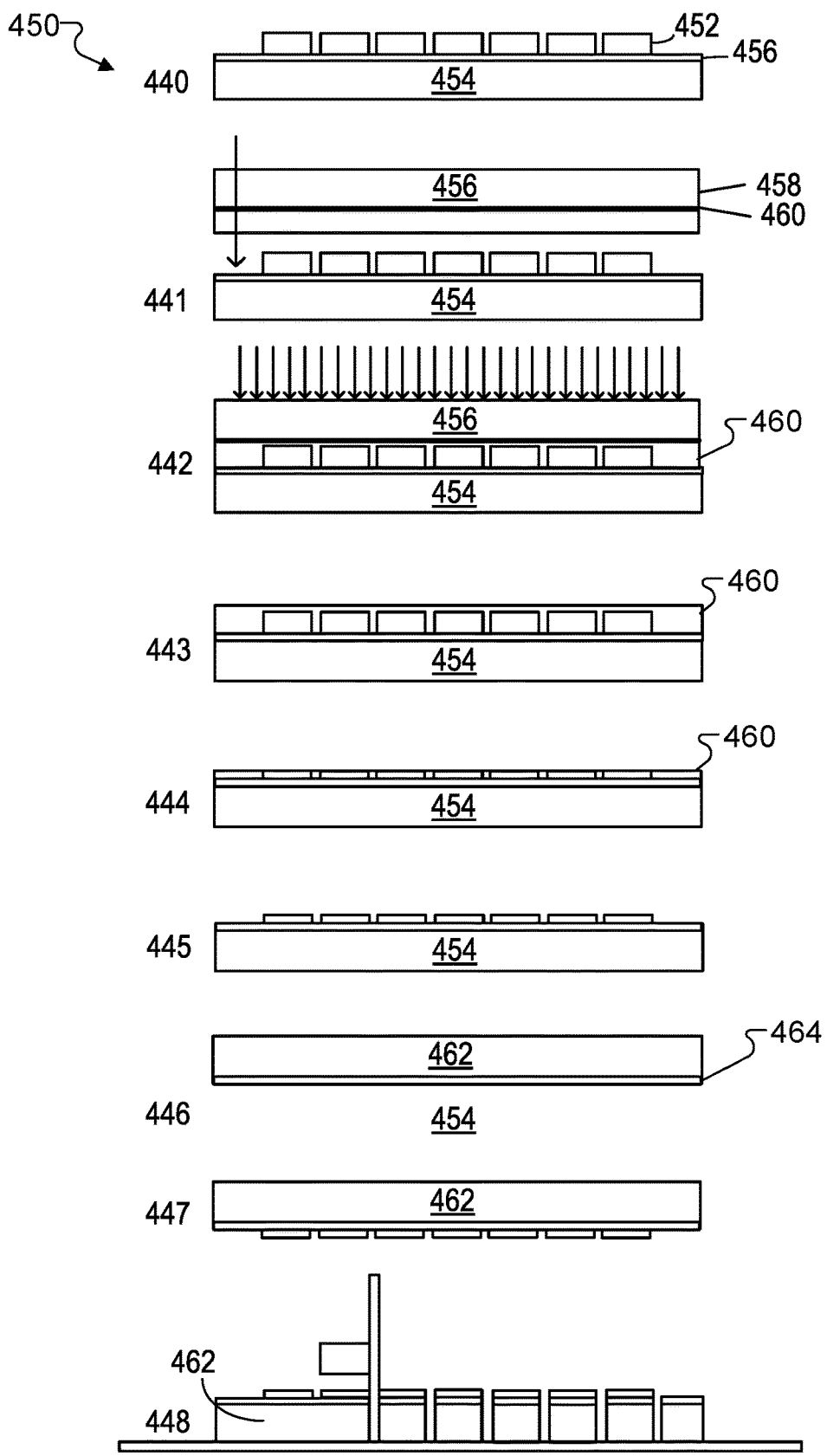
FIG. 32 is a flow diagram of a process.

Referring to FIG. 32, in a process 450, individual discrete components 452 are received and mounted (440) on a first handle substrate 454 via a handle release layer 456. The discrete components 452 can be mounted onto the first handle substrate 454 by a pick-and-place approach or another method for positioning discrete components. The discrete components can be of various sizes and thicknesses that are compatible with a pick-and-place approach.

A second handle substrate 456 having a handle release layer 458 and a layer of flowable material 460 disposed thereon is brought into contact (441) with the discrete components 452 on the first handle substrate 454. We use the term "flowable material" broadly to include, for example, any material that has a viscosity that enables the flowable material to flow responsive to a stimulus, such as pressure and vacuum lamination applied when the second handle substrate 456 is brought into contact with the discrete components 452 on the first handle substrate 454. Example flowable materials can include materials that undergo a phase change from liquid to solid responsive to application of a stimulus such as heat or light (e.g., ultraviolet light). For instance, flowable materials can include positive tone photoresists (e.g., AZ® 40XT by AZ Electronic Materials, Merck, Darmstadt, Germany), negative tone photoresists (e.g., SU-8 by MicroChem Corp, Newton, Mass.), heat curable thermosetting polyimides, or other materials. A stimulus is applied (442) to cure the flowable material, solidifying the flowable material around the discrete components 452. In some examples, the flowable material 460 is a photoresist, the second handle substrate 456 is a transparent substrate (e.g., glass or a transparent plastic) and the stimulus is light or heat sufficient to cure the photoresist. The second handle substrate 456 is removed (443), the discrete components 452 are thinned to the desired thickness (444), e.g., using one or more of the approaches described above, and the cured flowable material 460 is removed (445) by wet or dry etching.

The thinned discrete components 452 are mounted (446) onto a third handle substrate 462 that is coated with a handle release layer 464. The handle release layer 456 on the first handle substrate 454 is released (447), thus debonding the discrete components from the first handle substrate 454. After cleaning, the discrete components 452 on the third handle substrate 462 can enter any of the handle-assisted processes described above (448) at the wafer transfer process step.

The process 450 can be used when the discrete components 452 are mounted face-down on the first handle substrate 454. In the case of face-up assembly, steps 447 and 447 are omitted and the first handle wafer 454 acts as the handle wafer for subsequent handle-assisted discrete component assembly as described above.

In some examples, one or more of the processes described here can be used to assemble three-dimensional integrated circuits (sometimes referred to as stacked chips). Stacked chips are fabricated by stacking and vertically connecting discrete components, such as integrated circuits, such that the stacked discrete components behave together as a single device. Stacked chips can help to increase circuit density, thus enhancing computing power or memory.

What is claimed is:

1. A method comprising:
releasing a discrete component from a release structure on an interim handle by reducing adhesion between the release structure and the discrete component, the reducing comprising applying a stimulus to cause a state change in the release structure from a first state to a second state,
the state change comprising a change in a surface morphology of the release structure.

2. The method of claim 1 in which causing a state change comprises causing a phase transition of at least a portion of the release structure, the phase transition comprising a transition from solid to liquid or a transition from solid to gas or both.

3. The method of claim 1 in which causing a state change comprises causing a change in a chemical structure or a chemical composition or both of at least a portion of the release structure.

4. The method of claim 1, the releasing of the discrete component comprising releasing the discrete component without leaving a residue from the release structure on the discrete component after the release.

5. The method of claim 1, in which the discrete component is in contact with an adhesive layer disposed on a substrate when the discrete component is released from the release structure on the interim handle.

6. The method of claim 5, in which a release temperature of the adhesive layer disposed on the substrate is higher than a release temperature of the release structure.

7. The method of claim 1, in which applying the stimulus comprises irradiating the release structure with laser light.

8. An apparatus comprising:
a discrete component attached to an interim handle via a release structure, the release structure configured to undergo a state change from a first state to a second state responsive to an applied stimulus, the state change comprising a change in a surface morphology of the release structure.

9. The apparatus of claim 8 in which the state change comprises a phase transition from a first phase to a second phase.

10. The apparatus of claim 8, comprising a handle substrate and an adhesive layer disposed on the handle substrate, in which the discrete component is in contact with the adhesive layer.

11. The apparatus of claim 10, in which a release temperature of the adhesive layer is higher than a release temperature of the release structure.

12. An apparatus comprising:
a substrate; and
a release structure disposed on a surface of the substrate, the release structure configured to undergo a state change from a first state to a second state responsive to an applied stimulus,
in which a surface of the release structure is configured to change from being adhesive to a discrete component when the release structure is in the first state to being in a configuration that enables the discrete component to be released when the release structure is in the second state, in which the state change comprises a change in a surface morphology of the release structure.

13. The apparatus of claim 12 in which the state change occurs in a layer of the release structure that is adjacent to the substrate.

14. The apparatus of claim 12, in which the state change comprises a phase transition from a first phase to a second phase.

15. An apparatus comprising:
a substrate; and
a release structure disposed on the substrate, the release structure comprising a first layer and a second layer, the second layer being disposed between the first layer and the substrate, and the first layer having a first adhesion sufficient to enable a discrete component to adhere to the release structure,
wherein when a stimulus is applied to the release structure, the second layer of the release structure is configured to undergo a state change from a first state to a second state, the second state enabling the discrete component to be released from the release structure, the state change comprising one or more of a morphology change, a phase transition, a change in chemical structure, and a change in chemical composition.

* * * * *